(12) United States Patent
Purayath et al.

(10) Patent No.: US 7,807,529 B2
(45) Date of Patent: Oct. 5, 2010

(54) LITHOGRAPHICALLY SPACE-DEFINED CHARGE STORAGE REGIONS IN NON-VOLATILE MEMORY

(75) Inventors: Vinod Robert Purayath, Santa Clara, CA (US); George Matamis, San Jose, CA (US); Takashi Orimoto, Sunnyvale, CA (US); James Kai, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 79 days.

(21) Appl. No.: 11/960,513

(22) Filed: Dec. 19, 2007

(65) Prior Publication Data
US 2009/0163008 A1 Jun. 25, 2009

(51) Int. Cl.
*H01L 21/336* (2006.01)
(52) U.S. Cl. .............................. 438/257; 257/E21.179
(58) Field of Classification Search .................. 438/257
See application file for complete search history.

(56) References Cited

U.S. PATENT DOCUMENTS

| | | | |
|---|---|---|---|
| 5,459,091 A | 10/1995 | Hwang | |
| 6,040,220 A | 3/2000 | Gardner et al. | |
| 6,066,534 A | 5/2000 | Son | |
| 6,746,920 B1 | 6/2004 | Wen et al. | |
| 6,888,755 B2 | 5/2005 | Harari | |
| 7,026,684 B2 | 4/2006 | Sakuma et al. | |
| 7,615,447 B2 * | 11/2009 | Purayath et al. ............. | 438/257 |
| 2006/0286749 A1 | 12/2006 | Tseng et al. | |
| 2007/0128787 A1 | 6/2007 | Higashitani | |
| 2007/0243680 A1 | 10/2007 | Harari et al. | |
| 2009/0162951 A1 * | 6/2009 | Orimoto et al. ................ | 438/8 |
| 2009/0162977 A1 * | 6/2009 | Purayath et al. ............. | 438/128 |

OTHER PUBLICATIONS

Chan, et al., "A True Single Transistor Oxide-Nitride-Oxide EEPROM Device," IEEE Electron Device Letters, vol. EDL-8, No. 3, Mar. 1987, pp. 93-95.
Nozaki, et al., "A 1-MbEEPROM with MONOS Memory Cell for Semiconductor Disk Application," Journal of Solid State Circuits, vol. 26, No. 4, Apr. 1991 IEEE, pp. 497-501.

(Continued)

*Primary Examiner*—W. David Coleman
(74) *Attorney, Agent, or Firm*—Vierra Magen Marcus & DeNiro LLP

(57) ABSTRACT

Lithographically-defined spacing is used to define feature sizes during fabrication of semiconductor-based memory devices. Sacrificial features are formed over a substrate at a specified pitch having a line size and a space size defined by a photolithography pattern. Charge storage regions for storage elements are formed in the spaces between adjacent sacrificial features using the lithographically-defined spacing to fix a gate length or dimension of the charge storage regions in a column direction. Unequal line and space sizes at the specified pitch can be used to form feature sizes at less than the minimally resolvable feature size associated with the photolithography process. Larger line sizes can improve line-edge roughness while decreasing the dimension of the charge storage regions in the column direction. Additional charge storage regions for the storage elements can be formed over the charge storage regions so defined, such as by depositing and etching a second charge storage layer to form second charge storage regions having a dimension in the column direction that is less than the gate length of the first charge storage regions.

21 Claims, 57 Drawing Sheets

OTHER PUBLICATIONS

Choi, Yang-Kyu, et al., "Sublithographic nanofabrication technology for nanocatalysts and DNA chips," J.Vac. Sci. Technol. B 21(6), American Vacuum Society, Nov./Dec. 2003, pp. 2951-2955.
U.S. Appl. No. 11/623,314, filed Jan. 15, 2007.
U.S. Appl. No. 11/623,315, filed Jan. 15, 2007.
U.S. Appl. No. 11/765,866, filed Jun. 20, 2007.
U.S. Appl. No. 12/014,689, filed Jan. 15, 2008.
U.S. Appl. No. 11/960,485, filed Dec. 19, 2007.
U.S. Appl. No. 11/960,498, filed Dec. 19, 2007.
U.S. Appl. No. 11/960,518, filed Dec. 19, 2007.

* cited by examiner

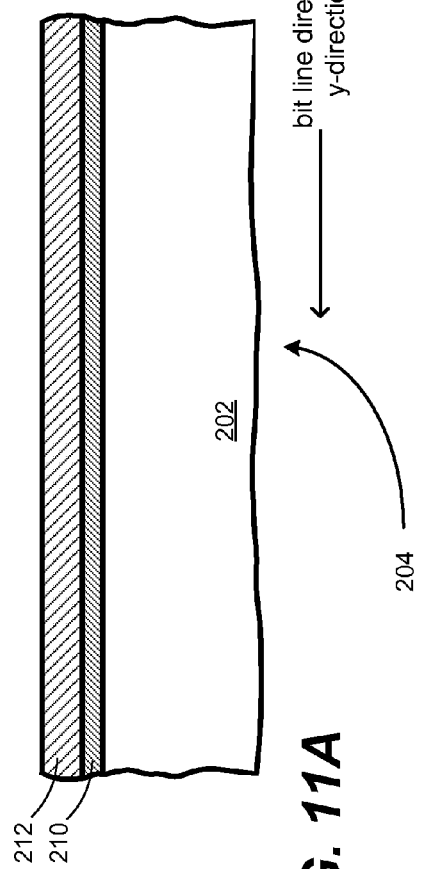
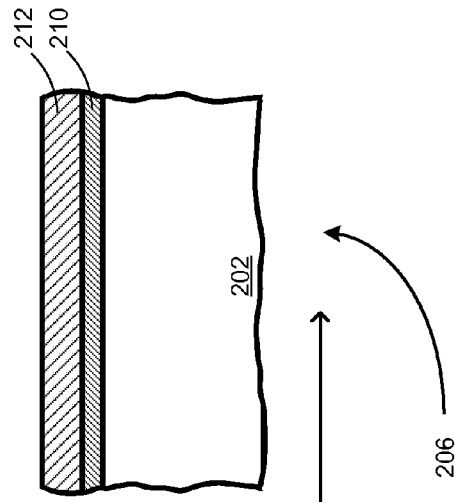
FIG. 11A
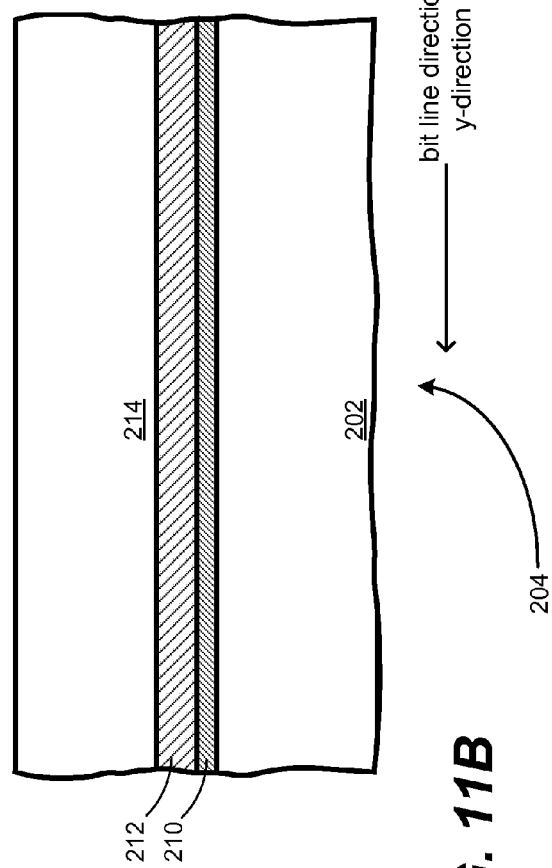
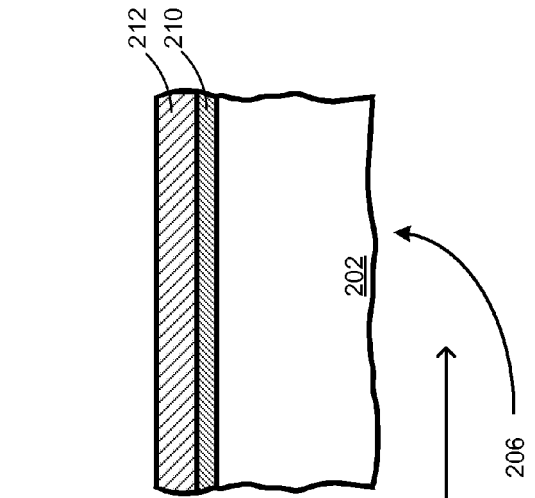
FIG. 11B

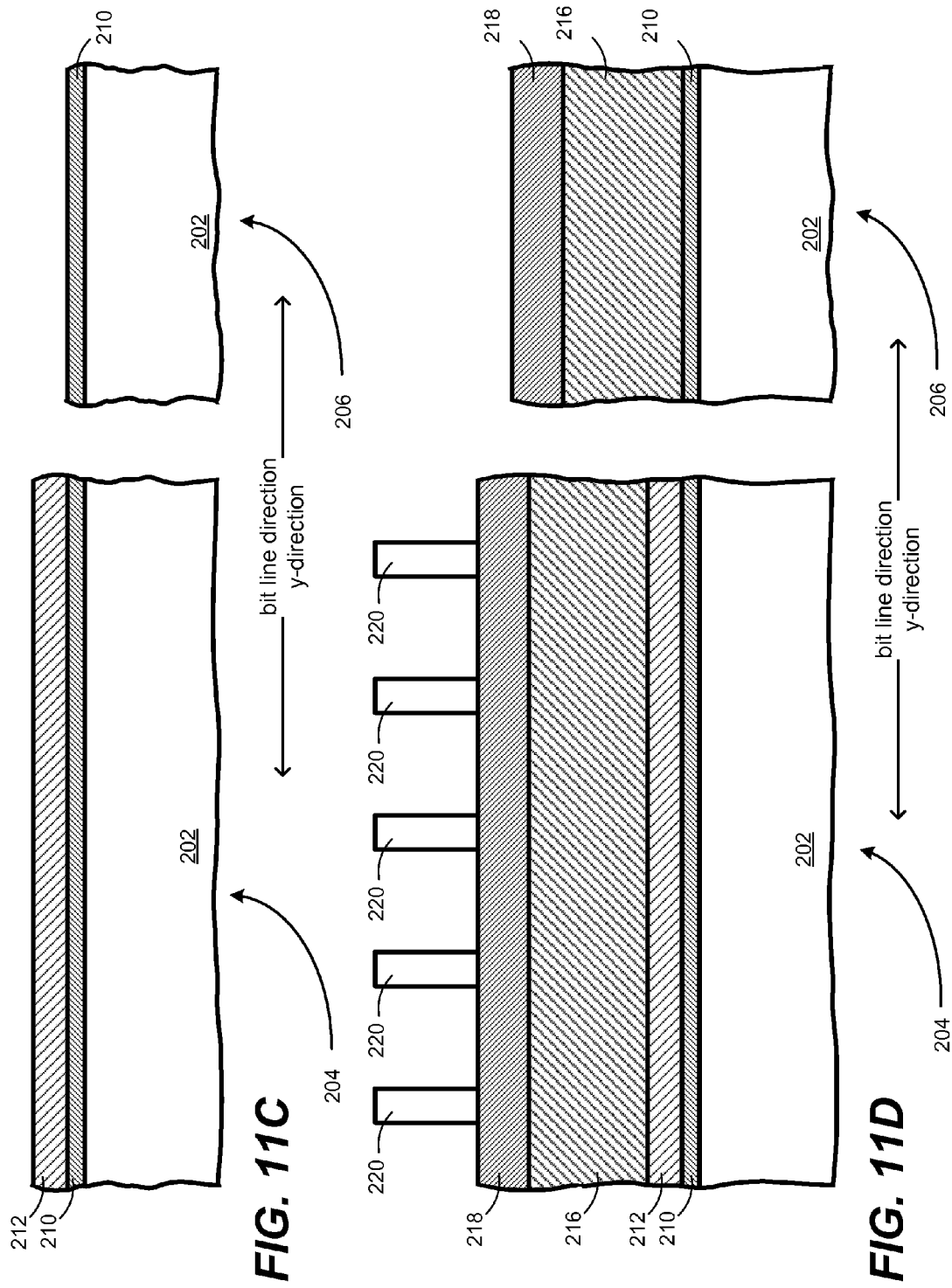

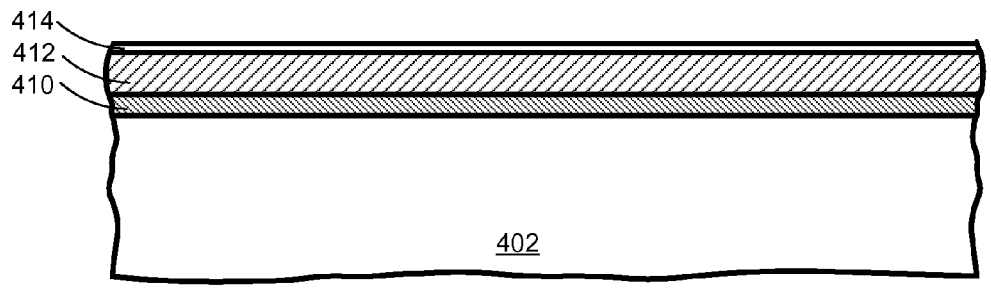
FIG. 14A  ← bit line direction y-direction →
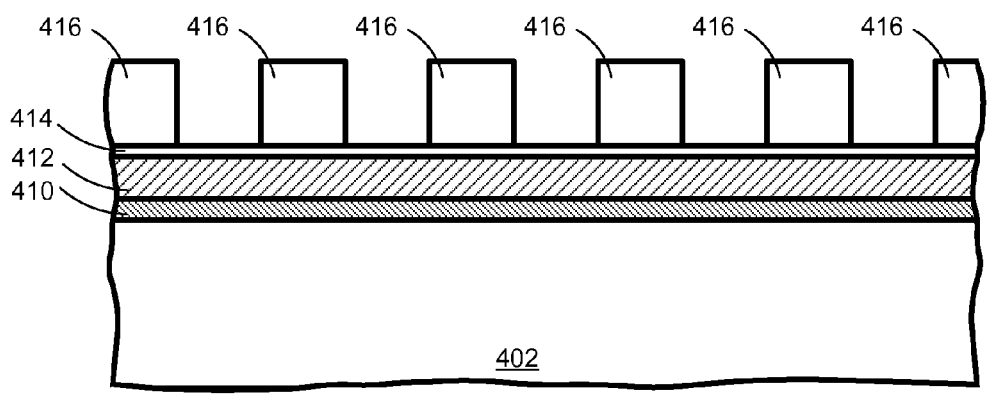
FIG. 14B  ← bit line direction y-direction →

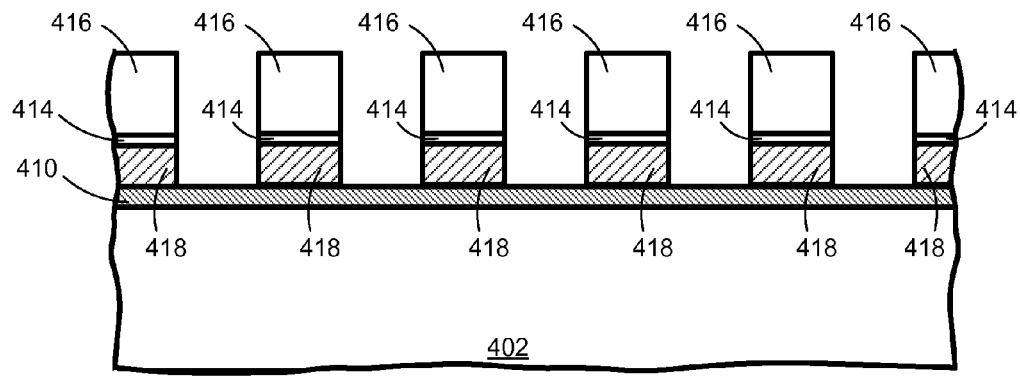
FIG. 14C  ⟵ bit line direction y-direction ⟶
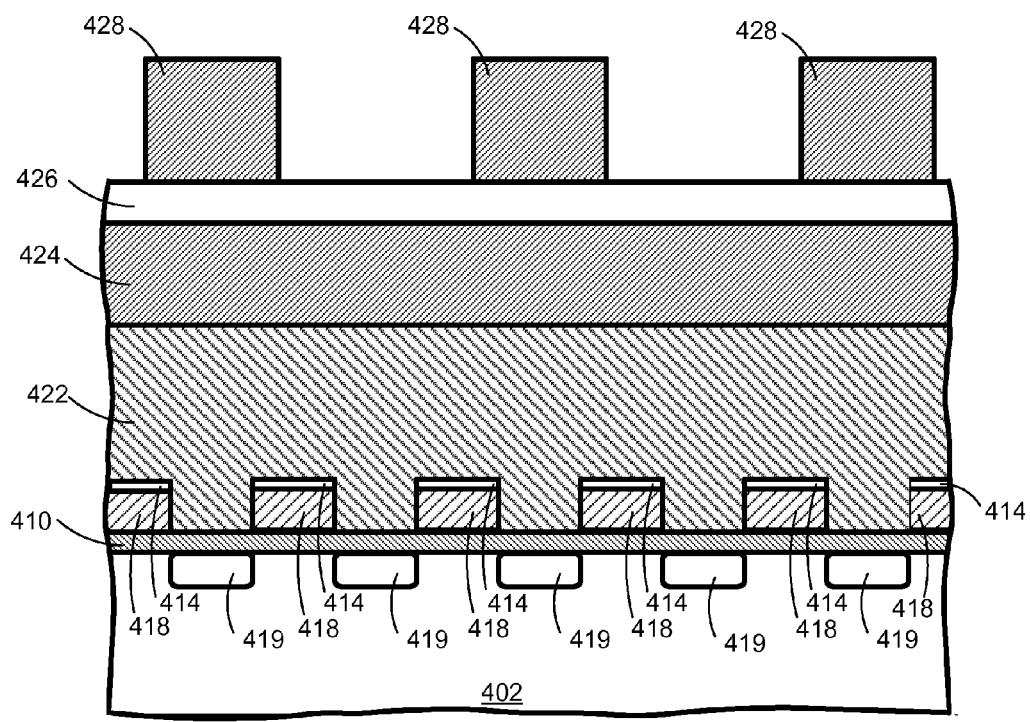
FIG. 14D  ⟵ bit line direction y-direction ⟶

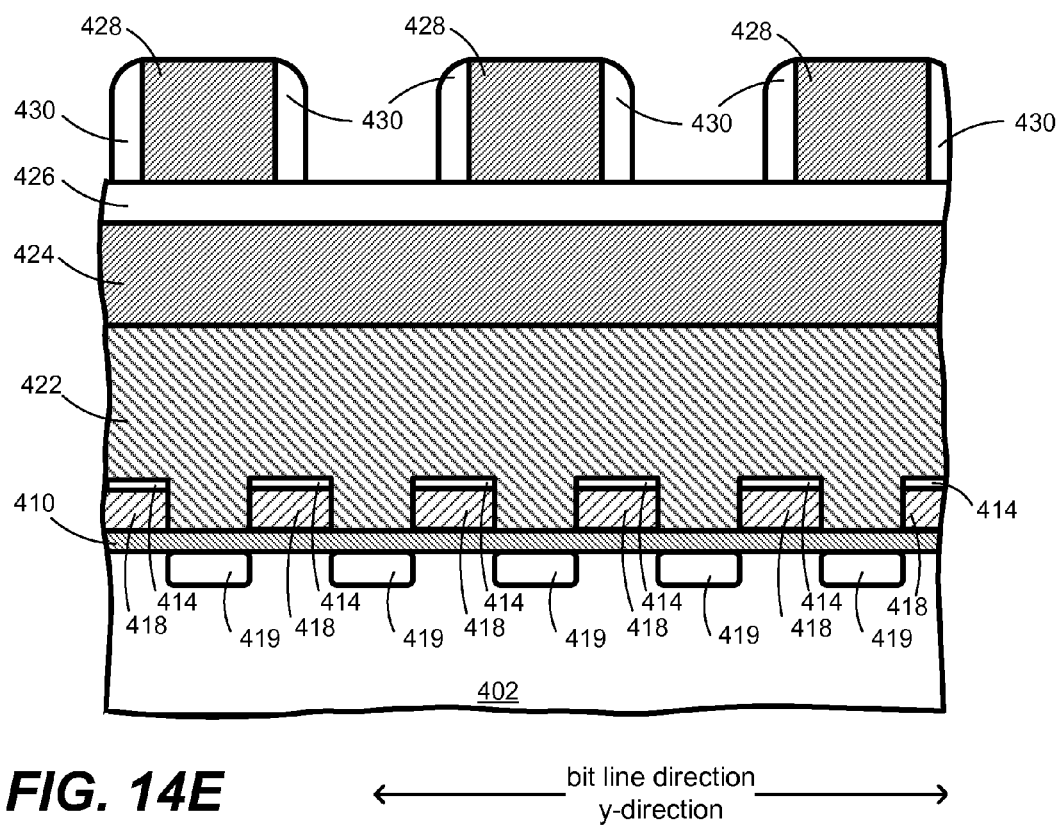
FIG. 14E ⟵ bit line direction y-direction ⟶

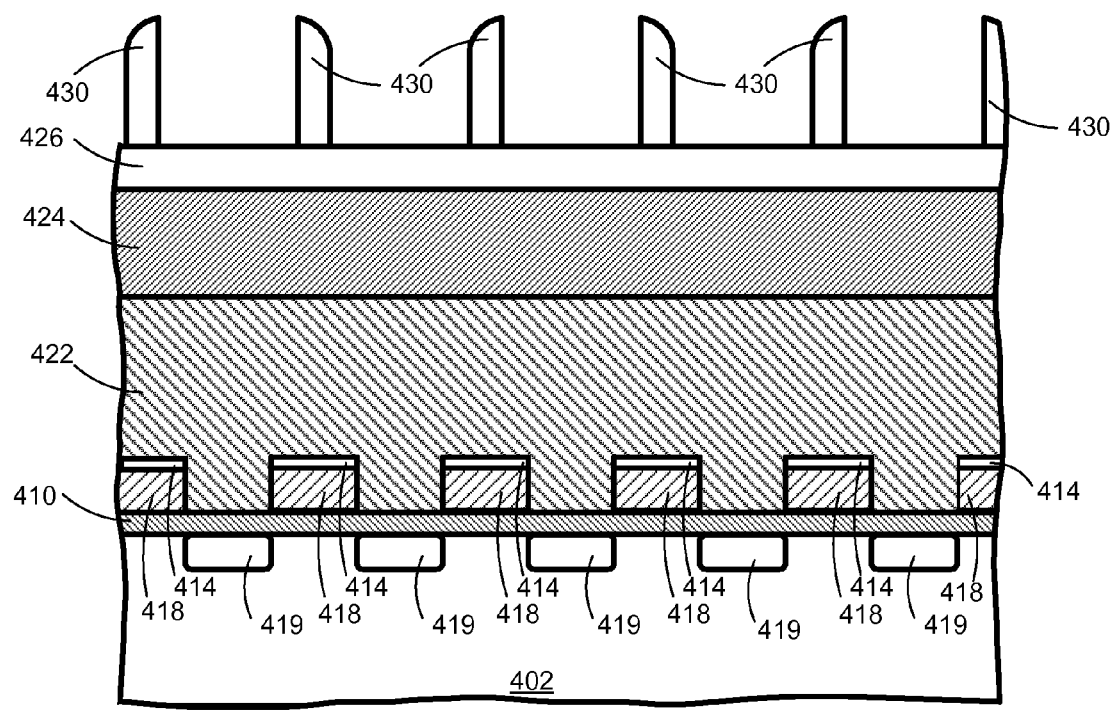
FIG. 14F   ←⎯⎯ bit line direction y-direction ⎯⎯→

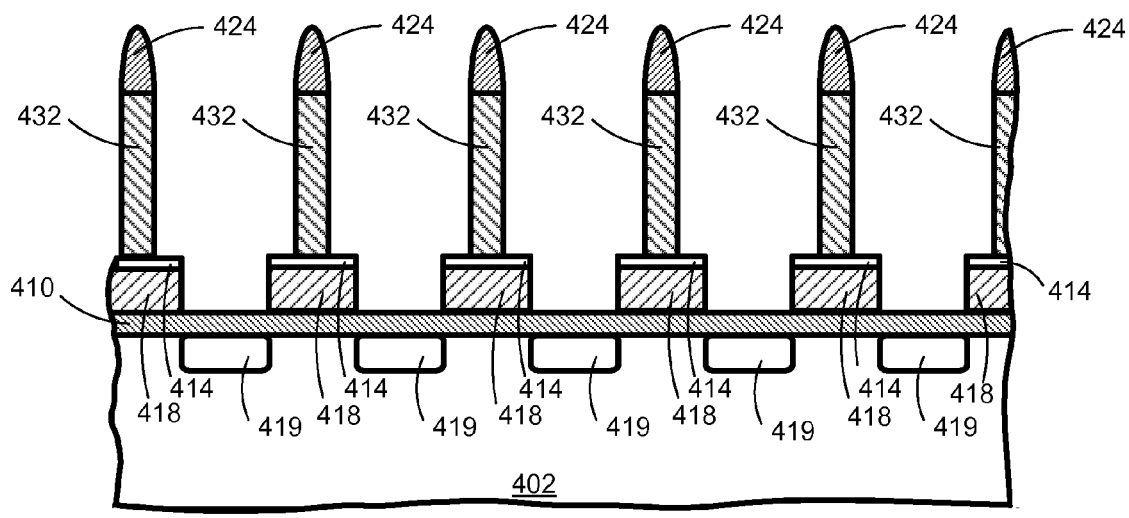
FIG. 14G ←— bit line direction / y-direction —→
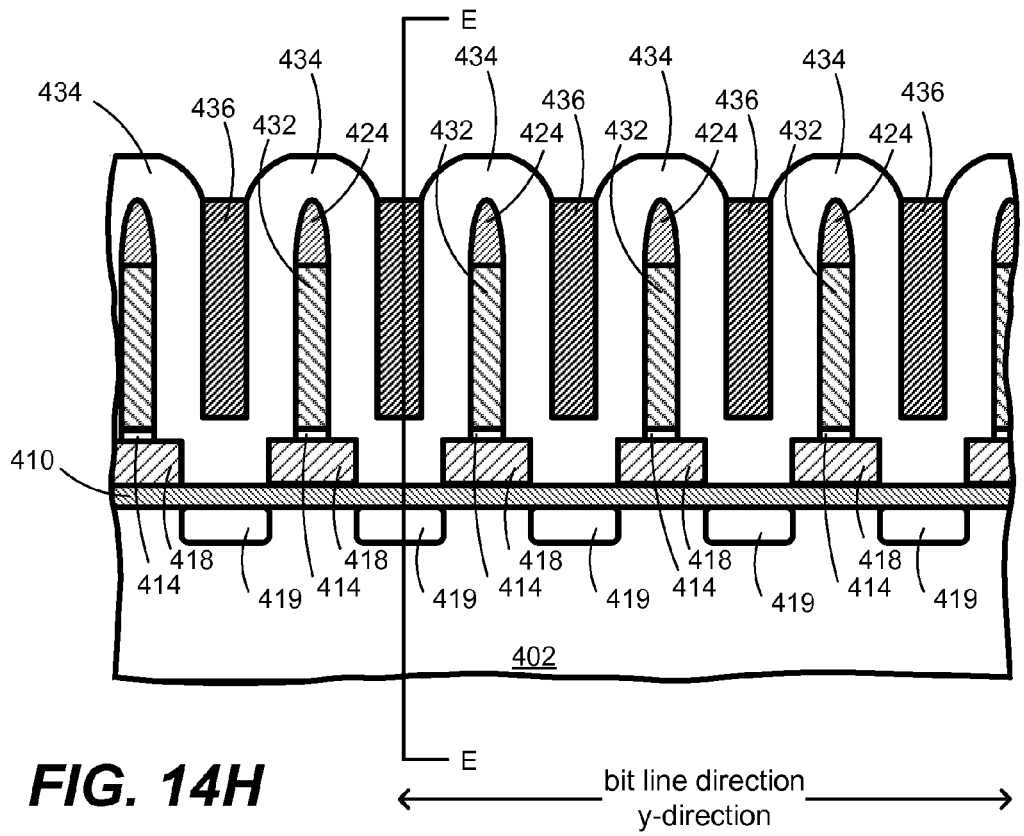
FIG. 14H ←— bit line direction / y-direction —→

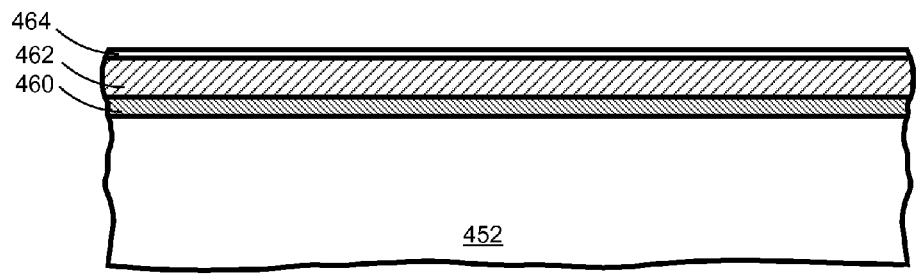
FIG. 15A ←——bit line direction——→
y-direction
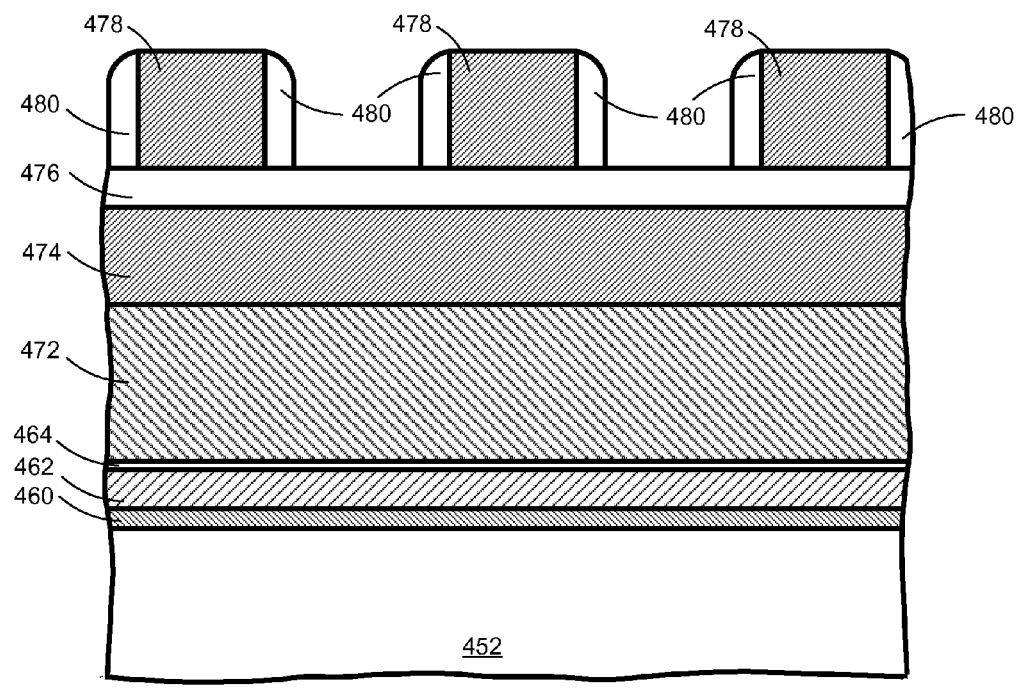
FIG. 15B ←——bit line direction——→
y-direction

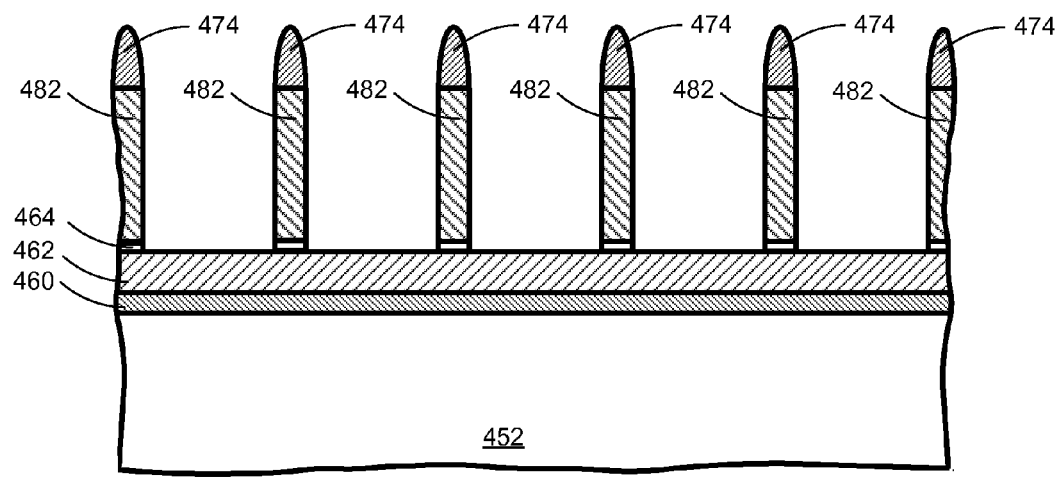
FIG. 15C ←— bit line direction y-direction —→
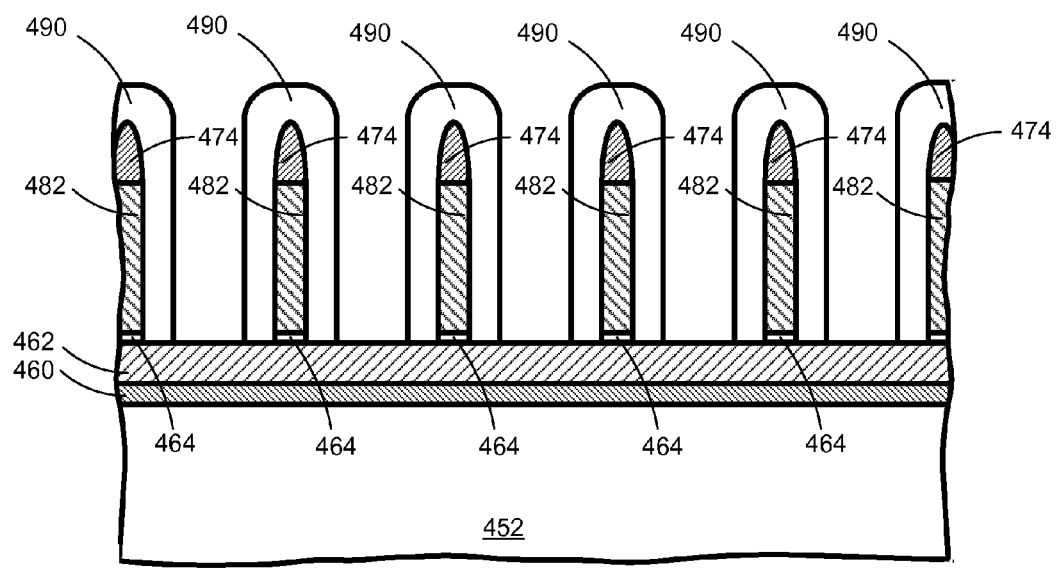
FIG. 15D ←— bit line direction y-direction —→

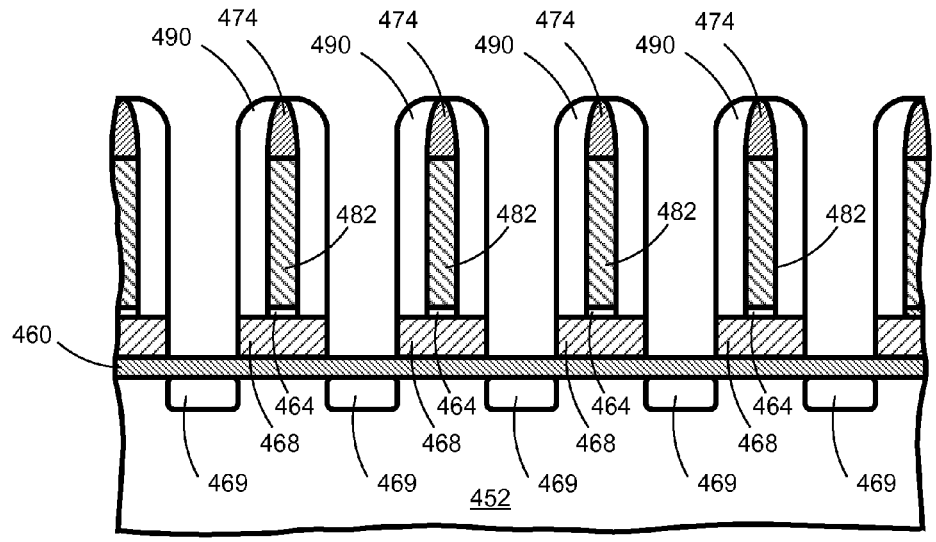
FIG. 15E ← bit line direction y-direction →
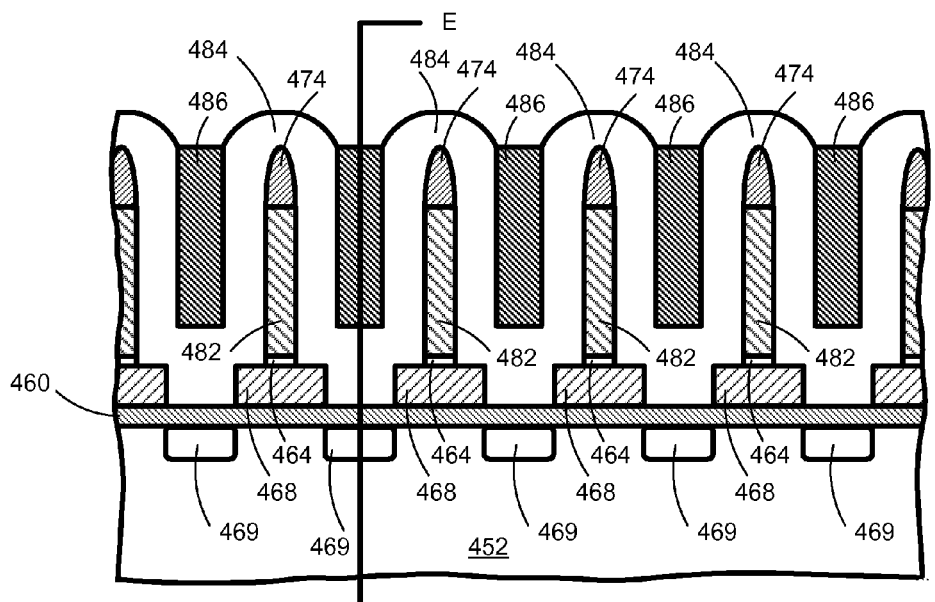
FIG. 15F ← bit line direction y-direction →

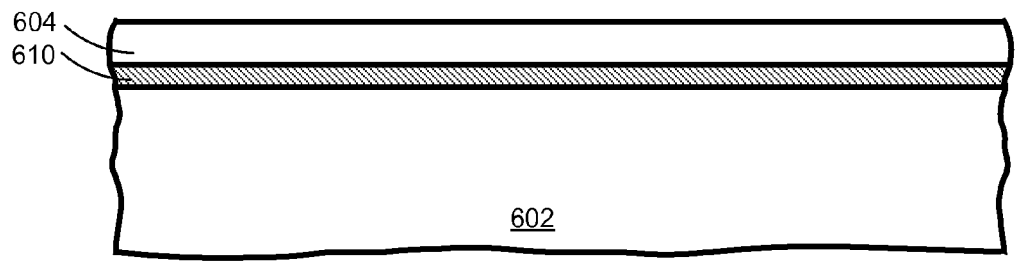
FIG. 17A   ⟵ bit line direction y-direction ⟶
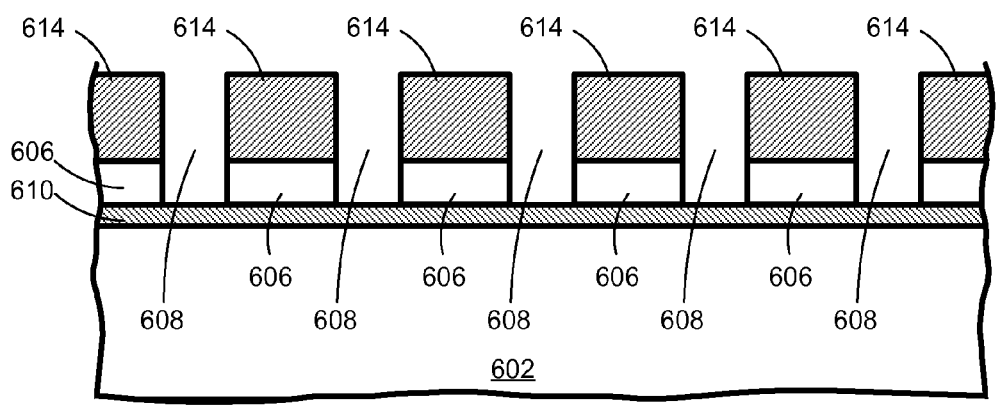
FIG. 17B   ⟵ bit line direction y-direction ⟶

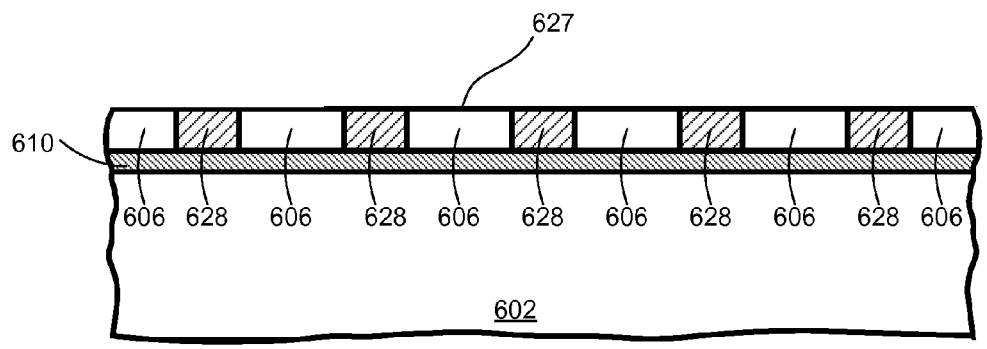
FIG. 17C ←—— bit line direction ——→
y-direction
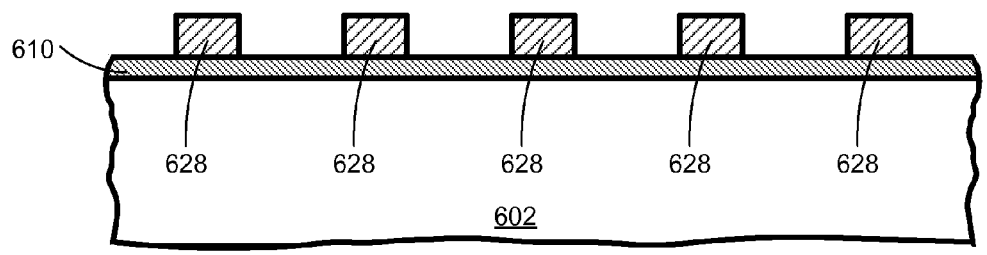
FIG. 17D ←—— bit line direction ——→
y-direction

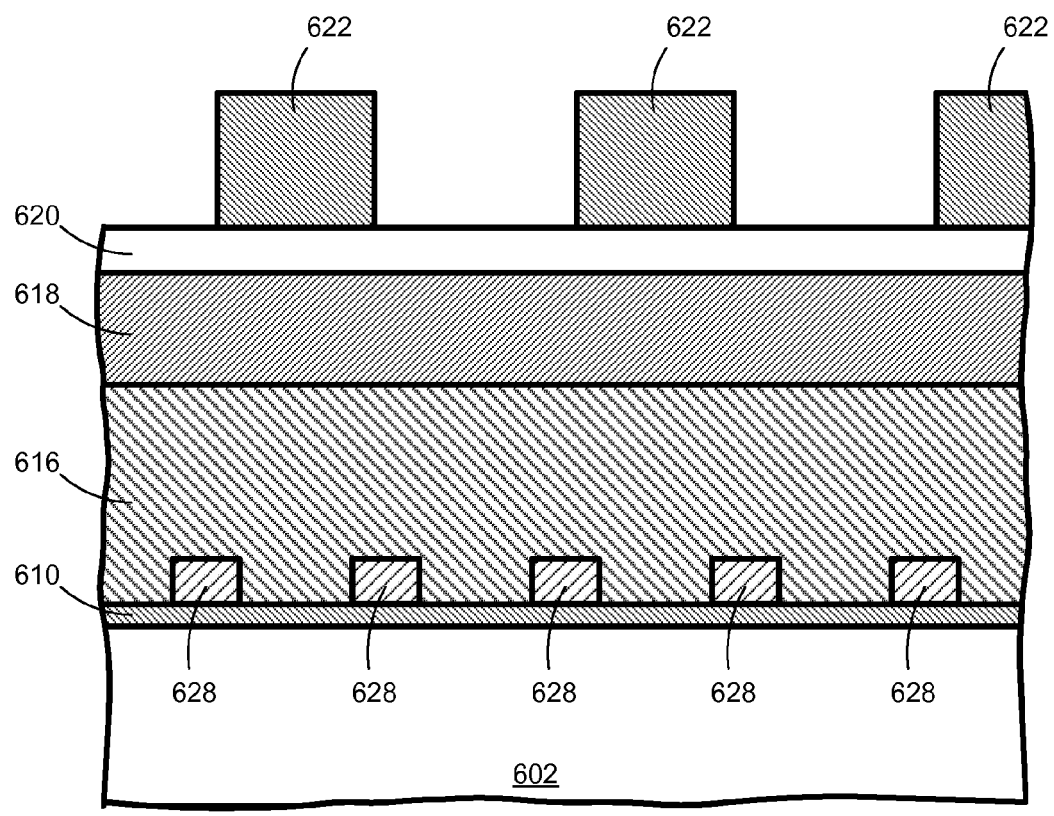
FIG. 17E  ⟵ bit line direction / y-direction ⟶

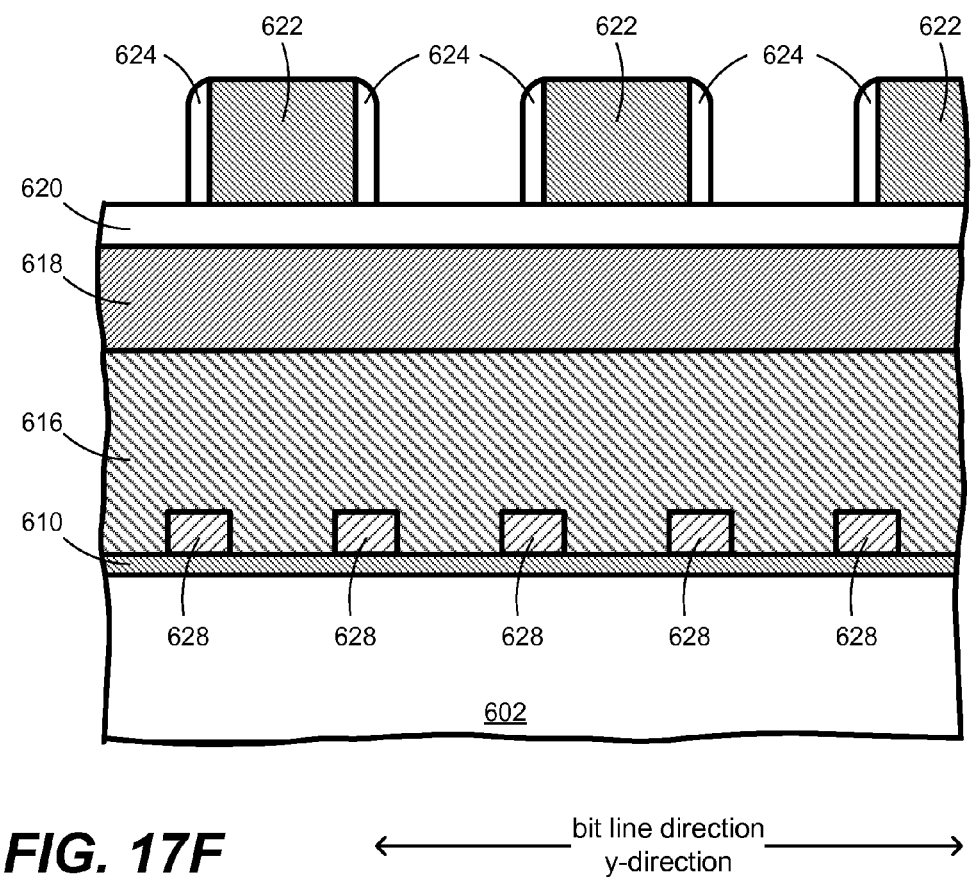
FIG. 17F  ⟵ bit line direction y-direction ⟶

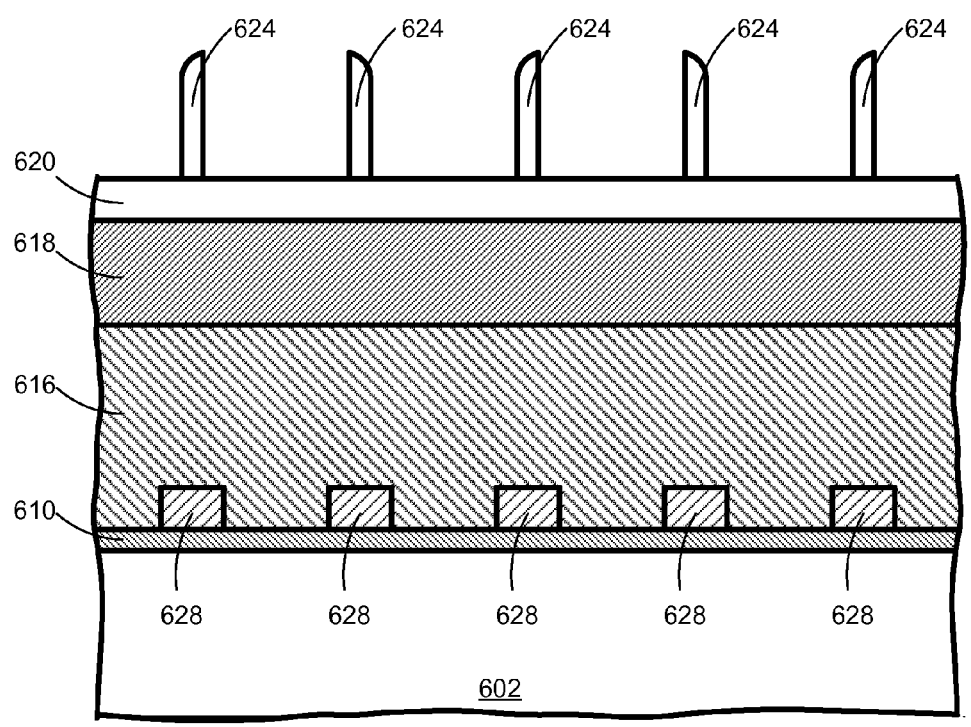
FIG. 17G  ⟵ bit line direction y-direction ⟶

← bit line direction y-direction →

← bit line direction y-direction →

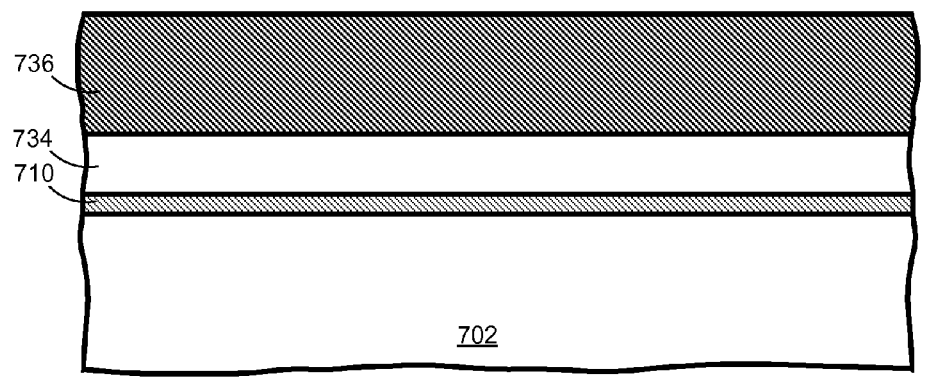
FIG. 19A     ⟵ word line direction ⟶
               x-direction
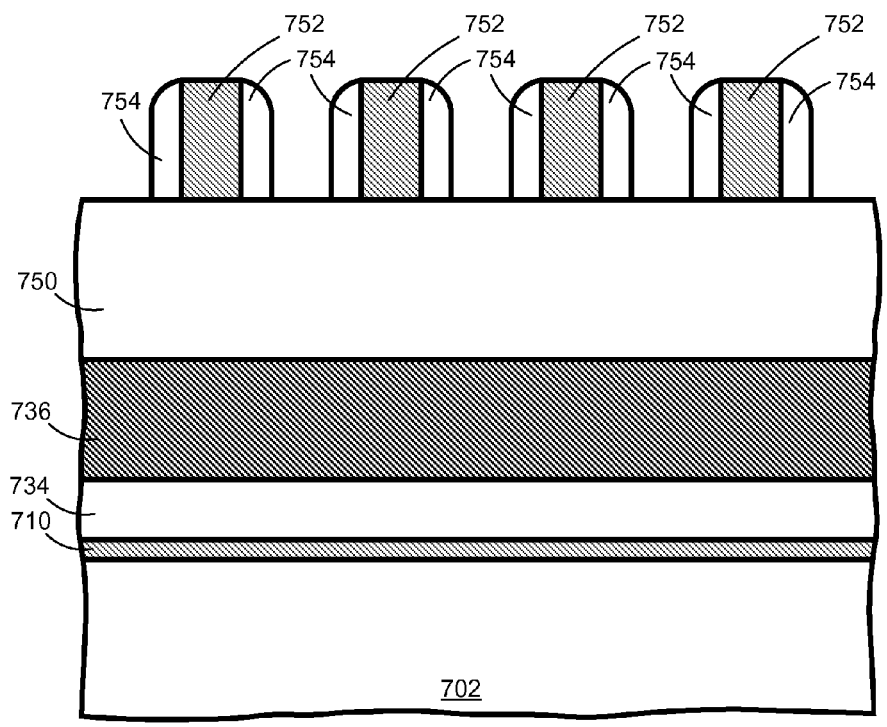
FIG. 19B     ⟵ word line direction ⟶
               x-direction

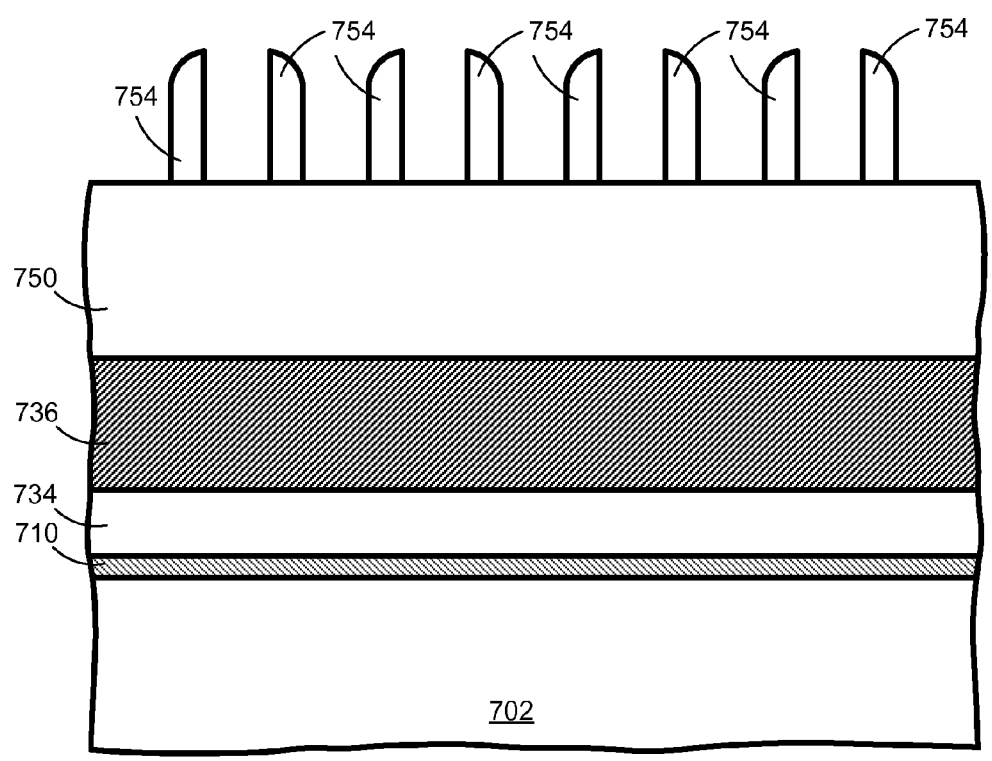
FIG. 19C ⟵ word line direction / x-direction ⟶

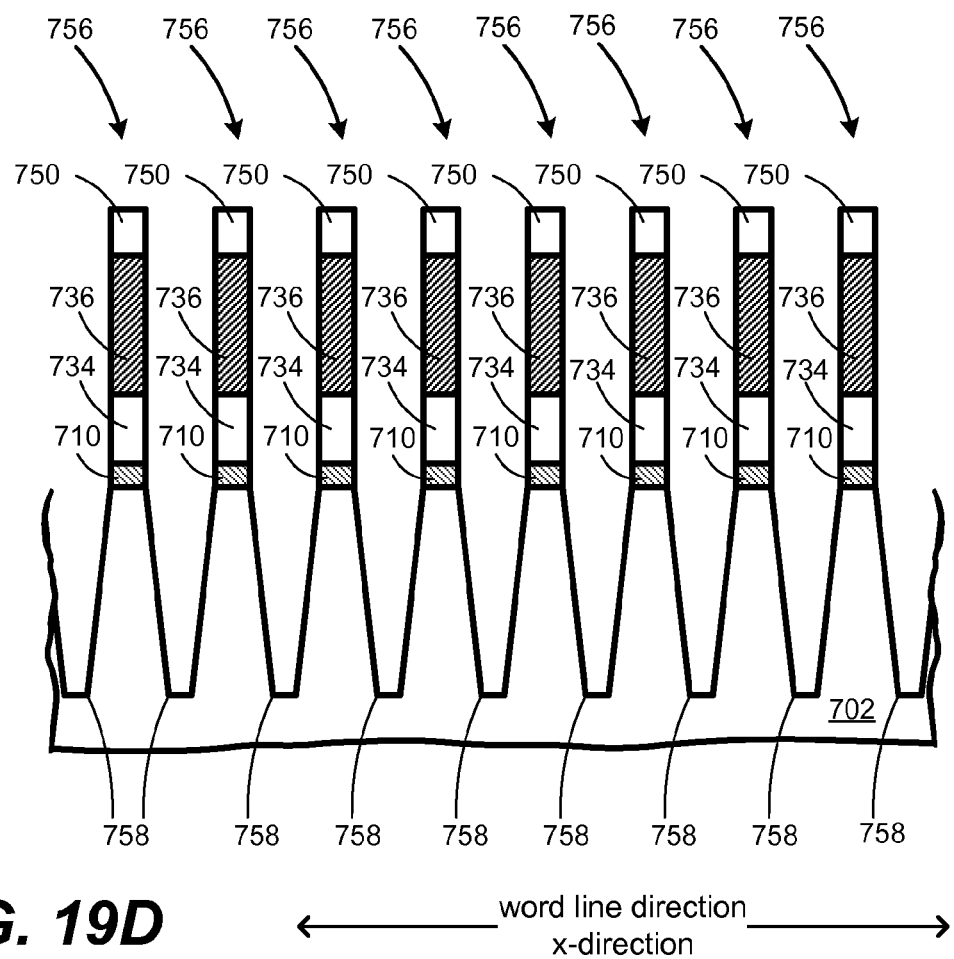
FIG. 19D ← word line direction x-direction →

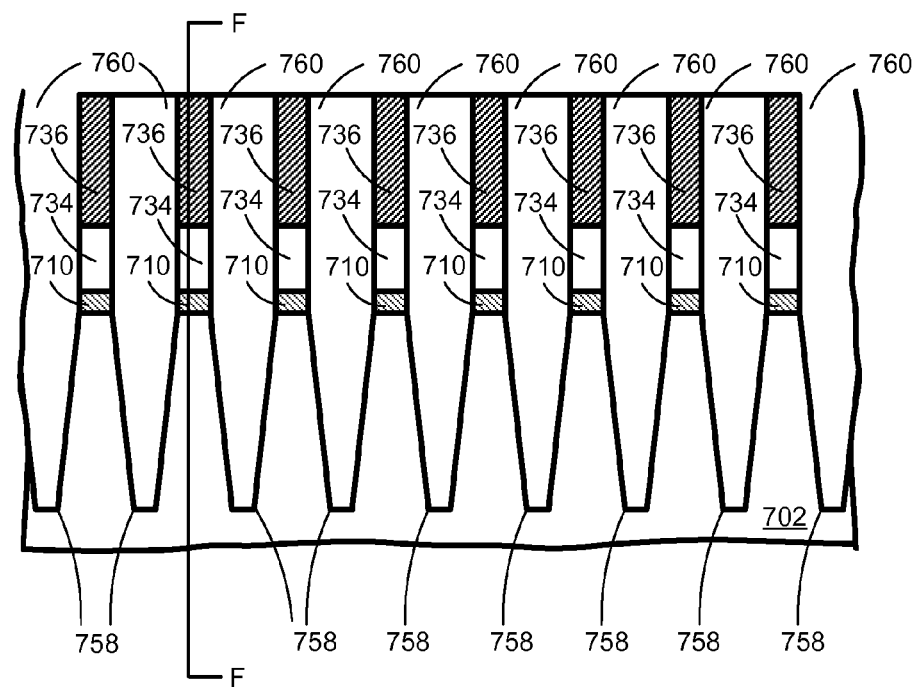
FIG. 19E ←— word line direction x-direction —→
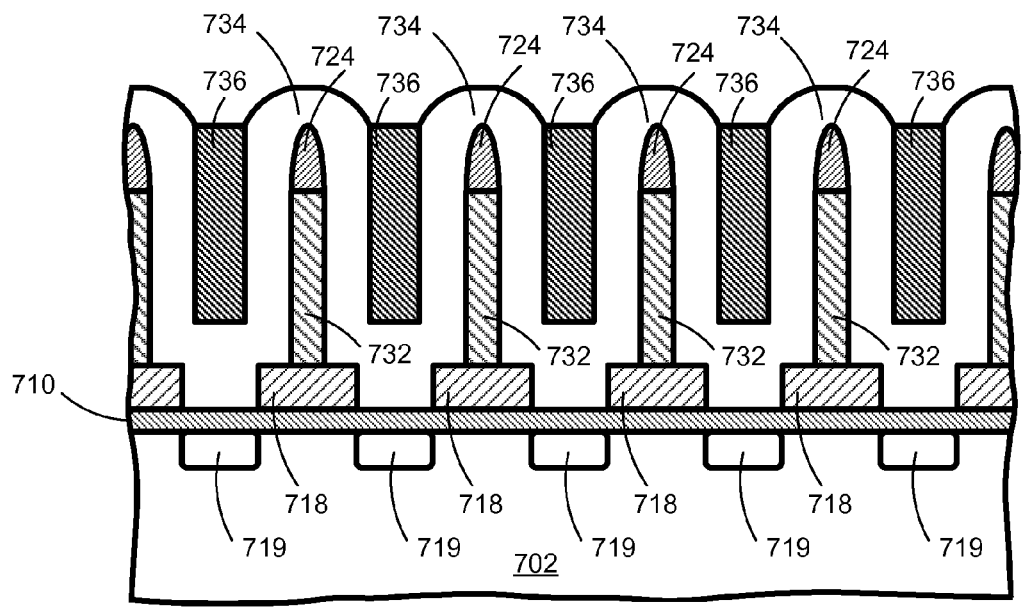
FIG. 19F ←— bit line direction y-direction —→

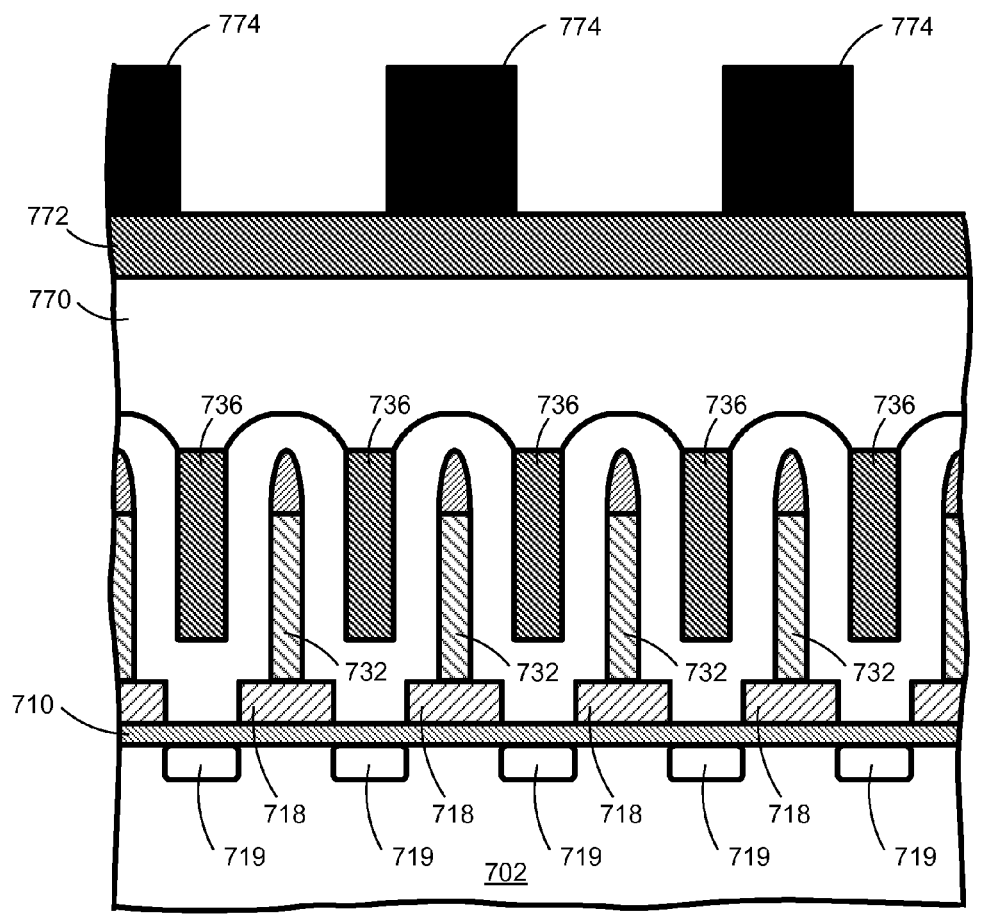
FIG. 19G  ⟵ bit line direction / y-direction ⟶

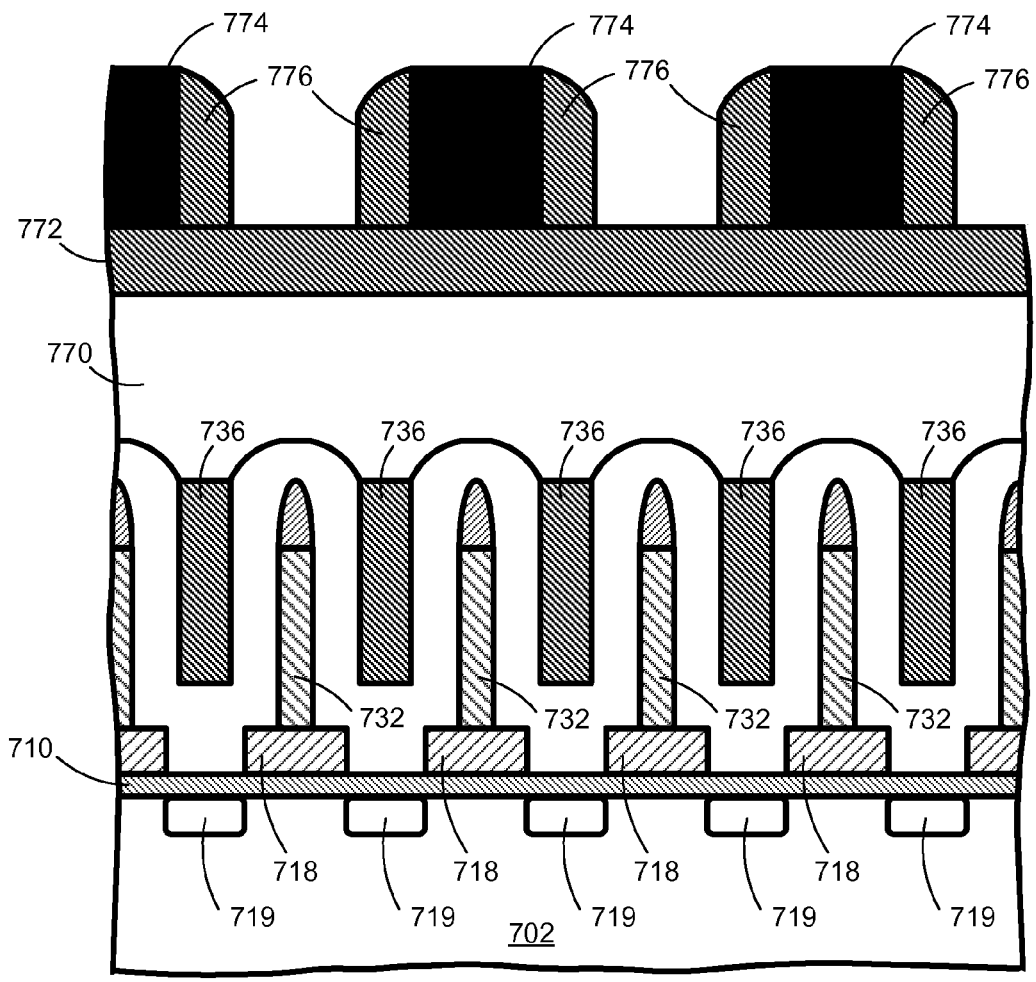
FIG. 19H   ⟵ bit line direction ⟶
y-direction

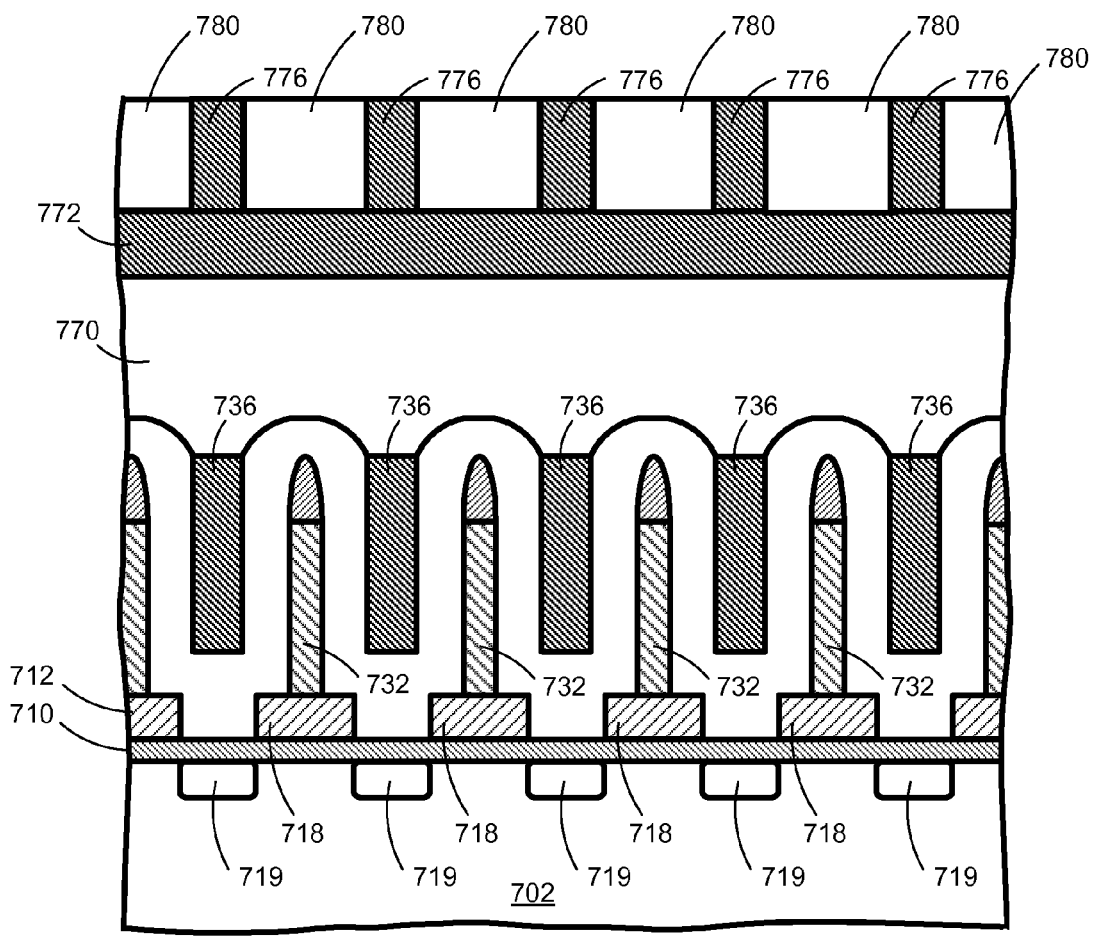
FIG. 19I ⟵ bit line direction y-direction ⟶

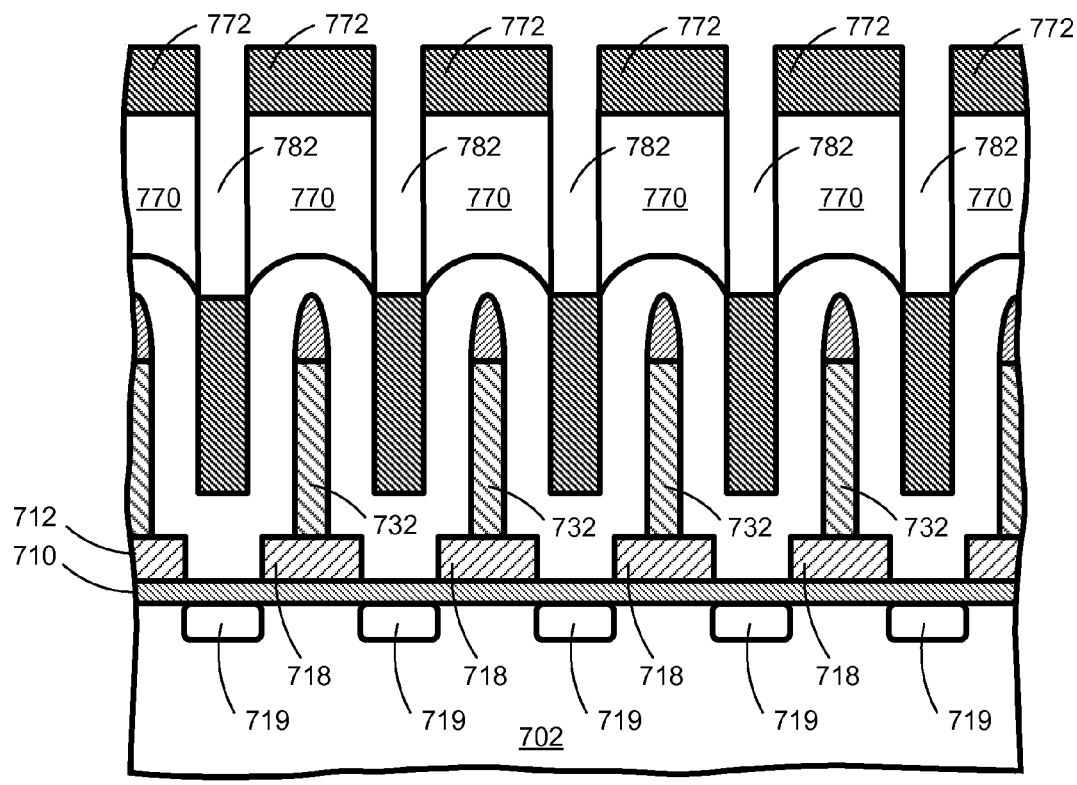
FIG. 19J ⟵ bit line direction y-direction ⟶

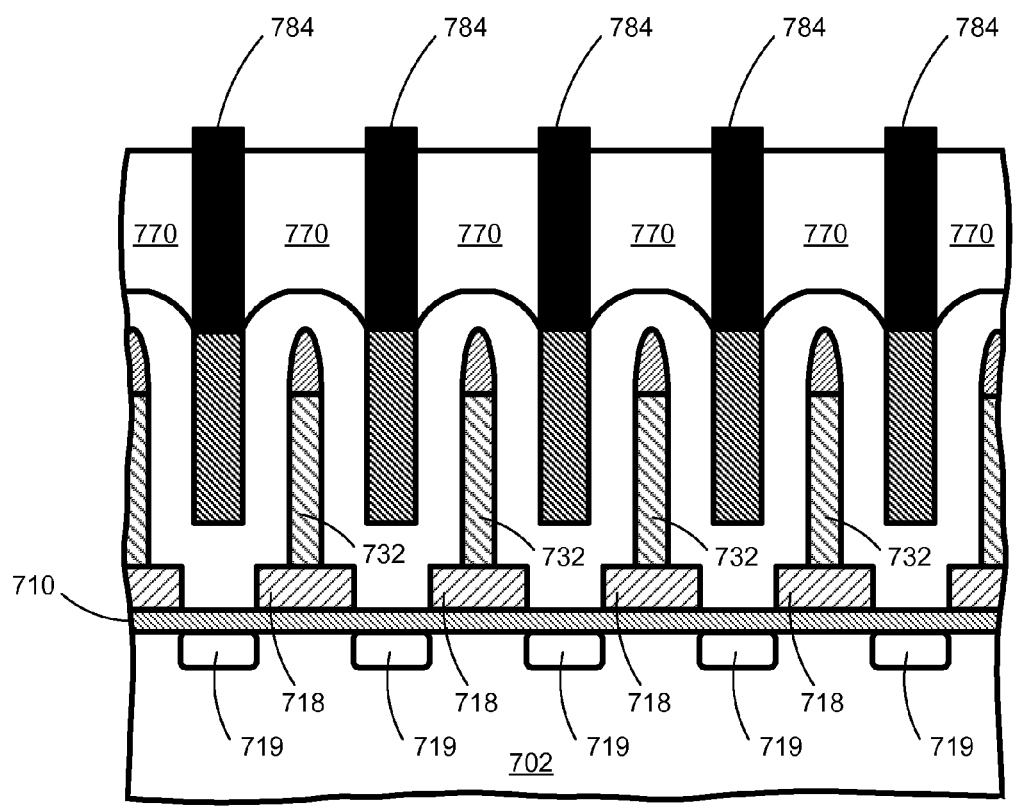
FIG. 19K ⟵ bit line direction / y-direction ⟶

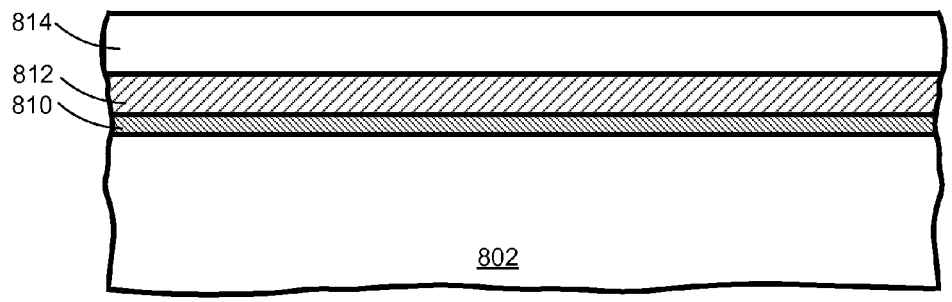
FIG. 21A ⟵ bit line direction y-direction ⟶
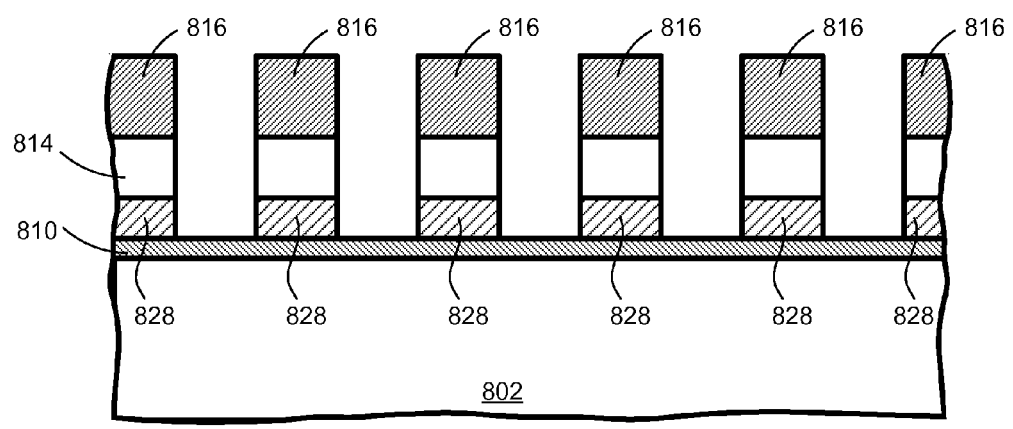
FIG. 21B ⟵ bit line direction y-direction ⟶

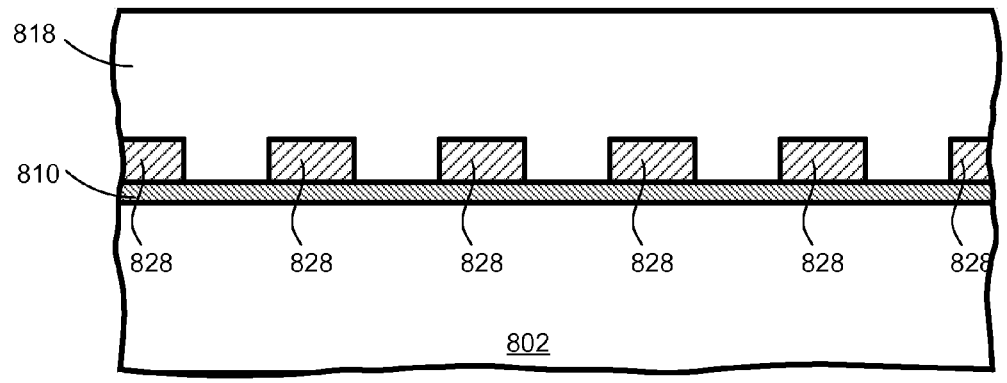
FIG. 21C ← bit line direction y-direction →
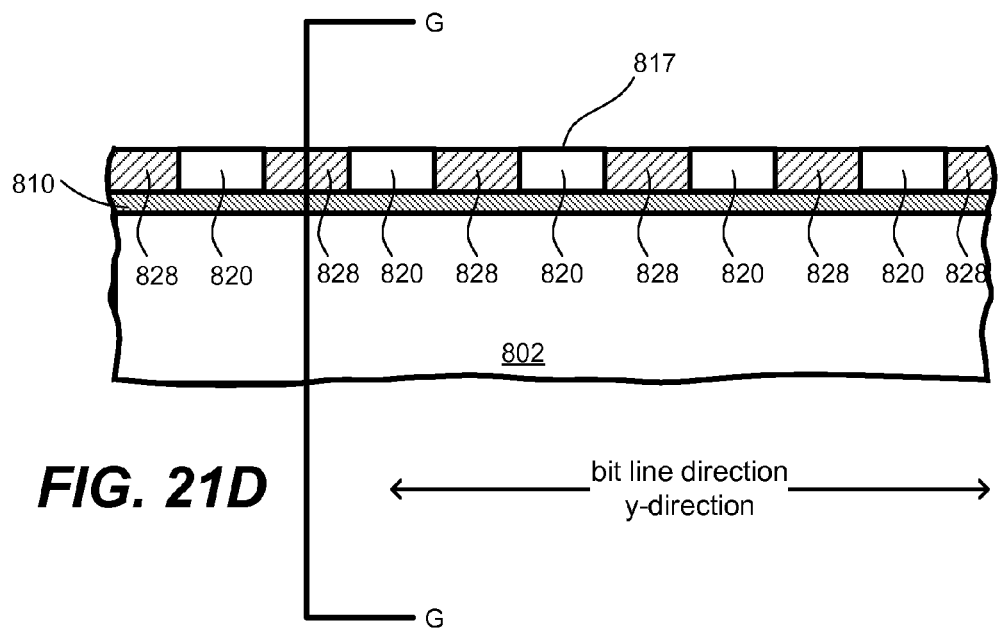
FIG. 21D ← bit line direction y-direction →

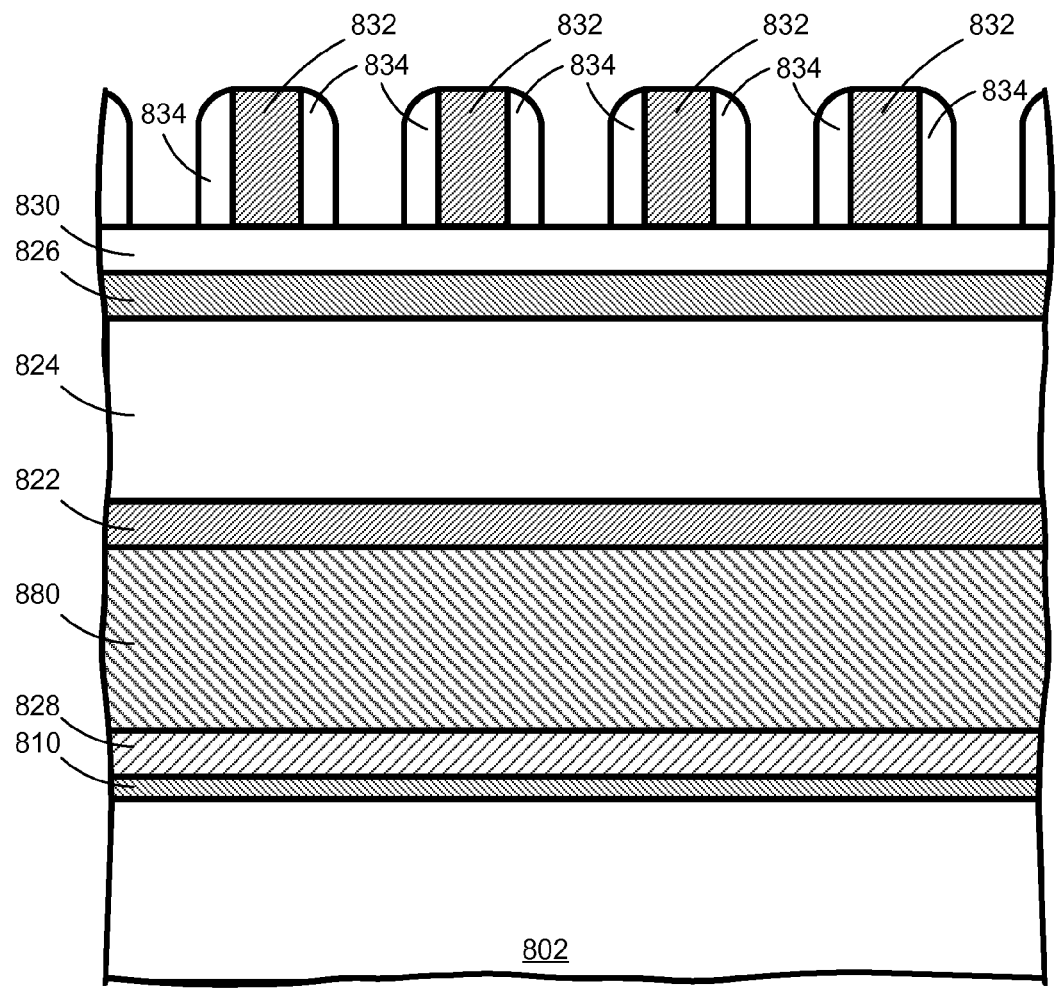
FIG. 21E  ← word line direction x-direction →

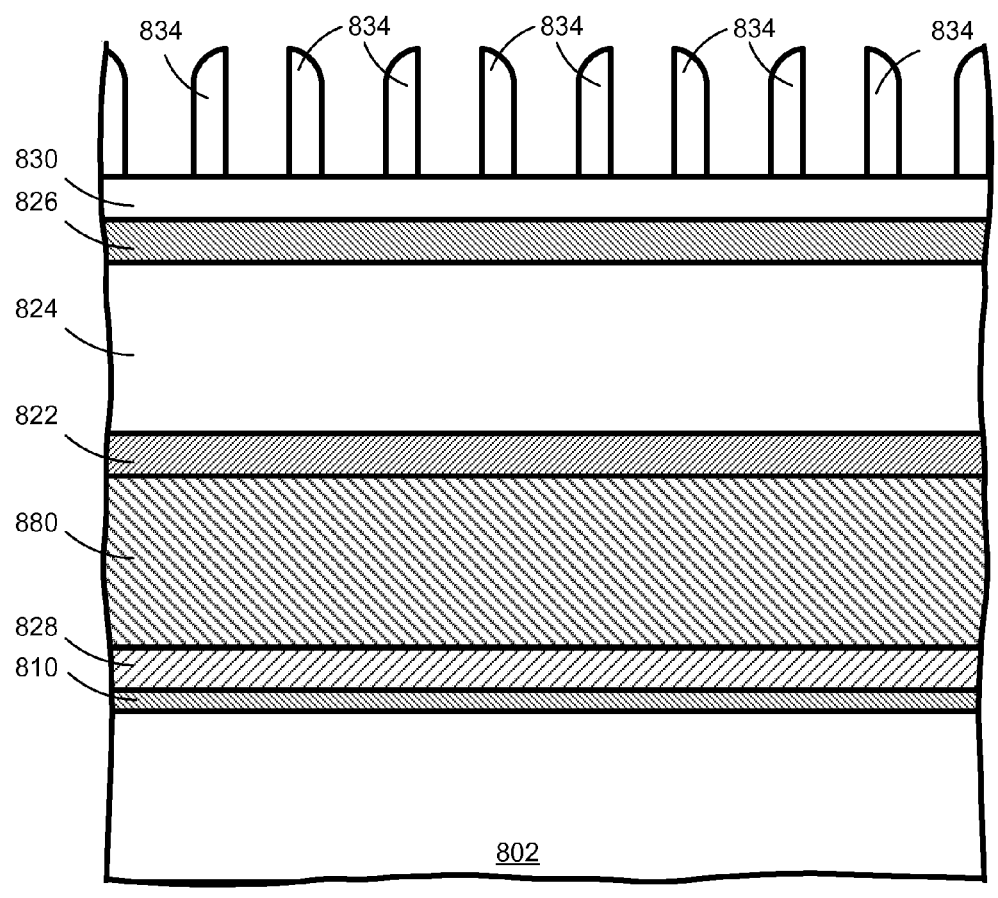
FIG. 21F ←—— word line direction ——→
x-direction

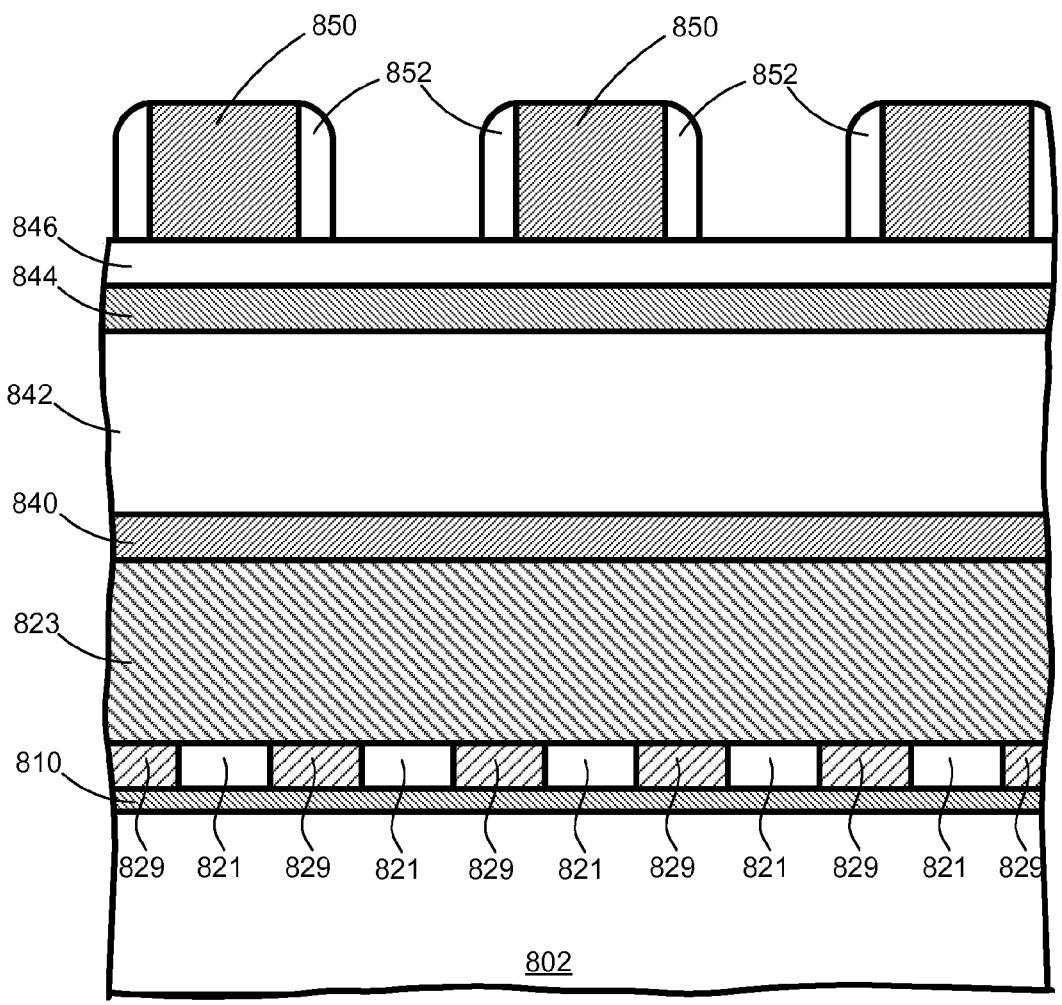
FIG. 21J ← bit line direction / y-direction →

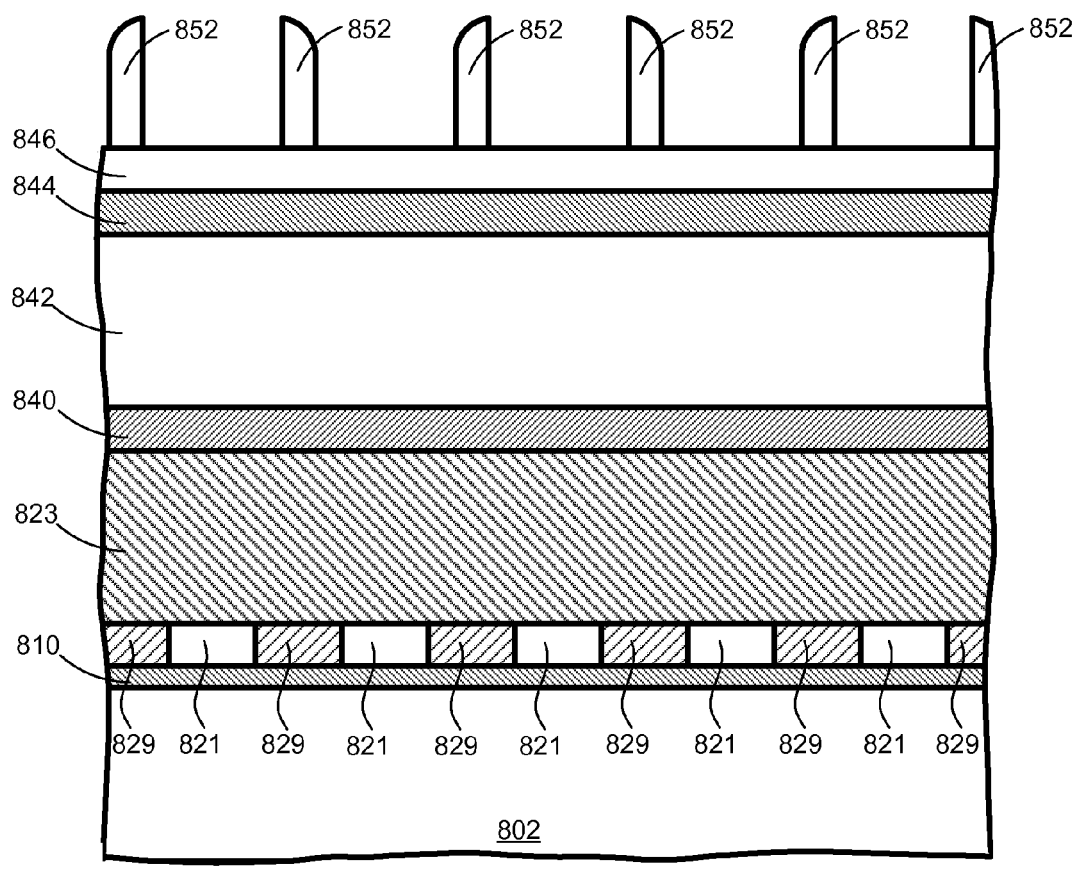
FIG. 21K  ⟵ bit line direction / y-direction ⟶

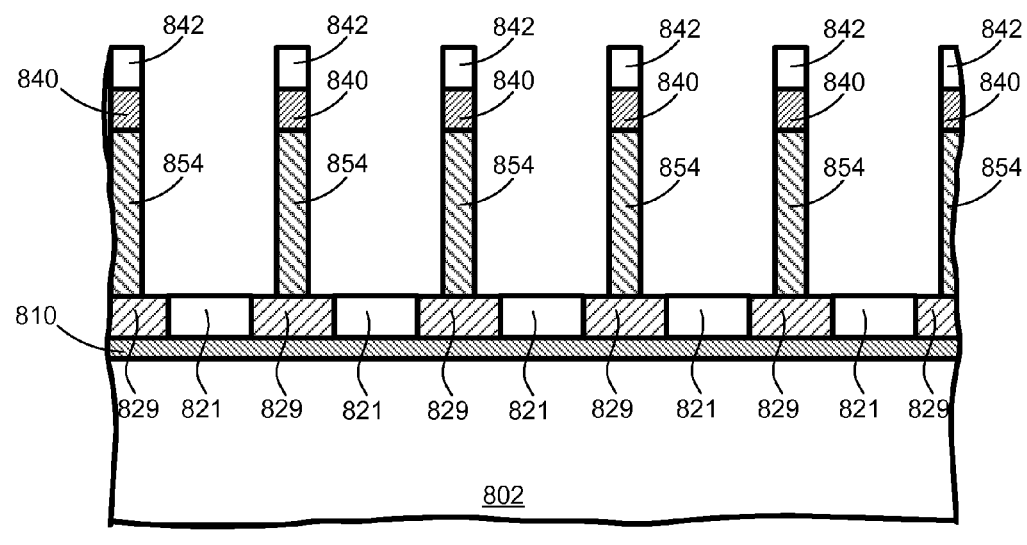
FIG. 21L  ⟵ bit line direction / y-direction ⟶

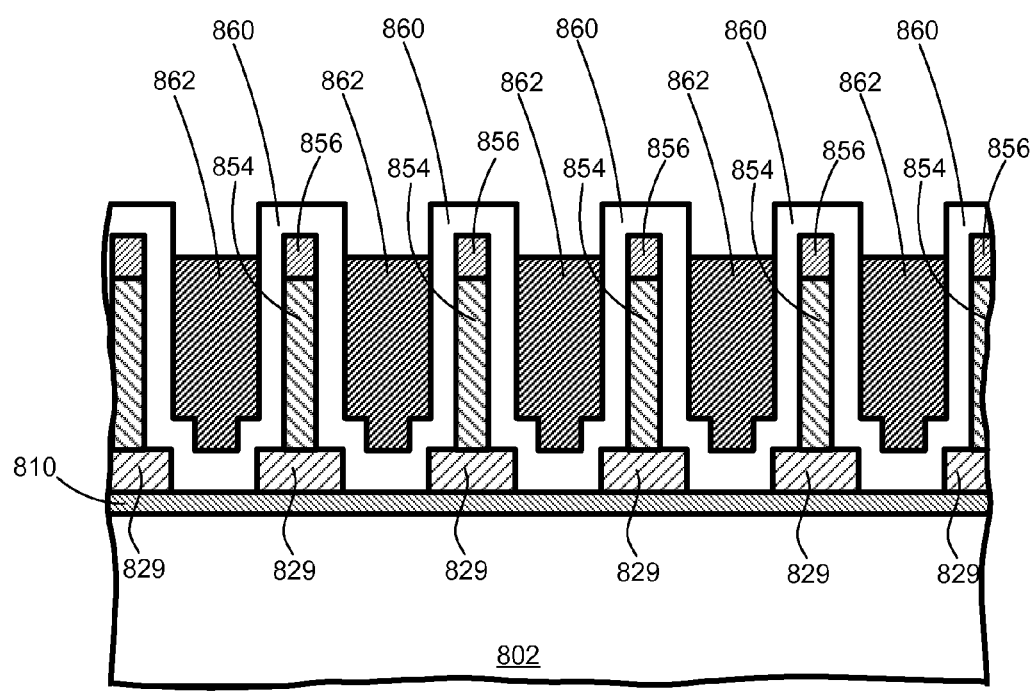
FIG. 21M  ←——— bit line direction ———→
           y-direction

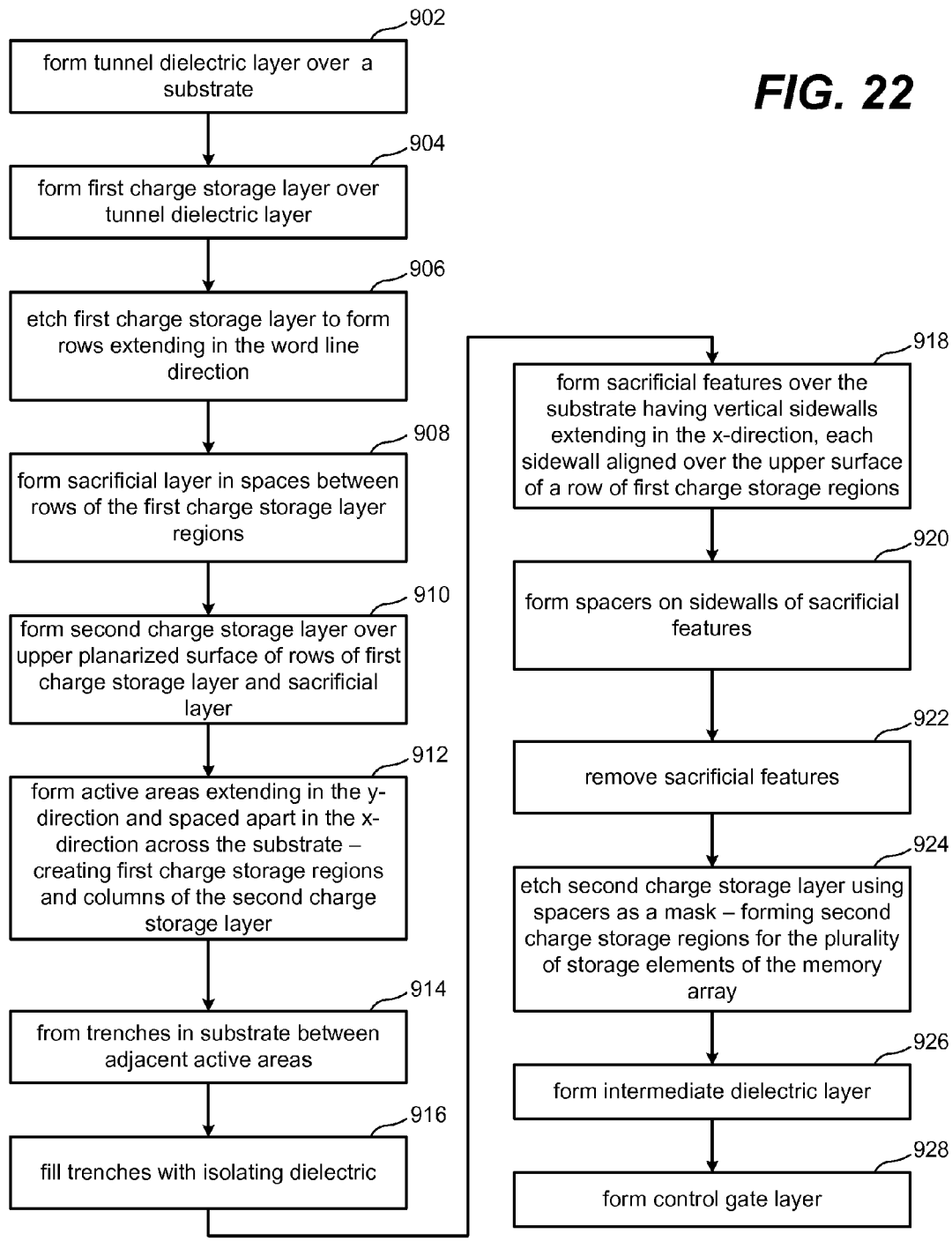

LITHOGRAPHICALLY SPACE-DEFINED CHARGE STORAGE REGIONS IN NON-VOLATILE MEMORY

CROSS-REFERENCE TO RELATED APPLICATIONS

This application is related to the following commonly assigned and concurrently filed U.S. Patent Applications, each of which is cross-referenced and incorporated by reference herein in its entirety:

U.S. patent application Ser. No. 11/960,485, entitled "Enhanced Endpoint Detection In Non-Volatile Memory Fabrication Processes," cross-referenced and incorporated by reference herein in its entirety;

U.S. patent application Ser. No. 11/960,498, entitled "Composite Charge Storage Structure Formation in Non-Volatile Memory Using Etch Stop Technologies," now U.S. Pat. No. 7,615,447; and U.S. patent application Ser. No. 11/960,518, entitled, "Non-Volatile Memory Fabrication and Isolation for Composite Charge Storage Structures."

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes. U.S. Pat. No. 6,888,755, entitled "Flash Memory Cell Arrays Having Dual Control Gates Per Memory Cell Charge Storage Element," by Eliyahou Harari, incorporated herein by reference, describes a memory array with a dual control gate structure. U.S. Pat. No. 7,026,684, entitled "Nonvolatile Semiconductor Memory Device," by Sakuma, et al., incorporated herein by reference, describes a memory with an inverted-T type floating gate structure. The charge storage element is divided into two regions having different dimensions. Fabricating the components of these devices at the specified feature sizes poses numerous demands on the fabrication processes.

SUMMARY OF THE INVENTION

High density semiconductor devices and methods of fabricating the same are provided in accordance with one or embodiments.

The dimensions of feature sizes used during fabrication of semiconductor-based memory devices can be defined by lithographically-defined spacing. In one embodiment, sacrificial features are formed over a substrate at a specified pitch having a line size and a space size defined by a photolithography pattern. Charge storage regions for storage elements are formed in the spaces between adjacent sacrificial features using the lithographically-defined spacing to fix a gate length or dimension of the charge storage regions in a column direction. Unequal line and space sizes at the specified pitch can be used to form feature sizes at less than the minimally resolvable feature size associated with the photolithography process. Larger line sizes can improve line-edge roughness while decreasing the dimension of the charge storage regions in the column direction. Additional charge storage regions for the storage elements can be formed over the charge storage regions so defined, such as by depositing and etching a second charge storage layer to form second charge storage regions having a dimension in the column direction that is less than the gate length of the first charge storage regions.

One embodiment includes fabricating non-volatile memory by forming a plurality of sacrificial features over a substrate at a pitch having a line size corresponding to a length of the sacrificial features in a column direction and a space size corresponding to a space between the sacrificial features in the column direction. A plurality of first charge regions are formed in the spaces between sacrificial features adjacent in the column direction. At least one control gate is formed for each of the first charge storage regions. A plurality of non-volatile storage can be fabricated that include one of the first charge storage regions and a second charge storage region for their charge storage structure. The second charge storage region of each storage element includes a dimension in the column direction that is less than a dimension of the corresponding first charge storage region in the column direction.

A method of fabricating non-volatile memory in another embodiment includes providing over a substrate a plurality of sacrificial features at a lithographically-defined pitch. The pitch includes a line size corresponding to a dimension of each sacrificial feature in a first direction and a space size corresponding to a space between each sacrificial feature in the first direction. A first charge storage layer is provided in the spaces between each of the sacrificial features such that the first charge storage layer forms a plurality of first charge storage regions having a gate dimension in the first direction corresponding to the space between each of the sacrificial features. A second charge storage layer is provided over the plurality of first charge storage regions followed by etching the second charge storage layer. Etching the second charge storage layer forms a plurality of second charge storage regions that have a stem dimension in the first direction that is less than the gate dimension of the first charge storage regions. A dielectric is formed over the second charge storage layer. A control gate layer is deposited and etched to form at least control gate for a plurality of non-volatile storage elements that each include one of the first charge storage regions and one of the second charge storage regions.

Other features, aspects, and objects of the disclosed technology can be obtained from a review of the specification, the figures, and the claims.

BRIEF DESCRIPTION OF THE DRAWINGS

FIGS. 11A-11H are orthogonal cross-sectional views through a portion of a string of flash memory cells depicting the fabrication of the memory cells in accordance with one embodiment that includes endpoint patterning to regulate etching of a charge storage layer.

FIGS. 14A-14H are orthogonal cross-sectional views through a portion of a string of flash memory cells depicting the fabrication of the memory cells in accordance with one embodiment that includes an etch stop layer to regulate etching of a charge storage layer.

FIGS. 15A-15F are orthogonal cross-sectional views through a portion of a string of flash memory cells depicting the fabrication of the memory cells in accordance with another embodiment that includes an etch stop layer to regulate etching of a charge storage layer.

FIGS. 17A-17I are orthogonal cross-sectional views through a portion of a string of flash memory cells depicting the fabrication of the memory cells in accordance with one embodiment that includes space-defined charge storage regions.

FIGS. 19A-19K are orthogonal cross-sectional views in the word line direction through a portion of a memory array depicting the fabrication of isolation regions between adjacent active areas or columns of memory cells in the word line direction.

FIGS. 21A-21M are orthogonal cross-sectional views of a portion of a memory array depicting the fabrication of memory cells for the array and isolation trenches between stings of memory cells.

FIG. 22 is a flowchart describing a method of fabricating non-volatile flash memory in accordance with one embodiment that includes the fabrication of memory cells for the array and isolation trenches between strings of memory cells.

DETAILED DESCRIPTION

Figure 1:
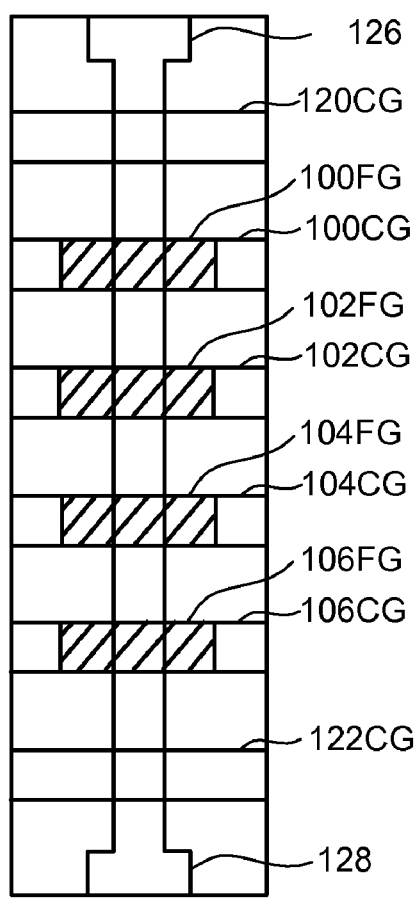
FIG. 1 is a top view of a NAND string.
Figure 2:
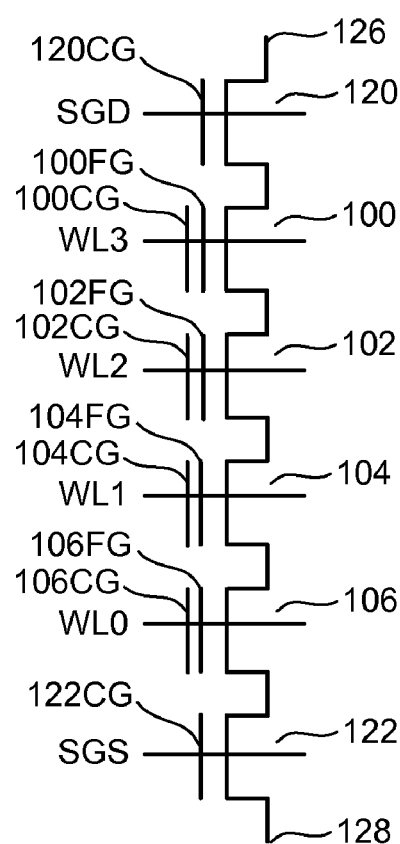
FIG. 2 is an equivalent circuit diagram of the NAND string depicted in FIG. 1.
Figure 3:
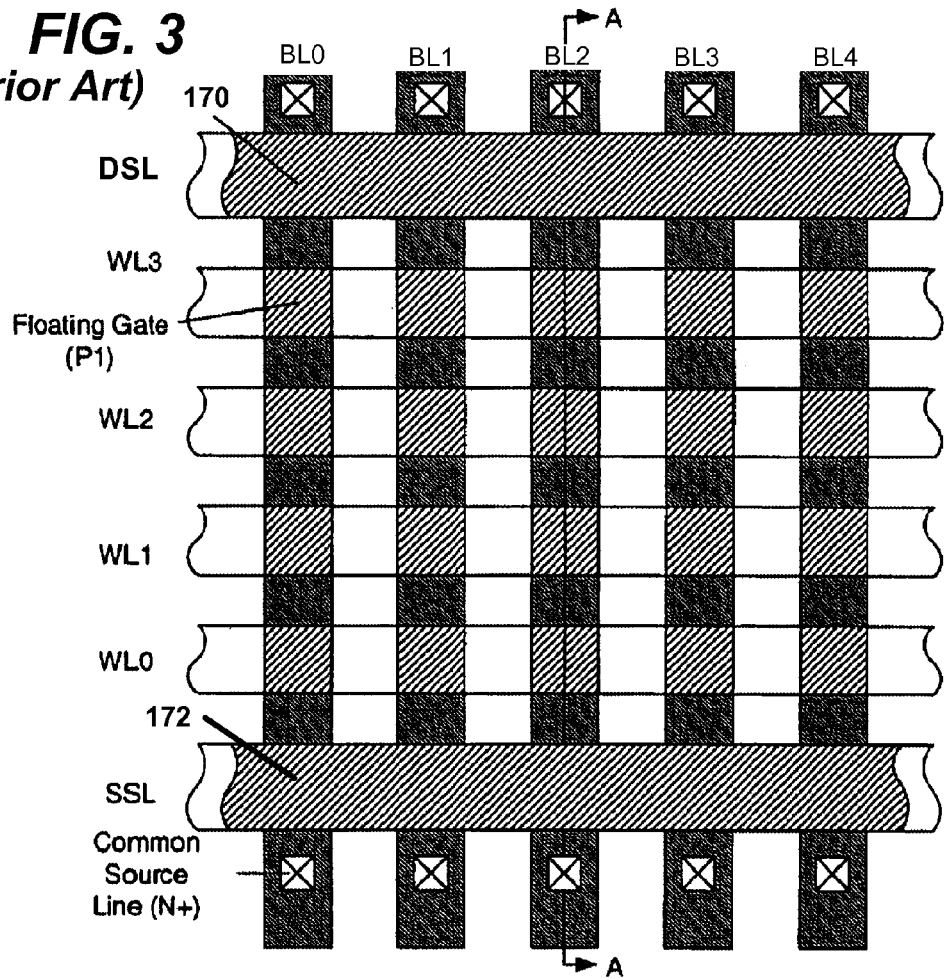
FIG. 3 is a plan view of a portion of a NAND flash memory array.
Figure 4:
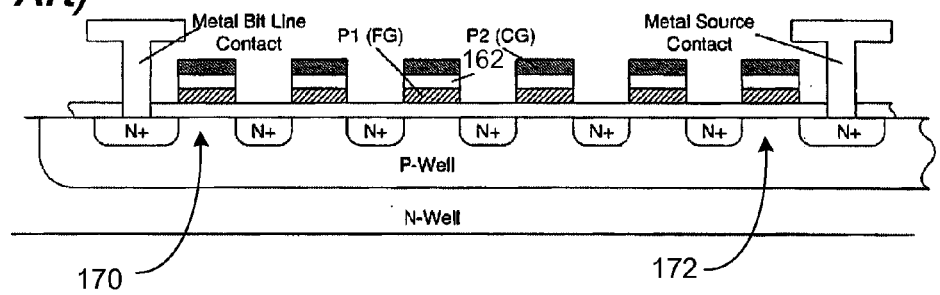
FIG. 4 is an orthogonal cross-sectional view taken along line A-A of the portion of the flash memory array depicted in FIG. 4.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
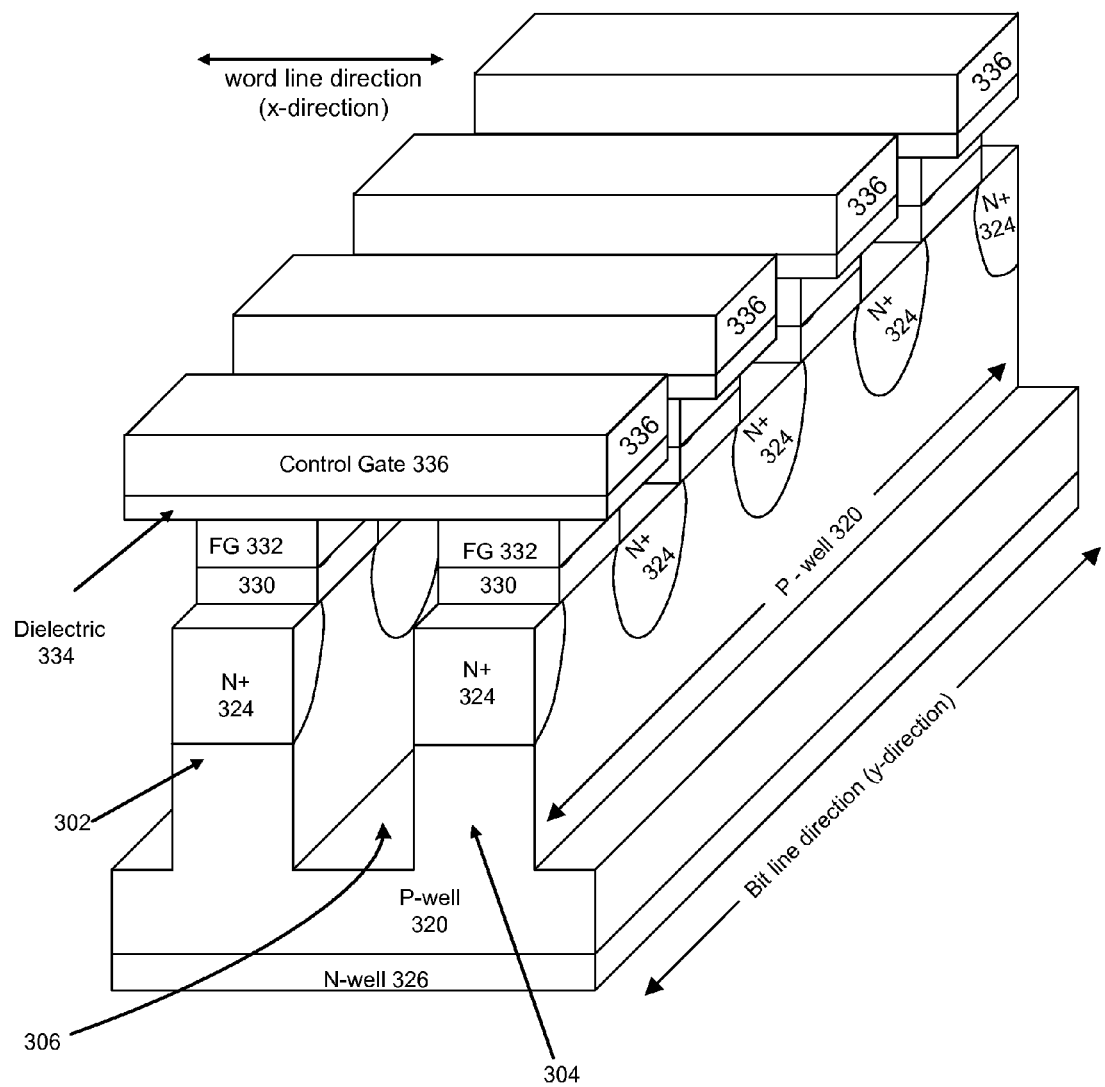
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Figure 6:
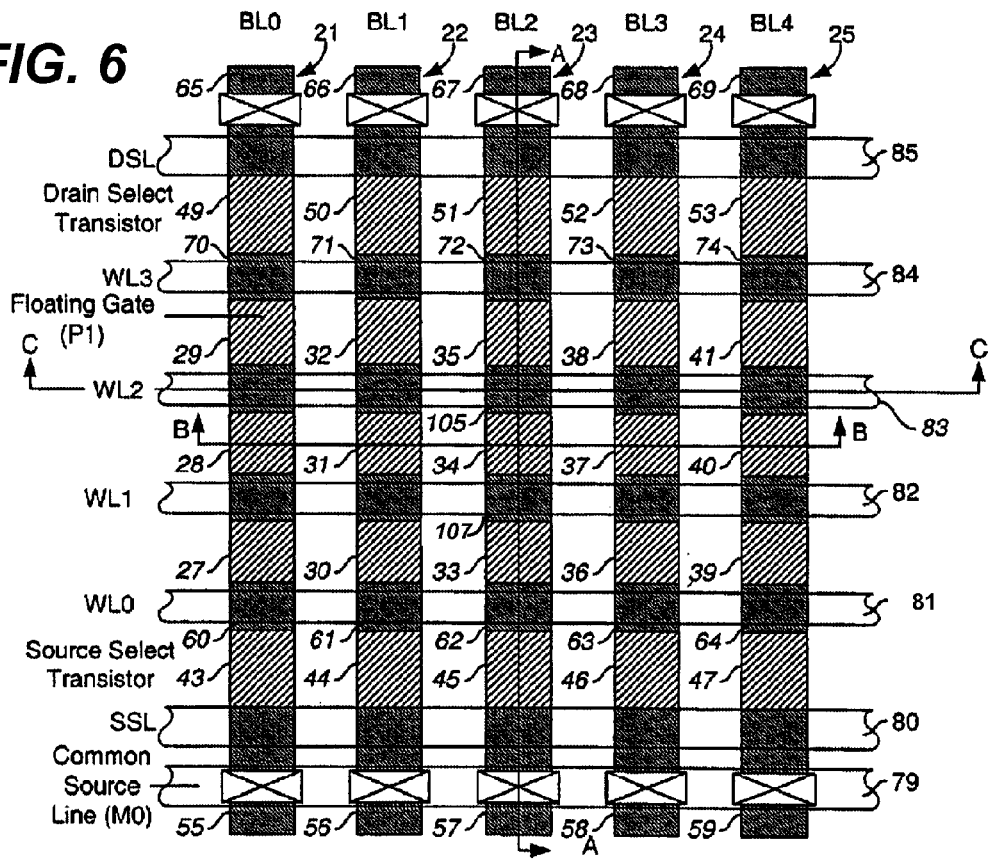
FIG. 6 is a plan view of a portion of a NAND flash memory array having a dual control-gate structure.

A NAND memory array having two control gates per memory cell is illustrated in plan view in FIG. 6. Five NAND strings 21-25 of series connected memory cells are included, with three floating gates or charge storage elements shown in each string. String 21 includes floating gates 27, 28, 29, string 22 includes floating gates 30, 31, 32, string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array would typically include millions of such memory cells forming thousands of NAND strings, each string normally having 16, 32 or more memory cells.

Each NAND string includes two select transistors, one at each end of the string, to controllably connect the string between a different one of global bit lines BL0-BL4 and a common source line. A voltage is applied to respective source select gates 43-47 to control connection of one end of their respective memory cell strings 21-25 to the common source line. The other ends of the strings 21-25 are connected through respective drain select transistors 49-53 to the respective bit lines BL0-BL4. Column control circuitry applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate.

Control gate (word) lines 81-84 are positioned between the floating gates instead of on top of them as in traditional NAND memory arrays. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independent of the coupling area of the floating gates and the substrate, resulting in a desirably high coupling ratio even as the coupling area of the floating gates with the substrate is reduced during decreases in device dimensions. The principles, devices and techniques disclosed hereinafter can be used with traditional NAND architectures having word lines positioned above floating gates, or architectures having word lines between the floating gates as shown in FIG. 6.

Two control gate or word lines replace a single word line of conventional NAND arrays in FIG. 6. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

Figure 7:
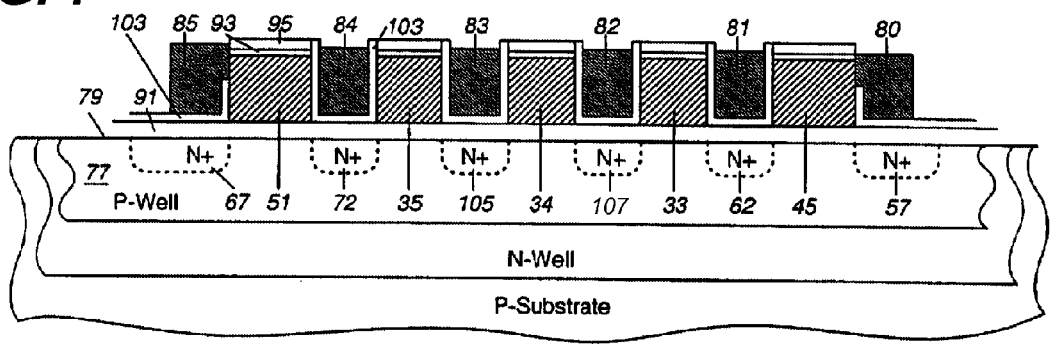
FIG. 7 is an orthogonal cross-sectional view taken along line A-A of the portion of the flash memory array depicted in FIG. 6.
Figure 8:
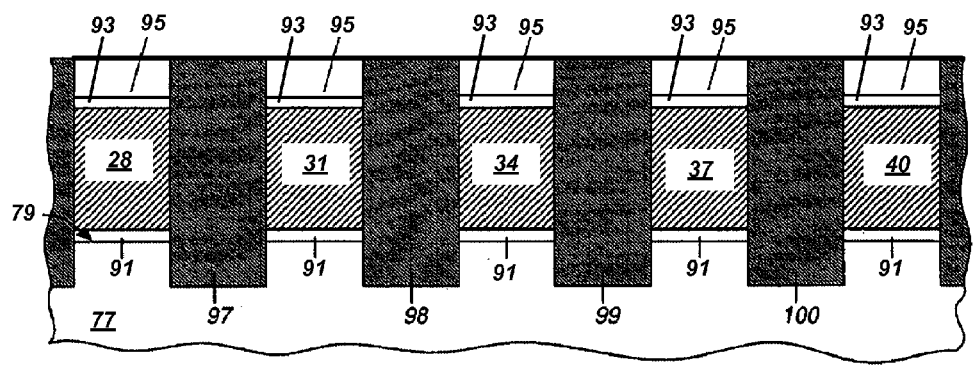
FIG. 8 is an orthogonal cross-sectional view taken along line B-B of the portion of the flash memory array depicted in FIG. 6.
Figure 9:
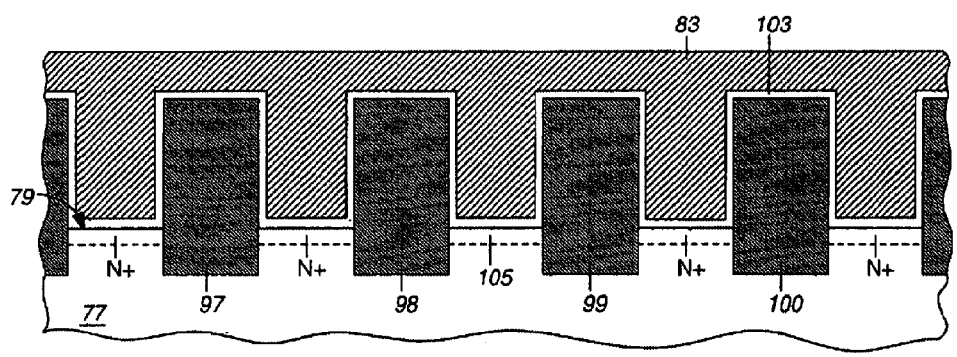
FIG. 9 is an orthogonal cross-sectional view taken along line C-C of the portion of the flash memory array depicted in FIG. 6.

FIG. 7 is an orthogonal cross-sectional view of the array shown in FIG. 6 taken along line A-A in the y-direction through one string of memory cells. FIG. 8 is an orthogonal cross-sectional view of the array taken along line B-B in the x-direction along a row of memory cells extending across multiple strings. FIG. 9 is a cross-sectional view of the array taken along line C-C in the x-direction along a word line. A layer 91 of tunnel dielectric (e.g., silicon oxide, SiO2) is formed on the surface 79 of the substrate 77 to a thickness of about 8 nm. A first layer of the charge storage material (e.g., doped polysilicon) is formed over at least the area of the array from which the floating gates 51, 35, 34, 33 and 45 are formed.

Electrical isolation is provided between columns of floating gates by Shallow Trench Isolation (STI). The exposed substrate surface is anisotropically etched to form trenches 97-100 elongated in the y-direction and positioned between the polysilicon/dielectric stack strips in the x-direction. These trenches are etched to a depth of 100-300 nm in one embodiment. In other embodiments, trench depths of up to 1000 nm, 2000 nm or more can be used.

Additional trenches can be formed alongside the first polysilicon strips with lengths in the x-direction. Over the active regions these trenches extend the full height of the floating gate plus the thickness of masking layers 93 and 95, and over the field regions they will extend 100-200 nm. The control gate lines 81-84, select gate lines 80 and 85, and source and bit line contacts are formed in these trenches. Before forming these control gate lines, ions are implanted in the trenches, shown in the cross-sectional view of FIG. 7 as memory transistor and select gate implanted source and drain regions 67, 72, 105, 107, 62 and 57. A dielectric layer 103 is formed over the exposed surfaces of the structure, conforming to the sidewalls and bottom surfaces of the newly formed trenches. The layer 103 is ONO but may also be a material having a higher dielectric constant.

A second layer of doped polysilicon is deposited over the array area, completely filling the trenches and contacting the dielectric layer 103. This polysilicon is then removed from the top of the structure by CMP, resulting in control gate lines 81-84, the SSL line 80, and the DSL line 85. These lines are made to extend at least as high as the floating gates to which they are capacitively coupled through the dielectric layer 103.

Figure 10:
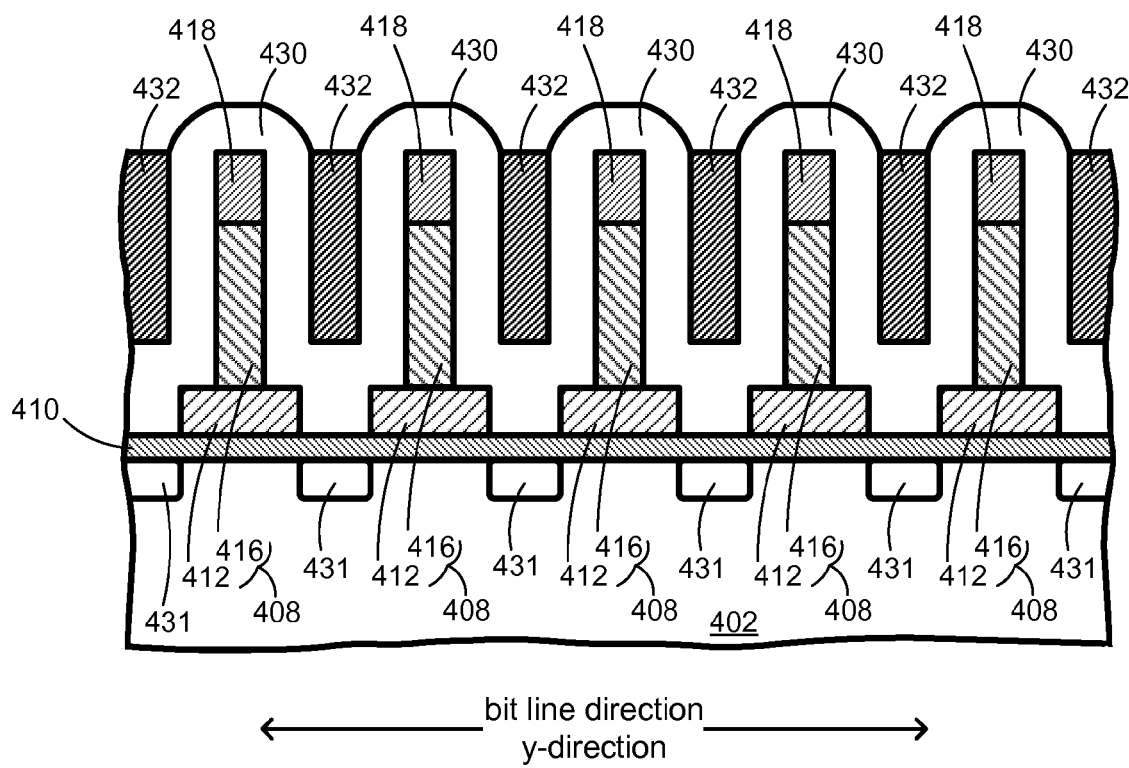
FIG. 10 is an orthogonal cross-sectional view through a portion of a NAND string of flash memory cells having a dual control gate structure and an inverted-T charge storage structure.

Another variation used in NAND memory arrays includes the formation of composite charge storage structures, such as those including multiple charge storage regions for each storage element. The so-called inverted-T type charge storage structure is an example of a composite structure. FIG. 10 is an orthogonal cross-sectional view through a portion of a string of memory cells in the bit line direction (e.g, along line A-A in FIG. 6), in an embodiment including inverted-T shaped charge storage elements. Tunnel dielectric layer 410 is formed over substrate 402. Five floating gates or charge storage elements 408 are arranged over the tunnel dielectric layer in a periodic pattern in the y-direction across the substrate. Each floating gate 408 includes a first charge storage region 412 and a second charge storage region 416 formed from different polysilicon layers over the substrate. The first region has a sectional shape that is rectangular as cut by a plane including directions parallel to the y-direction and vertical to the substrate. The second region is positioned substantially in a middle portion of the first region with respect to the bit line direction and has a sectional shape that is also rectangular as cut by a plane including directions parallel to the y-direction and vertical to the substrate. The dimension of the second region in the y-direction is less than that of the first region. The dimension of the second region in a direction vertical to the substrate is larger than the first region in the described embodiment, although this is not required. Together, a corresponding first and second charge storage region form the floating gate or charge storage element of a single memory cell. The first charge storage region is often referred to as a "fin" and the second charge storage region referred to as a "stem."

Intermediate dielectric layer 430 is continuously formed over exposed upper surfaces of the fin regions 412 and upper surfaces of an optional hard mask layer 418. The intermediate dielectric layer is also formed in the spaces between fins that are adjacent in the y-direction. Control gates 432 are positioned between adjacent floating gates 408 in the y-direction and along the sides of floating gates positioned on opposite end portions of a memory string. The control gates are separated from the floating gates by intermediate dielectric layer 430.

Like the embodiment shown in FIGS. 6-9, the inverted-T arrangement shown in FIG. 10 includes two control gates for each memory cell. One floating gate and a pair of control gates positioned on the opposite sides of the floating gate constitute one memory cell. A pair of adjacent floating gates shares the control gate positioned between the floating gates. In a variation of the memory array shown in FIG. 10, an inverted-T type charge storage region can be used in a conventional one control gate per memory cell structure. The intermediate dielectric 430 can be extended to fully include the spaces between adjacent second regions of the floating gates. A single control gate can then be formed above each corresponding floating gate. In a further variation, the spaces between adjacent second floating gate regions can be maintained and filled with a control gate layer as shown, but with the addition of an insulating material in the middle of the control gate layer to provide electrical isolation between two portions thereof. The control gate layer can extend up and over the floating gate structure and join with the control gate layer formed on the opposite side of the corresponding floating gate, while being electrically insulated from the portion of the control gate layer for the adjacent floating gate. In this manner, the two control gate portions for a single floating gate are electrically isolated from the portions for the adjacent floating gate so as to form a single control gate for each floating gate.

Composite charge storage structures, including inverted-T charge storage structures, pose unique requirements for memory fabrication processes. For instance, etching a second charge storage layer may include etching that is to end at about the level of the upper surface of a first charge storage layer. In most instances, the material comprising the first and second charge storage layers are similar if not the same. Polysilicon is often used to form the stems and fins such that selective etch processes may not be sufficient for etching the second charge storage layer without etching or damaging the first charge storage layer. In some instances, etching the second charge storage layer can be time-based, set to end after the expected time to complete etching for the stem. Differences in material chemistry and variations in feature sizes however, can make precise etching of the second charge storage layer without inadvertent etching of the first charge storage layer difficult. The actual time to etch through the second charge storage layer may vary as the chemical properties and/or sizes of the device components vary with natural manufacturing tolerances for example. Overetching can damage the first charge storage layer as well as cause performance variances between devices.

FIGS. 11A-11H depict a small portion of a memory array, describing a fabrication process according to one embodiment that utilizes a detectable material at an endpoint region of the substrate to regulate etching for the charge storage structures. Orthogonal cross-sectional views through a portion of a string or column of memory cells are depicted in FIGS. 11A-11H, taken along a line such as line A-A of FIG. 6. The memory cells have a dual control gate structure and include composite charge storage structures having an inverted-T shape. A portion of substrate 202 forming an endpoint region 206 is shown in addition to a portion of the substrate forming part of a memory array region 204. The endpoint region can include areas of the substrate dedicated to circuitry for controlling the memory array. In one embodiment, the endpoint region includes an area of the wafer that is not to be patterned during fabrication of the array, or an area that is to be patterned differently from the memory array region. By way of non-limiting example, the endpoint region can include a portion of the substrate used for forming scribe lines, measurement boxes, or areas including peripheral transistor regions (e.g., transistors for the row control circuitry).

With reference to FIG. 11A, one or more wells (e.g., a triple well), not shown, are typically formed in substrate 202. The term substrate may include reference to such well regions. After implanting and associated annealing of the well(s) to dope the substrate, tunnel dielectric layer 210 is formed at the memory array region 204 and the endpoint region 206. Different materials can be used for the tunnel dielectric, but silicon dioxide (SiO2) is often grown on the surface of the substrate to a thickness of about 8 nm, although this too can vary. The dielectric layer can also be deposited using known chemical vapor deposition (CVD) processes, metal organic CVD processes, physical vapor deposition (PVD) processes, atomic layer deposition (ALD) processes, grown using a thermal oxidation process, or formed using other suitable processes. A zero layer formation step including the formation of a pad oxide layer for example, may precede formation of the tunnel dielectric layer in some embodiments.

A first charge storage layer 212 is formed over the tunnel dielectric layer 210 at both the memory array and endpoint regions. It is noted that a layer may still be said to be over another layer when one or more interleaving layers are between the two layers, as well as when the two layers are in direct contact. The first charge storage layer can be doped polysilicon, undoped polysilicon, a dielectric charge storage material, or other suitable material. In one embodiment, doped polysilicon is formed by low-pressure chemical vapor deposition (LPCVD), although other processes can be used. Different thicknesses of the first polysilicon layer can be used, for example, between about 5 nm and 200 nm in one embodiment. This thickness is greater than that of some NAND memories, with the result that the floating gates are thicker than those of some traditional devices.

The memory array region is masked as shown in FIG. 11B. Mask 214 is formed over the first charge storage layer at the array region. The first charge storage layer 212 is exposed at the endpoint region. In one embodiment, a hard mask can be applied followed by patterning and etching using photoresist to remove the mask at the endpoint region. FIG. 11C depicts the substrate after etching to remove the first charge storage layer 212 at the endpoint region. The hard mask protects the first charge storage layer from etching at the memory array region. The hard mask 214 is then removed from the memory array region using etching, ashing or another suitable removal technique. The process of masking the memory array region results in a first charge storage layer at the memory array region but not the endpoint region.

A second charge storage layer 216 is then formed over the first charge storage layer 212 at the memory array region and over the tunnel dielectric layer 210 at the endpoint region as depicted in FIG. 11D. The second charge storage layer can include doped polysilicon, undoped polysilicon, a dielectric charge storage material, or other suitable material. The second charge storage layer is not necessarily formed of the same material as the first charge storage layer 212, although it can be. In one embodiment, the first charge storage layer is undoped polysilicon and the second charge storage layer is doped polysilicon. An optional hard mask 218 is formed over the second charge storage layer 216. A pattern 220 is provided over the hard mask 218 at the memory array region for etching the stem regions for the charge storage elements. The endpoint region is not patterned. In one embodiment, the pattern includes strips of photoresist over a bottom anti-reflective coating that are formed by conventional photolithography. Spacer-assisted patterning, nano-imprint patterning, and other patterning techniques can also be used to form strips at reduced features sizes. Various spacer-assisted patterning techniques are described hereinafter.

Figure 11E:
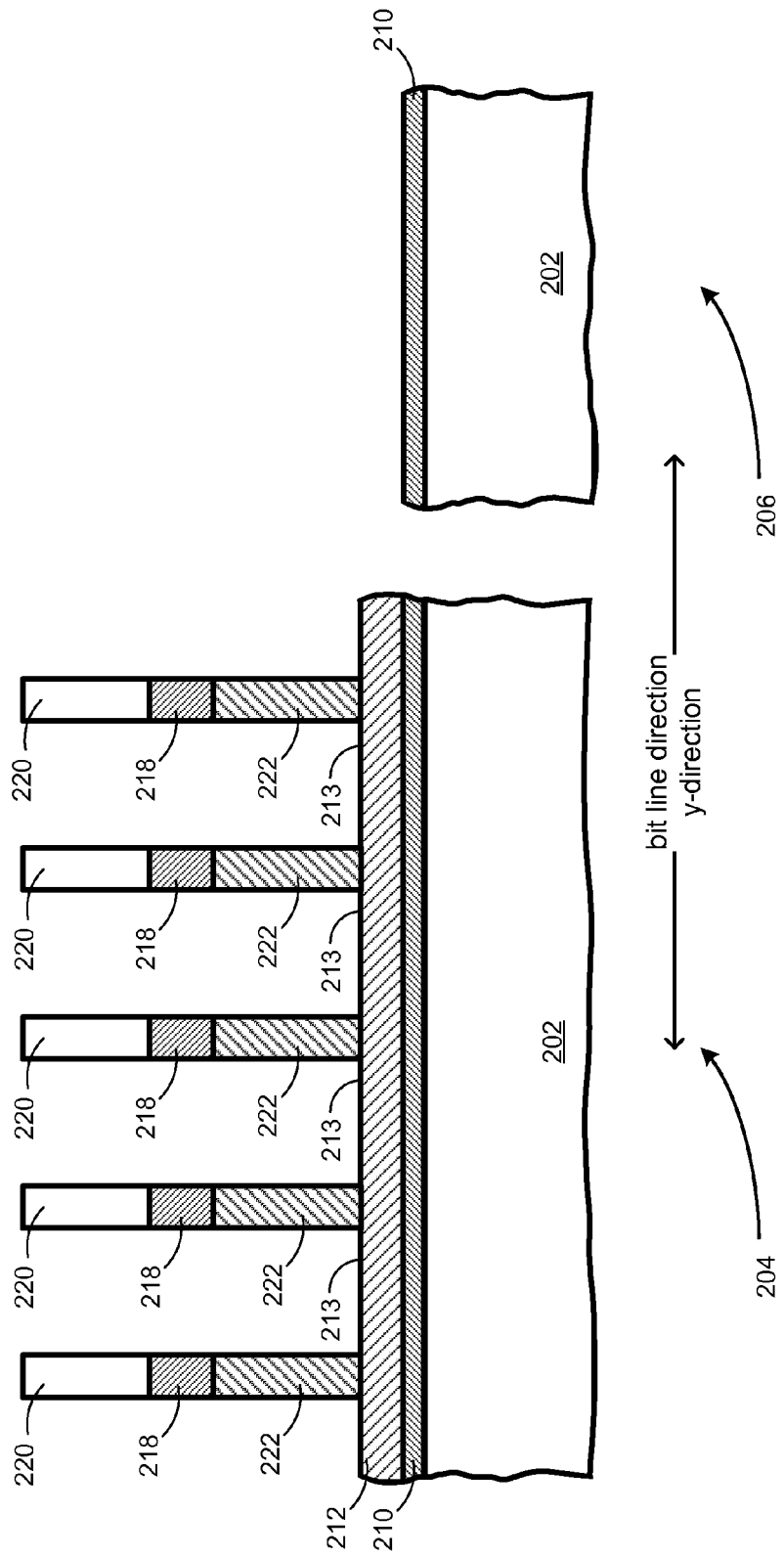

Using the pattern 220 as a mask, the hard mask layer 218 and second charge storage layer 216 are etched, for example by reactive ion etching (RIE) that is selective to the hard mask, followed by etching that is selective to polysilicon. FIG. 11E depicts a plurality of stacks including a portion of the pattern 220, a portion of the hard mask 218, and a portion of the second charge storage layer 216. Etching the second charge storage layer 216 forms a plurality of second charge storage regions 222. The second charge storage regions each include two substantially vertical sidewalls extending across the substrate in the x-direction with surfaces in the y-direction.

The first charge storage layer 212 was removed from endpoint region 206 before etching layers 218 and 216. Accordingly, the etching exposes tunnel dielectric layer 210 at endpoint region 206 prior to reaching tunnel dielectric layer 210 at memory array region 204. The tunnel dielectric layer is reached at endpoint region 206 at about the same time as the first charge storage layer 212 is reached at the memory array region 204. The exposure of dielectric layer 210 at endpoint region 206 can provide a detectable endpoint when etching layers 218 and 216 to form the stem regions for the charge storage elements. Dielectric layer 210 can provide a detectable endpoint signal or indicator to signify the depth of the etch process for the second charge storage layer. The exposure or detection of the tunnel dielectric layer at the endpoint region indicates that the first charge storage layer has been reached at the memory region. The endpoint signal or indicator can be used to determine when to stop the etch process. Detection of the dielectric layer effectively indicates that the first charge storage layer has been reached in the memory array portion and thus, that etching for the second charge regions of the charge storage elements can be stopped. Stopping the etch process can be based on exposure or detection of the dielectric layer while not stopping exactly at the point of detection. For example, some embodiments can continue etching for a period of time after detecting the tunnel dielectric layer at the endpoint region.

Detecting when the tunnel dielectric layer is exposed at the endpoint region is accomplished by monitoring the material composition of the tool chamber used in the etching process in one embodiment. Etching tools are often configured with a monitoring module that determines the chamber contents by monitoring the plasma in the chamber that results from the etch. The chemical composition of the etching chamber is used to identify the depth of the etch by correlating the chemistry to determine the current layer being etched. When etching a first charge storage layer 216 formed of polysilicon, for example, the chemical composition will be consistent with polysilicon. When an oxide tunnel dielectric layer 210 is reached, the chemical composition of the chamber will include the components of the dielectric material, e.g., oxide. When the elements of the tunnel dielectric are detected in the chamber, it is determined that the tunnel dielectric layer at the endpoint region is reached. When the tunnel dielectric is reached at the endpoint region, the first charge storage layer has been reached at the memory array region. Thus, the detection of a particular chemical composition in the chamber (or change in chemical composition) can serve as a signal, the detection of which can be used as the basis for determining when to stop an associated etch process. It is possible for the second charge storage layer to clear at the endpoint region prior to being completely etched at the memory array region due to such factors as pattern density dependent RIE loading effects. Nevertheless, the detection of the tunnel dielectric layer at the endpoint region can provide a repeatable process when compared with time-based methods for example. In one such embodiment, etching may be continued for some period after detecting the tunnel dielectric layer.

Figure 11F:
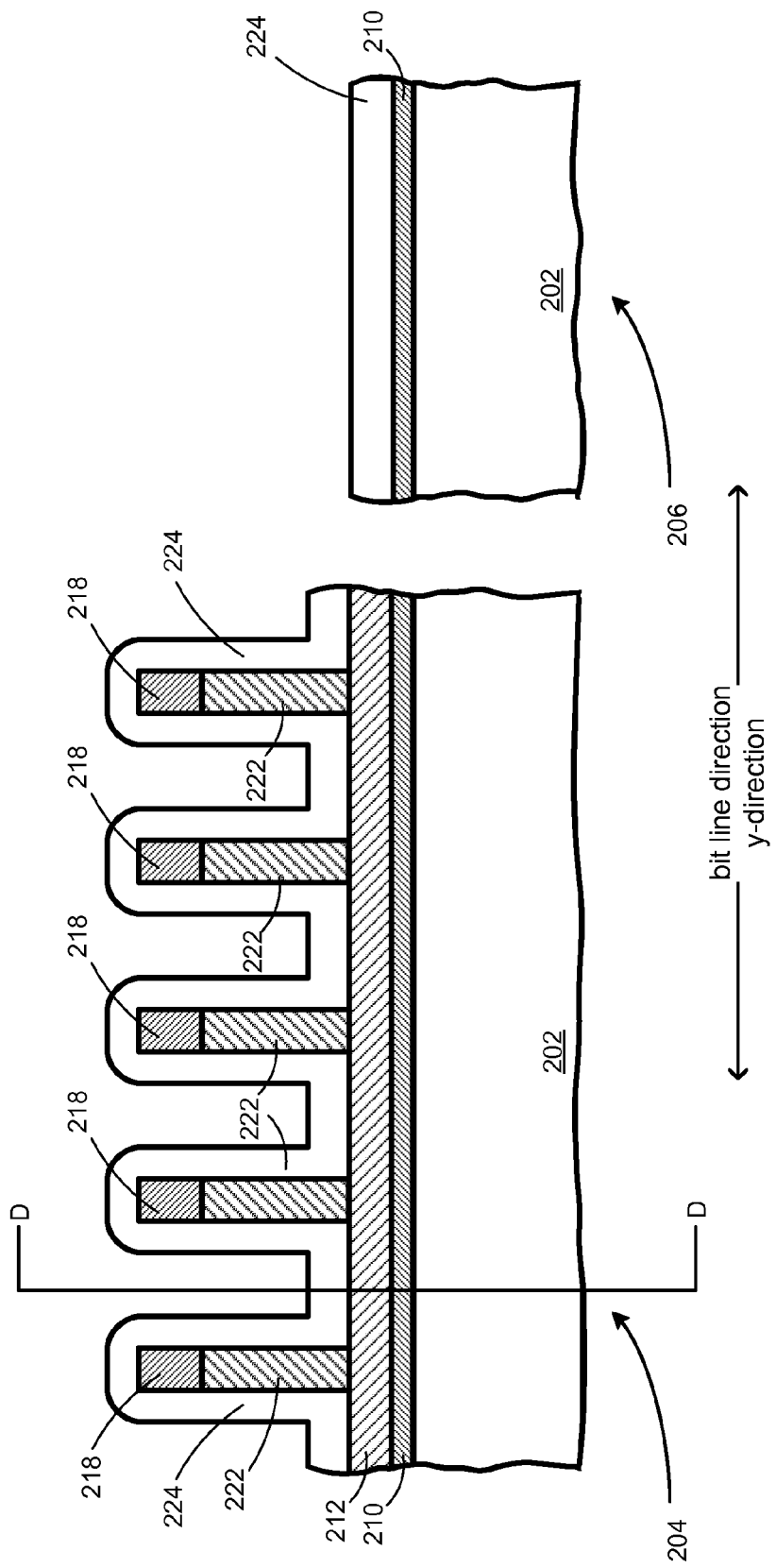
Figure 11G:
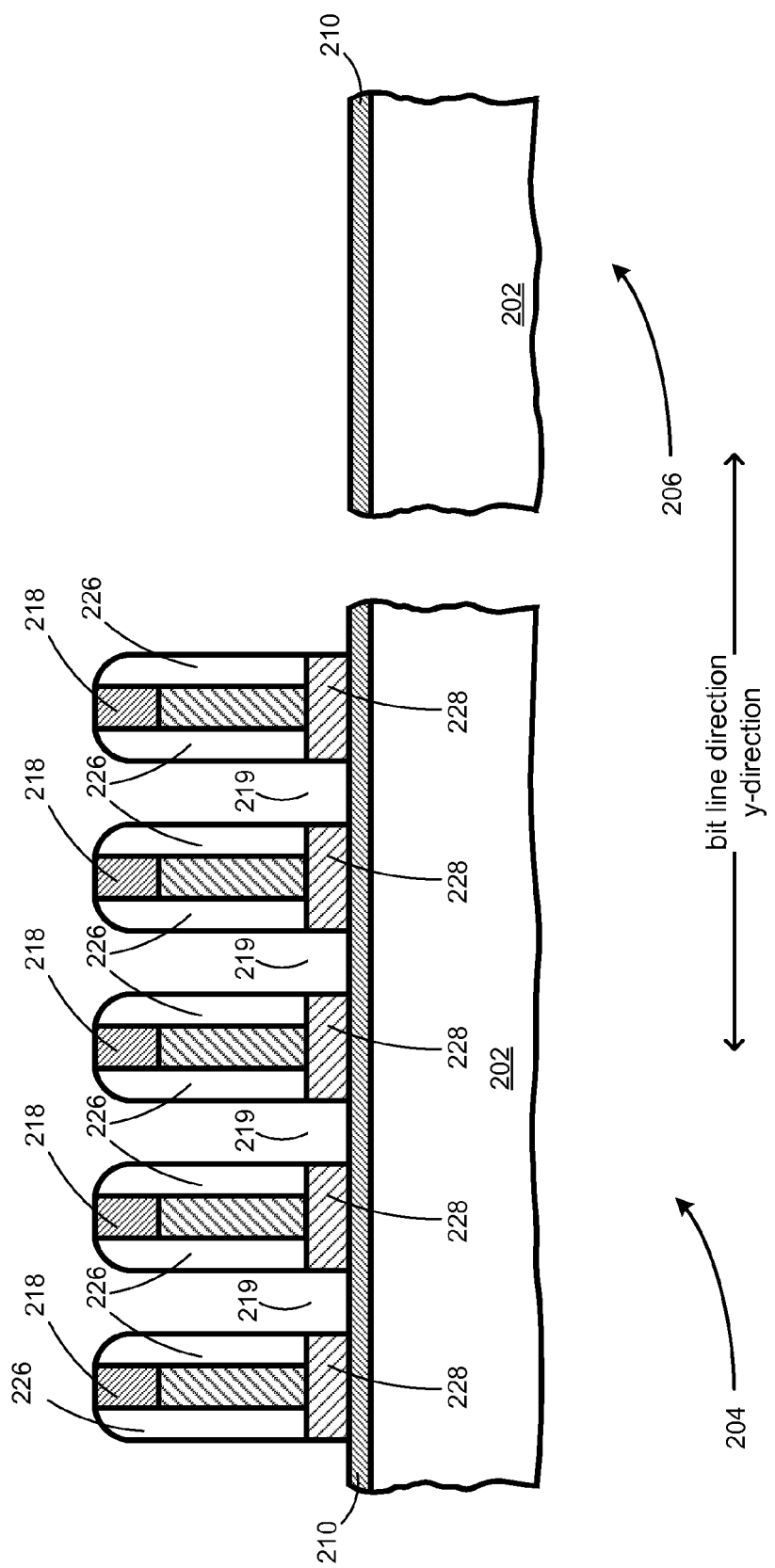

After forming the second charge storage regions 222 for each storage element, the pattern is removed by etching, ashing, or another suitable method. A spacer layer 224 is then deposited over the substrate at the memory array region and the endpoint region as depicted in FIG. 11F. The spacer layer is formed over the exposed upper surface 213 of the first charge storage layer and along the stacks, including the sidewalls of the second charge storage regions. The spacer layer 224 is etched as shown in FIG. 11G. Individual spacers 226 are formed along the sidewalls of the stem regions. An anisotropic reactive ion etch selective to the spacer material is used in one embodiment. Etching the spacer material not only forms spacers 226, but also exposes the first charge storage layer 212 at positions 219 between spacers adjacent in the bit line direction. After forming the spacers, the first charge storage layer 212 is etched between adjacent spacers to form the first charge storage regions 228 for each storage element as shown in FIG. 11G. A reactive ion etch is used in one embodiment. Depending on the selectivity of the RIE, tunnel dielectric layer 210 and/or hardmask layer 218 may be etched when forming the first charge storage regions 228.

Figure 11H:
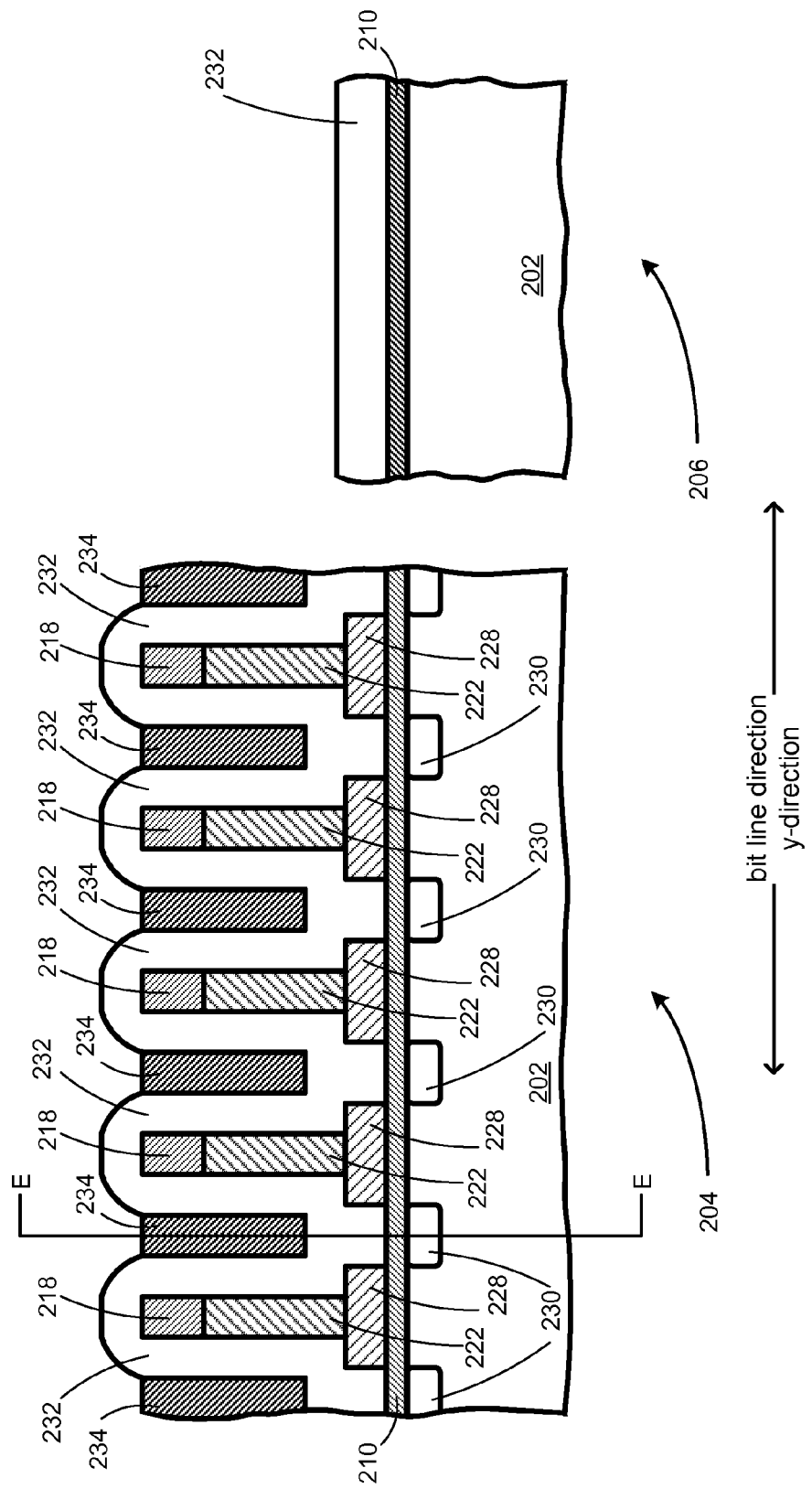

FIG. 11H depicts the substrate after removing spacers 226. Etching with a selectivity to avoid etching other important features is used in one embodiment. The charge storage elements can also serve as a mask for source and drain ion implementation in one embodiment. Implanted regions 230 between charge storage elements can be formed by ion implantation. An intermediate dielectric layer 232 is formed over the substrate after ion implantation. The intermediate dielectric layer is often a multi-layered oxide-nitride-oxide (ONO) but other materials can also be used. Conformal processes can provide a substantially constant thickness of the intermediate dielectric relative to the upper surface and sidewalls of the stacks, including the second charge storage regions and the first charge storage regions. Control gates 234 extend in the x-direction between charge storage elements that are adjacent in the y-direction. A control gate layer is deposited over the intermediate dielectric between adjacent charge storage elements, substantially filling the area between adjacent portions of the intermediate dielectric layer. The control gate layer is formed along the substantially vertical sidewalls of the intermediate dielectric layer. The control gate layer is polysilicon in one embodiment, which is polished by CMP or etched by an anisotropic etch to about the height of the upper surface of hardmask layer 218 to form the control gates.

The first charge storage regions for a composite charge storage structure can be formed from more than one charge storage layer. Additional endpoint regions of the substrate can be patterned to detect when the etching for the second charge storage regions has reached each of these individual layers for the first charge storage region. For example, in one embodiment an additional charge storage layer is formed over the first charge storage layer shown in FIG. 11A. The mask is applied over the memory array region as shown in FIG. 11B while leaving this first endpoint region unmasked. An additional endpoint region can be masked in the same manner as the memory array region. After etching to remove the additional charge storage layer from the first endpoint region, the mask can be removed from the additional endpoint region. Etching is then performed to remove the additional charge storage layer from the additional endpoint region and to remove the first charge storage layer from the first endpoint region.

Processing then proceeds as earlier described with both endpoint regions treated in the same manner. When etching the second charge storage regions, the tunnel dielectric will be exposed at the first endpoint region when the additional charge storage layer is reached at the memory array region, providing a first detectable endpoint signal. Further etching will expose the tunnel dielectric at the additional endpoint region at about the same time the first charge storage layer is reached at the memory array region, providing a second detectable endpoint signal.

The use of additional charge storage layers can be used to more precisely regulate etching of the second charge storage regions by detecting with greater precision the point of the etch process. Additional layers can also be used to create charge storage structures with different heights for the first charge storage region. A first set of storage elements can include first charge storage regions formed from the first charge storage layer and the additional charge storage layer. Another set of storage elements can include charge storage structures formed from just the first charge storage layer. It is also possible to form charge storage structures with a tiered first charge storage region. The first charge storage layer can be formed with a first dimension in the bit line direction and the additional charge storage layer formed with a second dimension in the bit line direction that is less then the first dimension but greater than the dimension of the second charge storage region.

FIGS. 11A-11H describe an embodiment in which the endpoint region is not patterned during memory fabrication. FIGS. 12A-12E depict an embodiment that includes patterning an area of the endpoint region to form devices such as the transistors for peripheral circuitry including row or column control circuitry. A memory array region 304 and endpoint region 306 of substrate 302 are depicted. A tunnel dielectric layer 310, first charge storage layer 312, second charge storage layer 316 and optional hard mask 318 are formed at the memory array region. At the endpoint region, the first charge storage layer has been removed as described in FIGS. 11A-11H. A first pattern 320 is formed over the hardmask at the memory array region and a second pattern 321 is formed over the hard mask at the endpoint region. The first pattern is used to etch the second charge storage regions for the storage elements at the memory array region. The second pattern is used to etch gate regions for peripheral transistors at the endpoint region. Both patterns can be formed using traditional photolithography, spacer-assisted patterning or nano imprint technology.

Figure 12A:
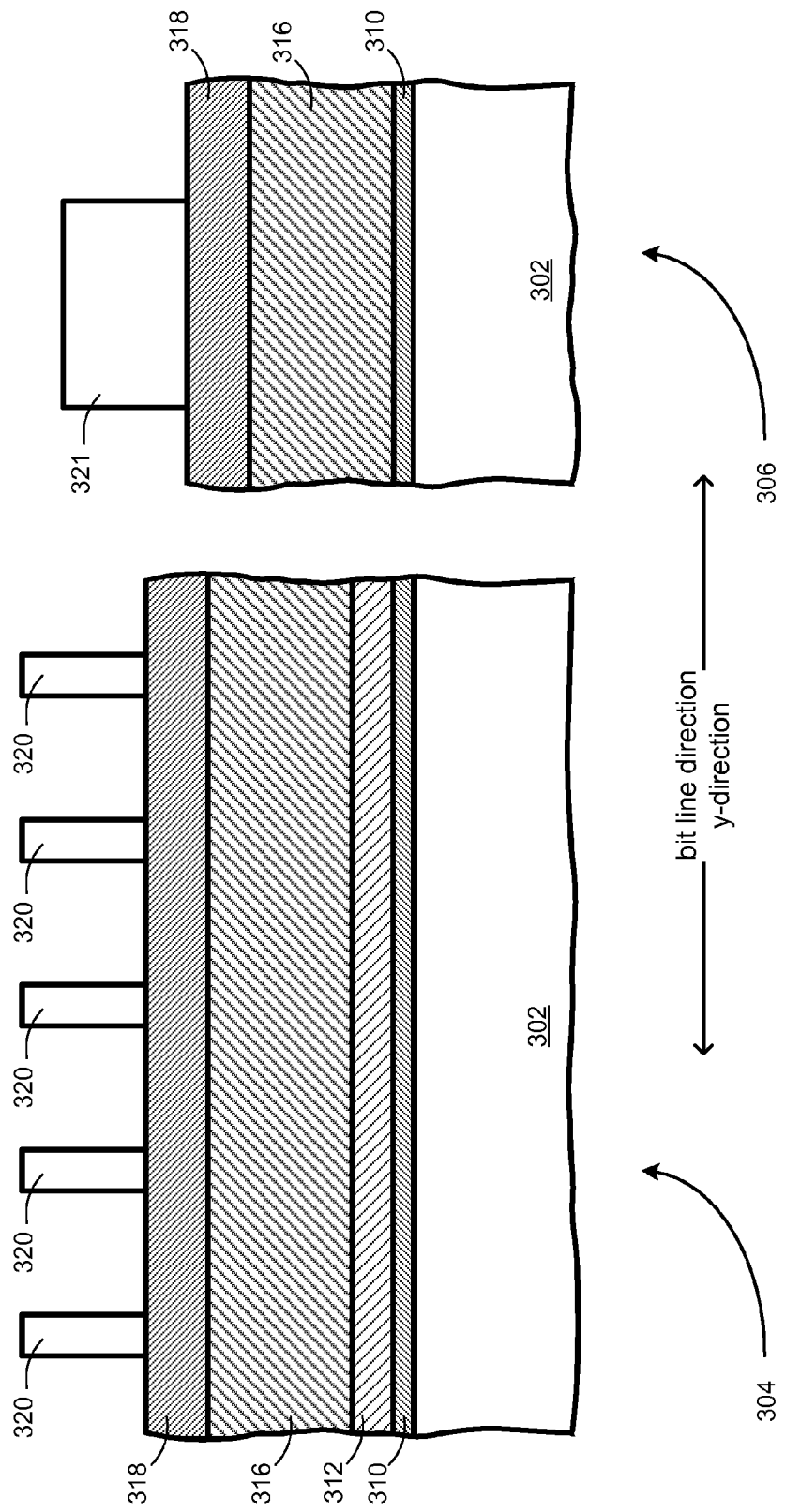
FIGS. 12A-12E are orthogonal cross-sectional views through a portion of a string of flash memory cells depicting the fabrication of the memory cells in accordance with another embodiment that includes endpoint patterning to regulate etching of a charge storage layer.
Figure 12B:
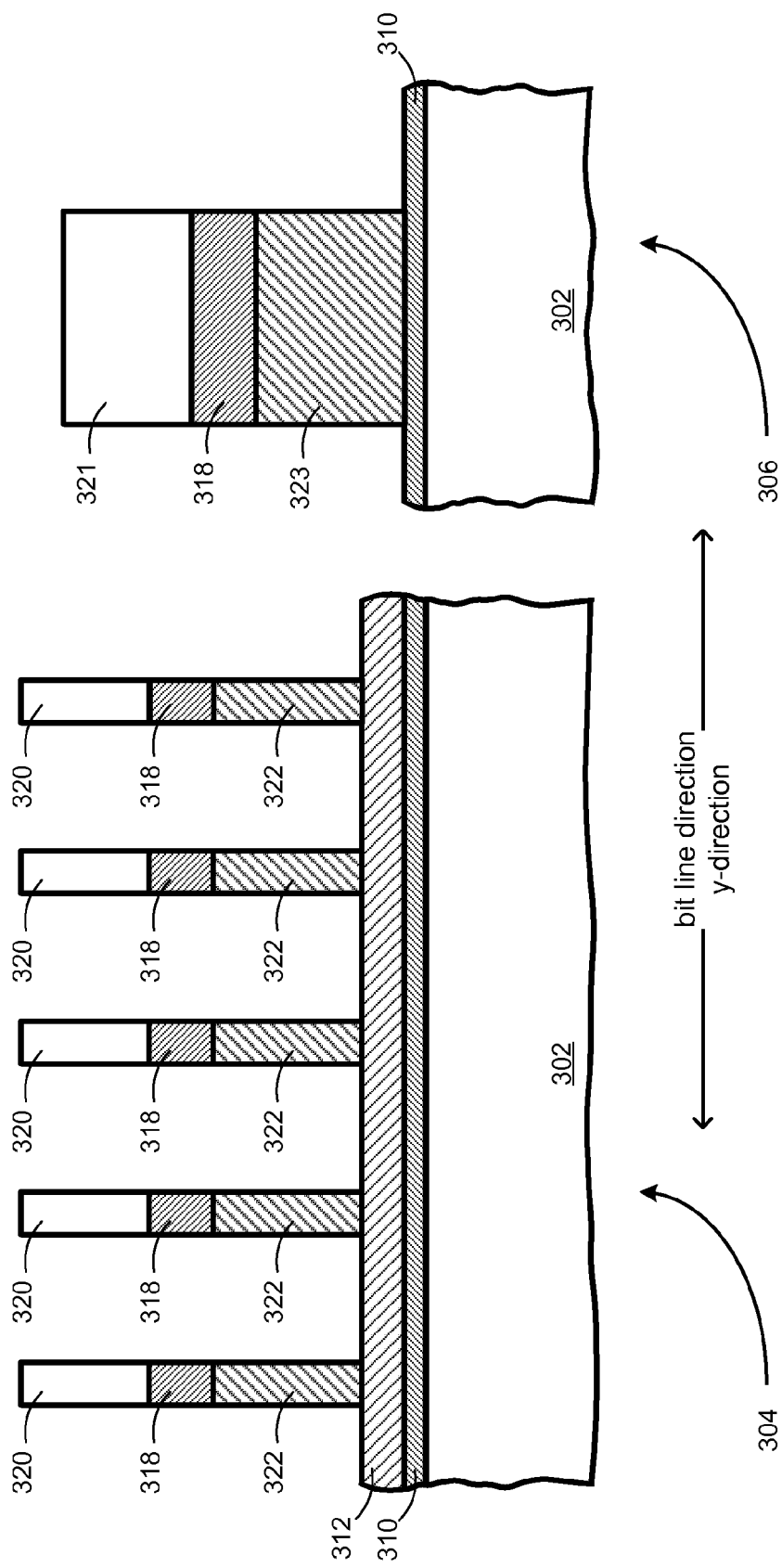

Hardmask 318 and second charge storage layer 316 are etched as depicted in FIG. 12B using the patterns as a mask. Tunnel dielectric layer 312 at the endpoint region provides an endpoint signal during etching to indicate that the second charge storage layer 316 has been etched, completing formation of the second charge storage regions 322. In this implementation, the tunnel dielectric layer also indicates that the second charge storage layer 316 has been etched to form gates 323 for the peripheral transistors. Thus, etching to form stem regions 322 for the composite storage element is combined with etching to form gates 323 for peripheral region transistors. Like before, the material composition of the tool etching chamber can provide the signal that the tunnel dielectric layer has been reached at the endpoint region and thus, that etching through second charge storage layer 316 at the memory array region is completed.

Figure 12C:
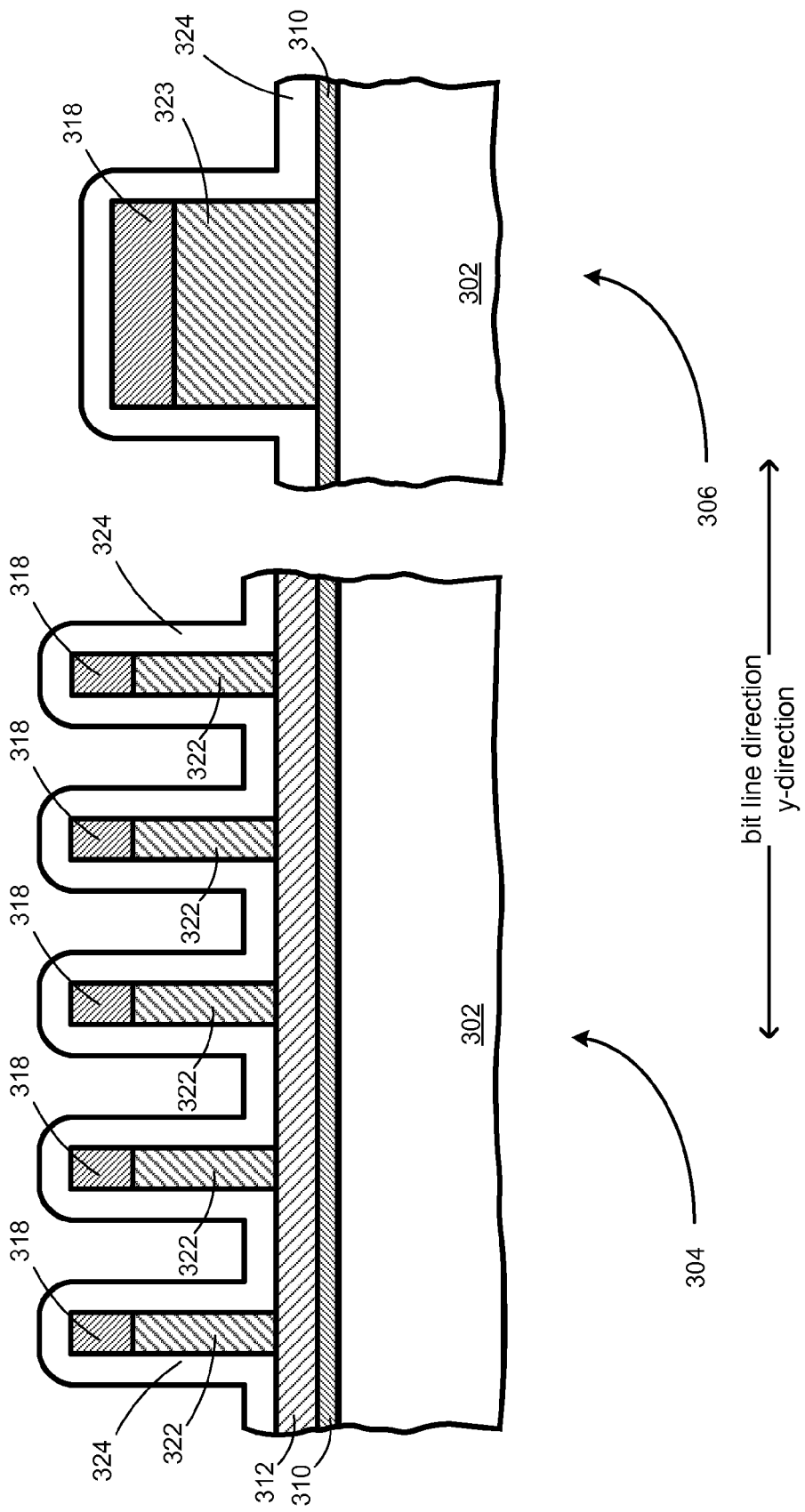
Figure 12D:
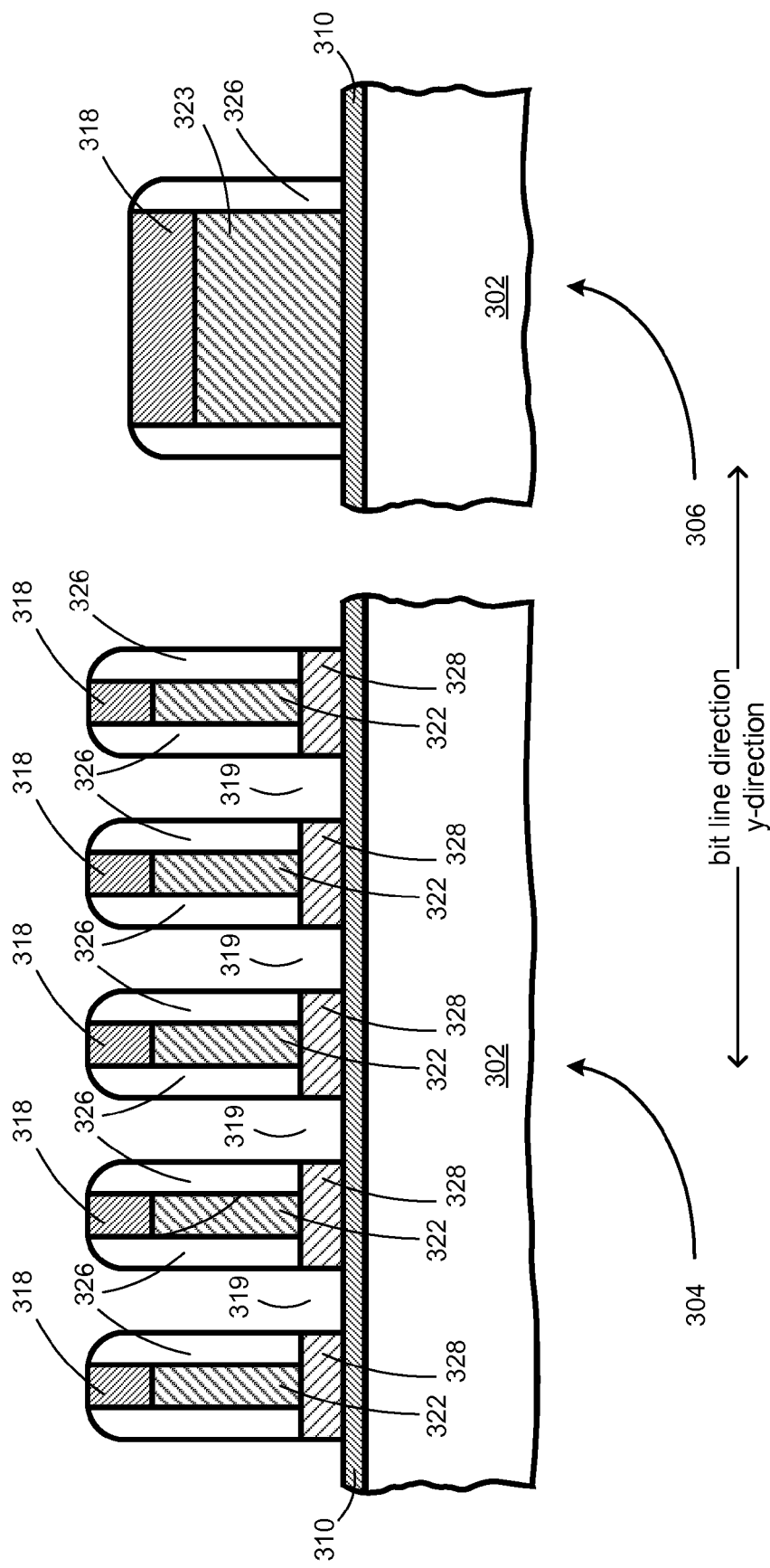

Processing proceeds as with the previous embodiment by removing the hard mask 320 and depositing a spacer layer 324 as shown in FIG. 12C. These steps are performed at both the memory array region 304 and the endpoint region 306. Etching defines spacers 326 and exposes portions of the first charge storage layer at positions between adjacent spacers, as depicted in FIG. 12D. Additional etching, selective to the first charge storage layer is then performed to remove the first charge storage layer at the exposed positions 319. Etching the first charge storage layer forms a plurality of first charge storage regions 328 for the storage elements of the memory array.

Figure 12E:
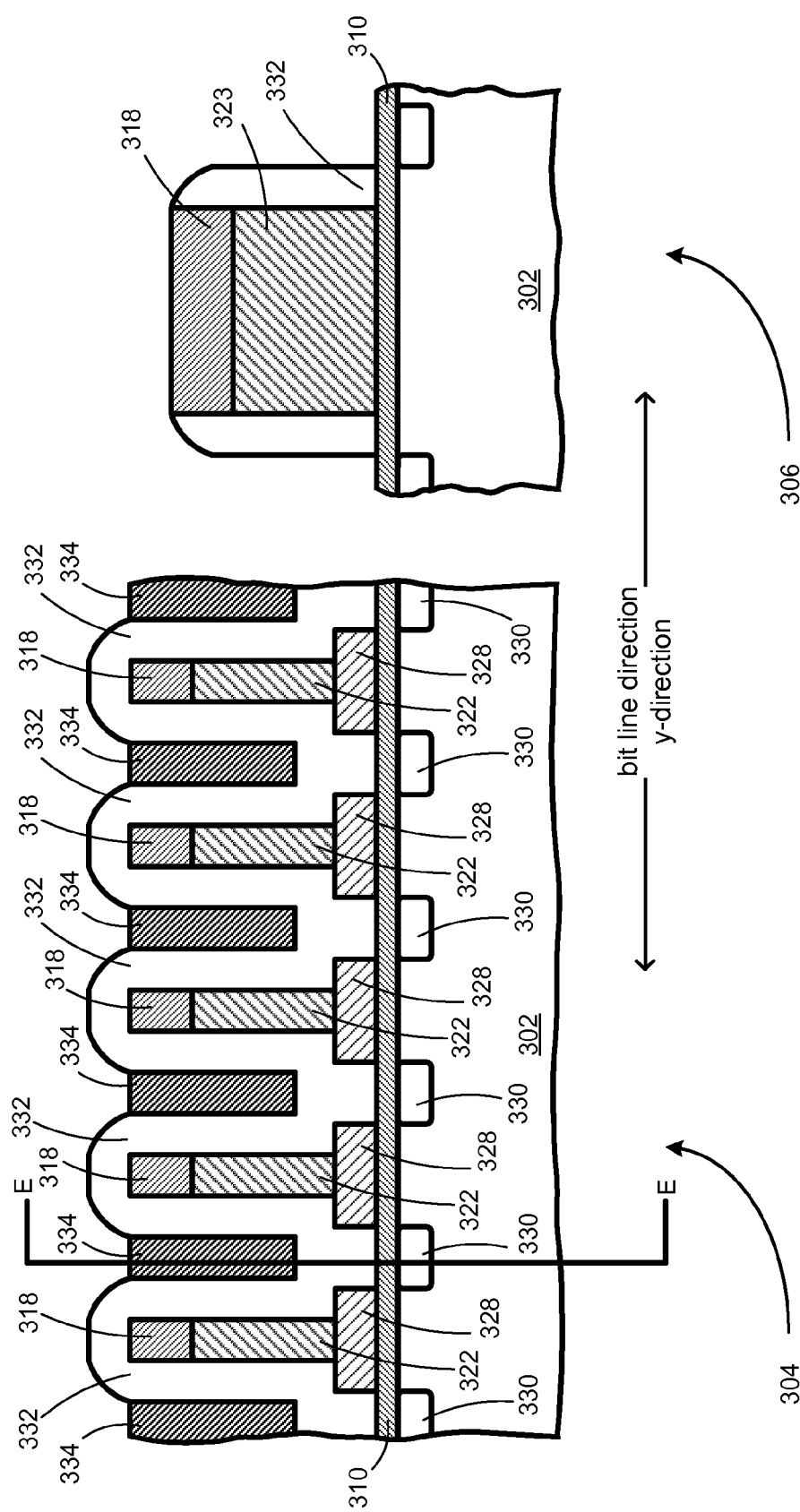

FIG. 12E depicts the memory after using a selective etch process to remove the spacers. Ion implantation is used to define source/drain regions 330, followed by depositing an intermediate dielectric layer 332. A control gate layer is then deposited and etched to form the control gates 334 of the storage elements. In this embodiment, the endpoint region can be masked when forming the intermediate dielectric and control gates.

Figure 13:
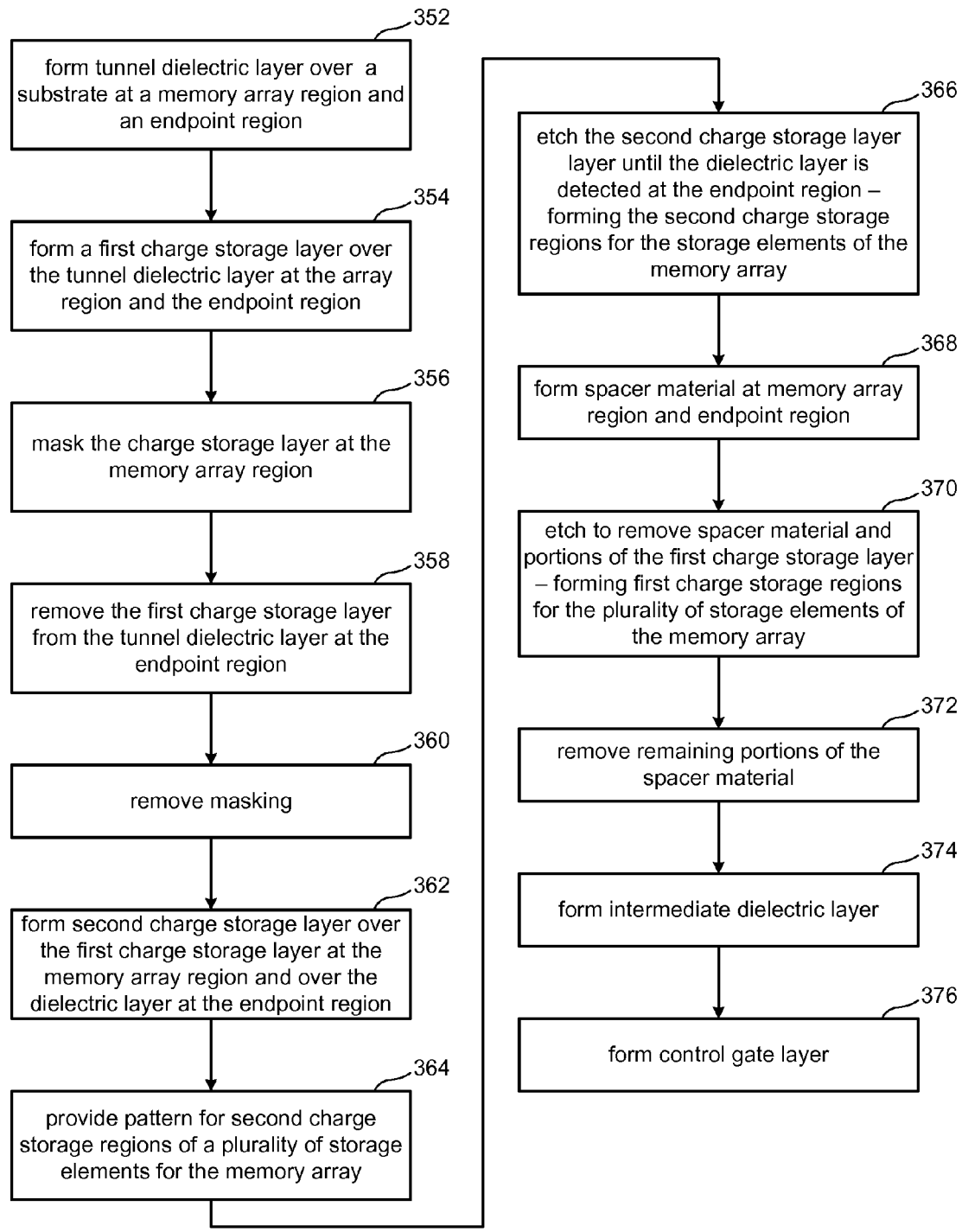
FIG. 13 is a flowchart describing a method of fabricating non-volatile flash memory in accordance with one embodiment that includes endpoint patterning to regulate etching of a charge storage layer.

FIG. 13 is a flowchart describing a method of fabricating non-volatile memory in accordance with one embodiment, highlighting the formation of composite charge storage structures for the storage elements using enhanced endpoint detection. A tunnel dielectric layer such as silicon dioxide is formed at step 352. The dielectric layer is formed over a first portion of a substrate that is to become a memory array region and at a second portion of the substrate that is to become an endpoint region for the memory array. The endpoint region may correspond to a scribe line area, peripheral transistor area, etc. A first charge storage layer is formed over the tunnel dielectric layer at both the memory array region and the endpoint region of the substrate at step 354. A mask is applied over the first charge storage layer at the memory array region at step 356, leaving the first charge storage layer exposed at the endpoint region. After masking the memory array region, the first charge storage layer is removed at the endpoint region by etching at step 358. The masking is removed from the memory array region at step 360.

At step 362, a second charge storage layer is formed over the first charge storage layer at the memory array region and over the dielectric layer at the endpoint region. The memory array region is patterned at step 364 for etching the second charge storage regions for a plurality of storage elements of the memory array. The pattern can be applied by conventional photolithography, nano-imprint patterning, or using spacer-assisted patterning to achieve feature sizes below that of the minimum lithographically resolvable feature site in one embodiment. The endpoint region remains unpatterned as described in FIGS. 11A-11H in one embodiment. In another, the endpoint region can be patterned as described in FIGS. 12A-12E.

The second charge storage layer is etched at step 366 using the pattern to form the second charge storage regions for the storage elements. Etching at step 366 is regulated by monitoring the etching chamber chemistry. When a chemistry consistent with the tunnel dielectric layer is detected, it is determined that etching through the second charge storage layer is complete. The etching can be stopped based on a detectable indication of the tunnel dielectric layer at the endpoint region. Because the first charge storage layer was removed from the endpoint region, the etch process reaches the tunnel dielectric layer at the endpoint region at about the same time that the etch process reaches the first charge storage layer at the memory array region. In this manner, etching can be controlled to avoid over-etching or under-etching the second charge storage layer, as may occur if a time-based method of etching is employed. When the tunnel dielectric layer is detected, etching can be stopped based on the initial detection or etching can continue for some pre-determined period after initial detection.

At step 368, a spacer material is deposited at the memory array region and endpoint region of the substrate. The spacer material is formed on exposed portions of the first charge storage layer and along the sidewalls of the stem charge storage regions. At step 370, the spacer material is etched to form spacers and to expose portions of the first charge storage layer at positions between spacers adjacent in the bit line direction. After etching the spacer material, the first charge storage layer is etched at the exposed portions to form the first charge storage regions for each storage element. The remaining spacer material is removed at step 372. An intermediate dielectric layer is formed at step 374. ONO is deposited on the exposed upper surfaces of the tunnel dielectric layer, the first charge storage layer, and the hardmask in one embodiment. The ONO is also deposited along the sidewalls of the second charge storage regions. A control gate layer is deposited and etched at step 376 to form the control gates for the storage elements.

FIGS. 14A-14H describe a fabrication process according to an embodiment that utilizes an etch-stop material to regulate etching for the charge storage structures. A small portion of a larger memory array is depicted at various steps of the fabrication process. Orthogonal cross-sectional views through a portion of a string or column of storage elements are depicted in FIGS. 14A-14H, taken along a line such as line A-A of FIG. 6. The fabricated storage elements include a composite charge storage structure having first and second charge storage regions, as well as a dual-control gate structure. The described process is also suitable for other types of storage elements, such as those including a single control gate for each storage element.

With reference to FIG. 14A, one or more wells are typically formed in substrate 402 by implanting and associated annealing prior to forming a tunnel dielectric layer 410 over the substrate. A first charge storage layer 412 is formed over the tunnel dielectric layer 410. The first charge storage layer can be doped polysilicon, a metal, undoped polysilicon, a dielectric charge storage material, or other suitable material. Different thicknesses of the first polysilicon layer can be used. For example, the first polysilicon layer is between about 50 nm and 200 nm in one embodiment.

An etch stop layer 414 used in etching the charge storage structures is formed over the first charge storage layer. The material composition of the etch stop layer 414 can vary by embodiment. Generally the material is selected based on its chemical selectivity with respect to the material that is used for the second charge storage layer. Various metals, oxides, and nitrides can be used as etch stop layers based on the composition of the second charge storage layer. In one embodiment that includes a polysilicon second charge storage layer, the etch stop layer can include a metal such as titanium nitride (TiN). A chemically selective etch process for polysilicon can be used so that etching the second charge storage layer is well-regulated to control etching and avoid damage, etc. to the first charge storage layer.

FIG. 14B depicts the memory array after forming a pattern 416 over etch stop layer 414. The pattern can include a mask comprising strips of photoresist formed over a bottom anti-reflective coating (BARC) and/or a hard masking layer in one embodiment. The pattern extends in the x-direction with a repeating y-direction pattern. The line size and space size in the y-direction are defined at the minimum lithographically resolvable feature size in one embodiment, although different line and space sizes can be used. Additional spacer or nano-imprint technologies can also be used in forming pattern 416.

The etch stop layer 414 and first charge storage layer 412 are etched using the pattern to form the stacks shown in FIG. 14C. Each stack includes a portion of the first charge storage layer 412 forming a first charge storage region 418 and an overlying portion of the etch stop layer 414. The first charge storage layer is divided in the y-direction by the etch to form the first charge storage regions 418.

After removing the pattern, a second charge storage layer 422 is formed over the substrate as shown in FIG. 14D The second charge storage layer is formed over the exposed portions of the tunnel dielectric layer 410 between adjacent first charge storage regions 418 and over the upper surface of etch stop layer 414 at the top of each stack. The second charge storage layer can include doped polysilicon, undoped polysilicon, a dielectric charge storage material, etc. The second charge storage layer 422 is not necessarily the same material as first charge storage layer 412, although it can be.

A thin pad of silicon dioxide 424 is formed over the second charge storage layer 422. In one embodiment, silicon dioxide is deposited to about 40 nm to form a thin pad of high temperature oxide (HTO). Other materials and thicknesses can be used in other implementations. An optional assist layer 426 is formed over pad layer 424 to assist in subsequent spacer formation processes. Different materials can be used for the assist layer based on the type of spacer material. A buffer layer is deposited, patterned and etched to form a plurality of buffer features 428 over the assist layer. The buffer layer is an oxide in one embodiment.

In one embodiment, a first sidewall of each buffer feature 428 is aligned with a first plane including directions parallel to the x-direction and vertical to the substrate. The first plane intersects the upper surface of a corresponding first charge storage region for a first storage element. The intersection is at a position that is offset from the middle of the upper surface in the y-direction. In one embodiment, the offset is substantially equal to half of the expected width of a spacer to be formed on the sidewall of the buffer feature. A second sidewall of each feature is aligned with a second plane extending in the x-direction and a direction vertical to the substrate. The second plane intersects the upper surface of a corresponding first charge storage region for a second storage element. The second storage element is adjacent to the first charge storage element in the y-direction. The second plane intersects the upper surface of the first charge storage region at a position that is offset from the middle of the upper surface in the y-direction in one embodiment. The offset is substantially equal to half of the expected width of a spacer to be formed on the second sidewall of the buffer feature in one example.

Spacers 430 are formed along the sidewalls of the buffer features 428 as shown in FIG. 14E. In one embodiment, the spacers include a layer of polysilicon that is deposited using conformal processes and then etched back. After forming the spacers, the oxide features 428 are removed as shown in FIG. 14F. A wet chemical etch can be used in one embodiment to selectively strip the oxide layer from the assist layer. The undoped polysilicon assist layer 426 provides a stable base for the polysilicon spacers after removal of the buffer features. The material composition of layer 426 is chosen to provide adequate adhesion for these thinly formed spacers. A matched material composition for the spacers and assist layer facilitates adhesion between the spacers and underlying layer. In one embodiment, similar but not the same materials are used. Providing adequate adhesion between the spacers and underlying layer is of increased importance as the spacers are fabricated with thinner dimensions and increased aspect ratios. Using similar materials for the spacers and intervening layer can also help with stresses between the different films. If layers of different materials are used, the different materials may have different coefficients of thermal expansion causing stress at the interface of the different materials. When the same or similar materials are used, matching thermal coefficients can decrease stresses at the material interfaces. More details regarding the use of an assist layer 426 can be found in U.S. patent application Ser. No. 11/623,314, entitled "Method Of Forming Spacer Patterns Using Assist Layer for High Density Semiconductor Devices," by Pham, et al., filed Jan. 15, 2007.

The spacers 430 are used as a mask for etching second charge storage regions from the second charge storage layer. A combinational etch process can be used to etch the different layers. In one embodiment, a chemically non-selective etch is used to remove the portions of polysilicon layer 426 and the oxide pad layer 424 between the spacers 430. The non-selective etch will also remove a portion of the polysilicon spacers. After etching through the oxide pad layer 424, selective etching for polysilicon can be used to etch through the second polysilicon layer 422.

The etch stop layer 414 is used to regulate etching of the second charge storage layer. When the first and second charge storage layers are similar materials (e.g., polysilicon), chemically selective etch processes may not be suitable. The disclosed embodiment uses the intervening etch stop layer 414 to facilitate precise etching of the second charge storage layer while protecting the first charge storage layer from over-etching. Etching that is selective to polysilicon can be used. The chemical selectivity of the etch process enables etching to naturally stop when the intervening etch stop layer 414 is reached. In contrast to time-based approaches, using an etch stop layer accommodates variations in feature sizes and chemical properties of the individual layers that can influence the time required for etching in traditional systems.

FIG. 14G depicts the memory array after etching the second charge storage layer to form a plurality of second charge storage regions 432. The individual stacks after the etch include a first charge storage region 418, a portion of the etch stop layer 414, a second charge storage region 432, and a portion of oxide layer 424. Source/drain regions 419 can be formed in the substrate 402 by ion implantation at positions between adjacent first charge storage regions for the charge storage elements. The first charge storage regions can serve as a mask for the ion implementation at the source/drain regions.

After ion implantation, the portions of etch-stop layer 414 that extend beyond the second charge storage regions in the y-direction can be removed as shown in FIG. 14H. In other embodiments, these portions of the etch stop layer 414 are not removed. It is noted that the presence of some etch stop materials may interfere with or damage the subsequently formed intermediate dielectric layer. The intermediate dielectric layer 434 is then deposited and etched. The intermediate dielectric layer is often a multi-layered oxide-nitride-oxide (ONO) but other materials can be used. A control gate layer 436 is then deposited between storage elements adjacent in the y-direction. The control gate layer at least partially fills the area between portions of intermediate dielectric layer 434 adjacent in the y-direction. The control gate layer is polysilicon in one embodiment. The control gate layer can be polished by CMP or anisotropically etched to about the height of the upper surface of oxide pad layer 424.

The embodiment described in FIGS. 14A-14H includes etching the first charge storage layer in the y-direction prior to etching the second charge storage layer in the y-direction. FIGS. 15A-15F describe an embodiment that includes etching the second charge storage layer with the aid of an etch-stop layer prior to etching the first charge storage layer. Orthogonal cross-sectional views through a portion of a string of memory cells are again depicted. FIG. 15A depicts substrate 452 over which a tunnel dielectric layer 460, first charge storage layer 462, and etch stop layer 464 have been formed. Rather than masking and etching to form the first charge storage regions as was described in FIGS. 14B-14C, the second charge storage layer 472 is first formed as shown in FIG. 15B. A thin pad layer 474 of oxide, for example, is formed over the second charge storage layer, followed by an optional assist layer 476. A series of repeating buffer features 478 are formed over the assist layer. Spacers 480 are formed along the sidewalls of the buffer features.

The oxide features are removed to leave the spacers 480 in a repeating y-direction pattern across the substrate. Using the spacers as a mask, the underlying layers are etched as depicted in FIG. 15C. A chemically non-selective etch can first be applied to remove the portions of etch-stop layer 476 and the oxide pad layer 474 between adjacent spacers 480. The non-selective etch also removes at least a portion of the polysilicon spacers. Etching selective to polysilicon is used to etch the second charge storage layer 472 and form the second charge storage regions 482. The etch-stop layer 464 is again used to control etching of the second charge storage layer. If the second charge storage layer is polysilicon and a metal such as TiN is used for the etch stop layer, selective etching for polysilicon will not etch the TiN. Accordingly, the stem portions can accurately be etched, while protecting the underlying first charge storage layer from damage due to overetching. It is noted that other material combinations can be used. For example, the second charge storage layer may include a metal in one embodiment, with the etch stop layer being formed of polysilicon for selective etching of the metal.

After etching the second charge storage layer, the exposed portions of the etch stop layer 464 extending beyond the stems in the y-direction can be removed by a wet etch selective for TiN for example. The exposed portions of the etch stop layer can be left as earlier described in one embodiment. The second charge storage regions are formed over the first charge storage layer in a repeating y-direction pattern. Each second charge storage region has two sidewalls that extend in the x-direction with surfaces in the y-direction. A portion of the oxide pad layer 474 remains at the tip of each second charge storage region. In contrast to the embodiment described in FIGS. 14A-14H, the first charge storage layer 462 is not etched prior to forming the second charge storage regions and forms a continuous layer under the second charge storage regions.

FIGS. 15D-15F describe a series of fabrication steps to form the first charge storage regions for the storage elements after forming the second charge storage regions. A sacrificial layer is deposited over the substrate and etched back to form spacers 490 depicted FIG. 15D. The spacers extend along the sidewalls of the stem charge storage regions in the x-direction. Etching the sacrificial layer also exposes the first charge storage layer 462 at positions between spacers adjacent in the y-direction.

After forming the spacers and exposing the first charge storage layer, a chemically selective etch is used to etch the first charge storage layer with respect to the spacer material. FIG. 15E depicts the memory after etching through the first charge storage layer, resulting in first charge storage regions 468 for each storage element. The spacers 490 provide a mask for etching the first charge storage layer. The charge storage elements can also serve as a mask for source and drain ion implantation to form the source/drain regions 469.

The spacers 490 are removed after ion implantation, followed by formation of an intermediate dielectric layer 484 as depicted in FIG. 15F. The intermediate dielectric layer is often a multi-layered oxide-nitride-oxide (ONO) but other materials can also be used. Conformal processes provide a substantially constant thickness of the intermediate dielectric relative to the upper surface and sidewalls of the charge storage elements. A control gate layer is deposited over the memory array and between charge storage elements to fill the area between adjacent portions of the intermediate dielectric layer 484 in the y-direction. The control gate layer is polysilicon in one embodiment, and is etched or polished by CMP to about the height of the upper surface of oxide layer. The control gate layer is etched to form a plurality of individual control gates 486.

Figure 16:
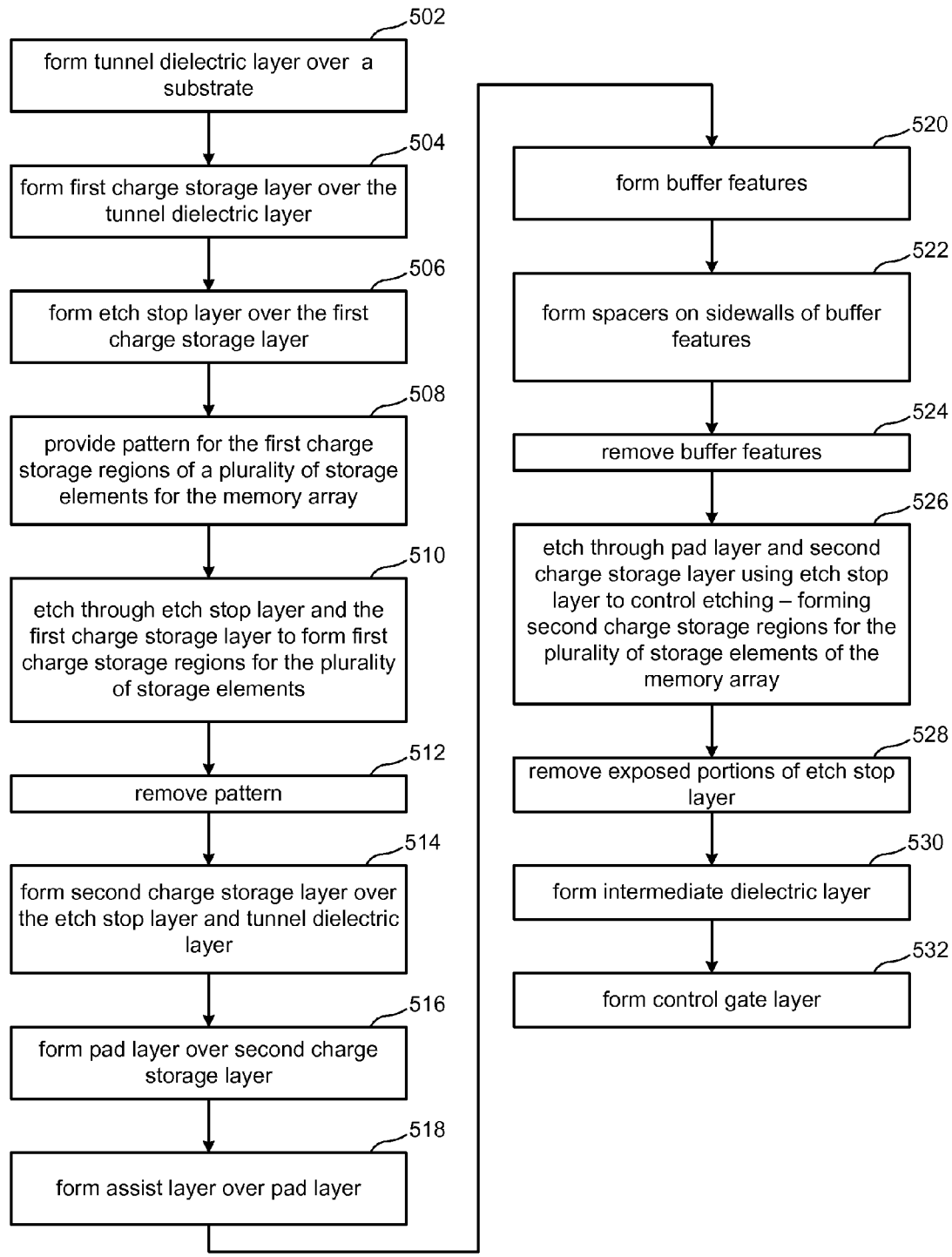
FIG. 16 is flowchart describing a method of fabricating non-volatile flash memory in accordance with one embodiment that includes an etch stop layer to regulate etching of a charge storage layer.

FIG. 16 is a flowchart describing a method of fabricating non-volatile memory in accordance with an embodiment that utilizes an etch-stop layer during charge storage structure formation. The formation of composite charge storage structures including first and second charge storage regions is described. A tunnel dielectric layer is formed over a substrate at step 502, followed by forming a first charge storage layer over the tunnel dielectric layer at step 504. An etch stop layer is formed over the first charge storage layer at step 506. The etch stop layer may be referred to as a floating gate or charge storage structure etch stop layer because of its use in the formation of the charge storage structure. The etch stop layer is formed of a material that can be selectively etched with respect to the second charge storage layer. The etch stop layer is a metal such as TiN deposited by atomic layer deposition (ALD) in one embodiment, but other materials can also be used. A polysilicon second charge storage layer can be selectively etched with respect to the metal. Various oxides or nitrides may also provide selectivity with respect to polysilicon.

At step 508, a mask is applied over the substrate for etching the first charge storage layer. Strips of photoresist extending in the x-direction and separated from one another by lithographically defined spacing in the y-direction can be used in one embodiment. The etch stop layer and first charge storage layer are etched at step 510. Reactive ion etching that is selective to the etch stop layer can be used, followed by reactive ion etching that is selective to polysilicon. Etching the first charge storage layer defines a dimension for the first charge storage regions of the storage elements in the y-direction. After etching, the masking is removed at step 512.

A second charge storage layer is formed at step 514. The second charge layer can be deposited over the exposed portions of the tunnel dielectric layer and the upper surfaces of the etch stop layer. A thin pad layer is formed over the second charge storage layer at step 516, followed by forming an assist layer at step 518. The assist layer will aid the subsequent spacers, but can be omitted in other embodiments.

Buffer features are formed at step 520 for spacer formation. An oxide layer can be deposited and strips of photoresist applied for etching the oxide to define oxide features in a repeating y-direction pattern. The oxide features include an upper surface and two sidewalls that extend in the x-direction, with surfaces facing the y-direction.

Spacers are formed along the sidewalls of the buffer features at step 522. A layer of polysilicon is deposited using conformal processes in one embodiment and etched back to form the spacers. After forming the spacers, the buffer features are removed at step 524, using a chemically selective wet etch in one embodiment. Removal of the buffer features results in the spacers forming a repeating y-direction pattern across the substrate. The spacers are used as a mask for etching the underlying layers at step 526. A non-selective etch can be used to etch through the assist layer and pad layer in one embodiment. A chemically selective etch for polysilicon is used to etch the second charge storage layer. The etch stop layer formed over the first charge storage layer is used at step 526 to control the etch process. Because chemical selectivity may not exist between the first and second charge storage layers, the etch stop layer provides a detectable endpoint for the etch process. A selective etch for polysilicon will not etch or significantly etch the metal etch stop layer.

At step 528, the exposed portions of the etch stop layer extending beyond the sidewalls of the stems in the y-direction are removed. As earlier described, the etch stop layer is not removed in another embodiment. After removing the etch stop layer, an intermediate dielectric layer is formed at step 530, followed by forming the control gates at step 532. Various known backend processes can be used to complete fabrication of the array, including the formation of various vias and contacts.

FIG. 16 describes an embodiment that includes etching the first charge storage regions at step 510 prior to etching the second charge storage regions. In another embodiment as described with respect to FIGS. 15A-15F, the second charge storage layer can be deposited over the etch stop layer and etched prior to etching the underlying first charge storage layer.

As earlier described, there is a continuing demand for larger amounts of memory in smaller packages that is driving a need for smaller memory cell sizes in the memory array. FIGS. 17A through 17I describe a fabrication process according to one embodiment that defines the gate length of a first charge storage region for a storage element using photolithographically defined spacing. Sacrificial features are formed over a substrate in a repeating pattern across the substrate in the y-direction. A layer of charge storage material is then formed in the spaces between features. A reduced gate length in the bit line direction can be achieved by leveraging the pitch size of the process to define the gate length by spacing rather than line size. By using unequal line and space sizes, the disclosed embodiment can produce charge storage regions with gate lengths at dimensions less than the minimum photolithographically resolvable feature size. The sacrificial features are defined using unequal line and space sizing in one embodiment. The line size used in patterning the sacrificial layer can be larger than the minimum feature size of the lithography process. Accordingly, the spacing between the sacrificial features can be made less than the minimum feature size if desired. Additionally, by not executing the lithography process at the smallest available line size, the line-edge-roughness (LER) of features formed from the lithography process will improve. An improved LER for the photoresist patterning will transfer during etching to the features formed from the underlying layers.

FIGS. 17A through 17I are orthogonal cross sectional views through a portion of a string or column of non-volatile storage elements, taken along a line such as line A-A in FIG. 6. The memory cells include composite charge storage structures with first and second charge storage regions. The memory cells also include a dual control gate structure although the disclosed principles may be used in more conventional single control gate structures. Additionally, the disclosed principles are applicable to other memory array structures, such as those including a simple charge storage structure comprised of a single charge storage region.

A tunnel dielectric layer 610 is formed over a substrate 602 as shown in FIG. 17A. A sacrificial layer 604 is formed over the tunnel dielectric layer. The sacrificial layer includes a layer of silicon nitride in one embodiment that is formed using a suitable deposition process. Different materials can also be used for the sacrificial layer. In one embodiment, the sacrificial layer is selected based on its chemical selectivity with respect to the material used for the first charge storage layer.

FIG. 17B depicts the memory array after patterning and etching to form a plurality of sacrificial features 606. A mask 614 including strips of photoresist can be patterned over the nitride layer, followed by etching to form the individual features 606. The features are formed in a repeating pattern in the bit line or y-direction across the substrate with spaces 608 between adjacent features. The nitride features have a length in the y-direction that is defined by the line size of the photoresist pattern. In one embodiment, the length or line size is defined at the minimum resolvable feature size of the photolithography equipment being used. In other embodiments however, the line size is larger to improve the line edge roughness (LER) of the underlying layers. Each feature includes two sidewalls with surfaces in the y-direction that extend across substrate 602 in the x-direction. The spacing between features is smaller than the line size in one embodiment. Unequal line and space sizes at a specified pitch can be used to achieve a spacing at less than the minimum resolvable feature size.

FIG. 17C depicts the array after forming a first charge storage layer in the open areas or spaces 608 between adjacent sacrificial features. A layer of polysilicon is deposited to at least partially fill the spaces in one embodiment. In one embodiment, the polysilicon is deposited in the spaces and over the upper surfaces of the sacrificial features after removing the pattern 614. The polysilicon can be polished to create a substantially flat or planarized surface 627, comprised of interleaving nitride features 606 and first charge storage regions 628. By polishing to at least the height of the sacrificial features, the first charge storage layer is divided in the y-direction into the individual charge storage regions 628. The dimension of each first charge storage region 628 in the y-direction is determined by the previously defined space size used in etching layer 604 to form the sacrificial features 606. The dimension of each charge storage region in the y-direction corresponds to the gate length of the charge storage structure for the memory cell.

FIG. 17D depicts the array after stripping the sacrificial features 606. A wet chemical etch or another suitable process can be used. The etch leaves individual first charge storage regions 628 in a repeating pattern over the tunnel dielectric region 610 in the y-direction. The spacing between each region is equal to the line size used to define the photoresist pattern 614.

After stripping the sacrificial features, a second charge storage layer 616 is formed as shown in FIG. 17E. A layer of polysilicon 616 is deposited in one embodiment to a depth of about 70 nm. An optional pad or high temperature oxide layer 618 is deposited over the second charge storage layer. An optional assist layer 620 is then formed over the pad layer in one embodiment. A plurality of buffer features 622 are formed over the assist layer. Buffer oxide features are formed in one embodiment by depositing and etching a layer of oxide.

The alignment of the second charge storage regions with respect to the first charge storage regions 628 is defined using the buffer features in one embodiment. A first sidewall of each feature 622 is aligned with one first charge storage region 628 and a second sidewall is aligned with a different first charge storage region 628 as earlier described.

FIG. 17F depicts the memory array after forming spacers 624 along the first and second sidewalls of each of the buffer features 622. In one embodiment, a layer of polysilicon is deposited to a depth of about 15 nanometers and etched back to form the individual spacers 624. After forming the spacers, the oxide features 622 are stripped as shown in FIG. 17G. A chemical wet etch or another suitable process can be used.

In one exemplary embodiment, a 30 nanometer gate length is created for the first charge storage regions 628 using line and space sizes of 56 nanometers and 30 nanometers, respectively (86 nanometer pitch). The buffer oxide features can be formed with a line and space sizes of 45 nanometers and 75 nanometers (120 nanometer pitch). This will form the first sidewall of each oxide feature at an offset from the middle of a first charge storage region and a second sidewall at an offset from the middle of a second first charge storage region, as FIG. 17G illustrates.

A series of etch processes are used to define the second charge storage regions for the storage elements. Non-selective etching is used in one embodiment to etch through assist layer 620 and the pad layer 618. A portion of the spacers will be removed by the non-selective etch. Other processes such as selective etching can also be used.

Figure 17H:
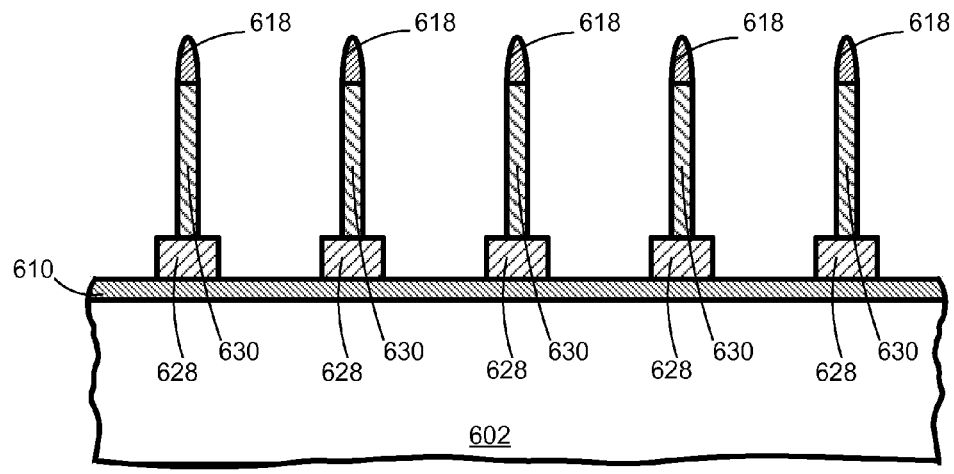

Selective etching is used to complete etching through the second charge storage layer 616, resulting in the second charge storage regions depicted in FIG. 17H. Individual second charge storage regions 630 are formed from the second layer. Together, a second 630 and a first 628 charge storage region form a single charge storage structure for a storage element. A portion of the oxide layer remains over the upper surface of each stack formed from the etching. Controlled etching is used in one embodiment when forming the second charge storage regions. A metal etch stop can be applied over the first charge storage layer as earlier described to stop the etch process. An endpoint patterning technique as earlier described can also be used. Portions of the oxide layer 618 remain at the upper surface of each stack of the second charge storage region layer.

Figure 17I:
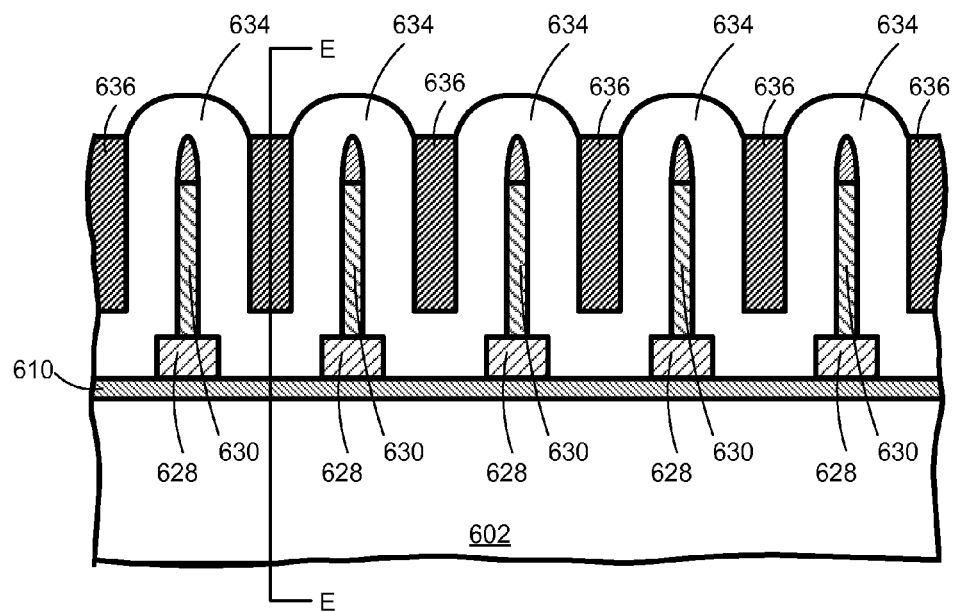

FIG. 17I depicts the array after forming the control gates for the storage elements. An intermediate dielectric layer 634 such as ONO is formed around the charge storage structures. Conformal deposition processes can be used to deposit one or more layers over the tunnel dielectric at the open areas between adjacent first charge storage regions 628. The dielectric is formed along the sidewalls of the second charge storage regions 630 and over the upper surface of each stack. Control gates 636 are formed between adjacent portions of the intermediate dielectric. A layer of polysilicon or other conductor is deposited and etched to form the individual control gates.

Figure 18:
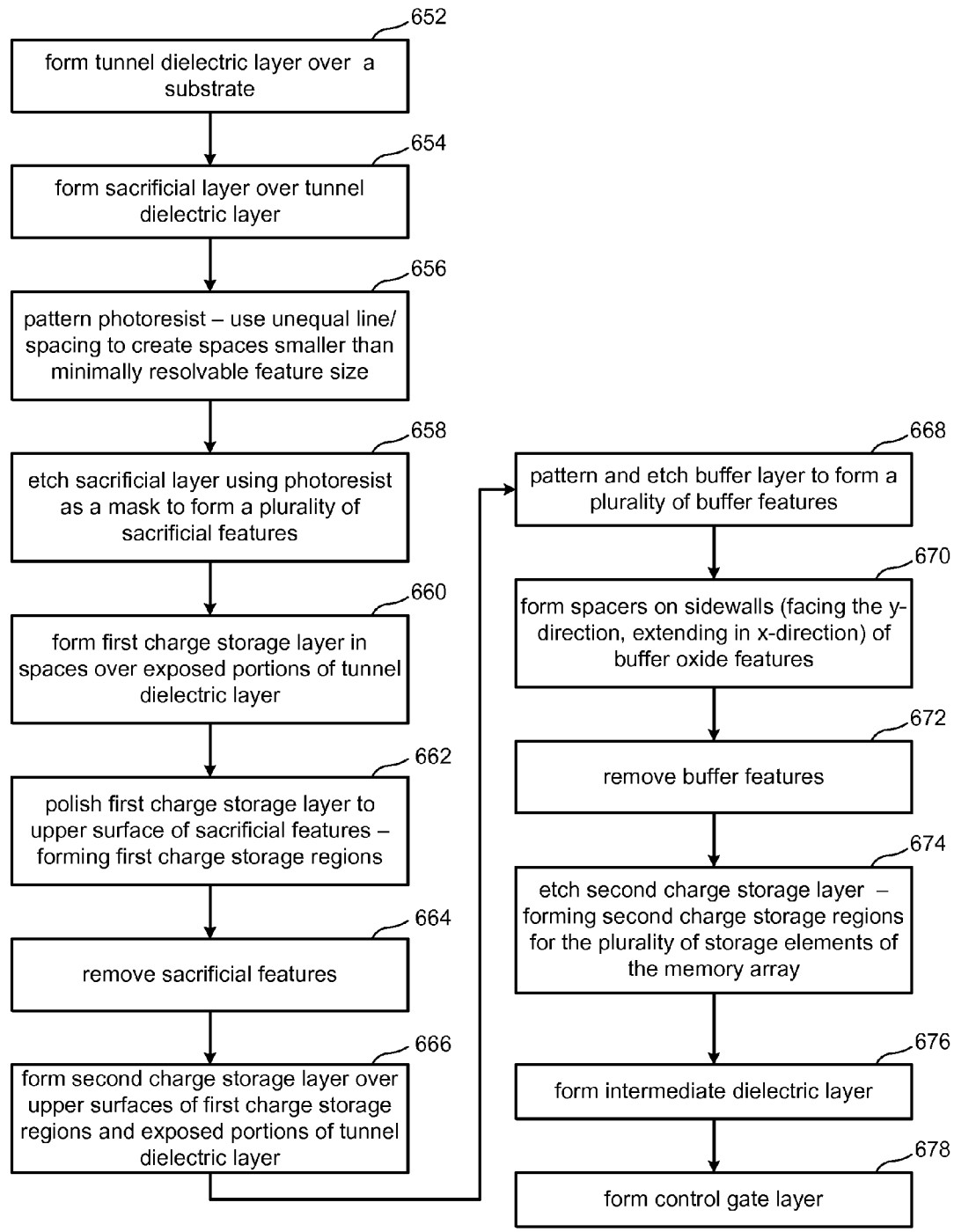
FIG. 18 is a flowchart describing a method of fabricating non-volatile flash memory in accordance with one embodiment that includes space-defined charge storage region.

FIG. 18 is a flow chart describing a method for non-volatile memory fabrication in one embodiment, including the formation of a region of a charge storage structure using a lithographically space-defined gate length. A tunnel dielectric layer is formed over a substrate at step 652, followed by forming a sacrificial layer (e.g., silicon nitride) at step 654. Strips of photoresist extending in an x-direction and spaced apart in the y-direction are applied as a pattern over the nitride layer at step 656. The photoresist is applied with an unequal line and space size in one embodiment. The line size, corresponding to the length of individual strips of photoresist in the y-direction, is larger than the spacing between adjacent strips. At a given lithographically-defined pitch size, unequal line and space sizes can be used for space sizes at less than the minimally resolvable feature size, as defined by half of the pitch of the process.

At step 658, the sacrificial layer is etched to form a plurality of sacrificial features over the tunnel dielectric layer using the photoresist as a mask. The sacrificial features have a length in the bit line direction corresponding to the line size used at step 656. The spacing between features corresponds to the space size of the pattern applied at step 656. At step 660, a first charge storage layer is deposited in the spaces between adjacent sacrificial features. At step 662 the photoresist masking is removed and the first charge storage layer polished to about the upper surface of the sacrificial features. Individual regions of the first charge storage layer are formed that extend in the x-direction and are spaced apart in the y-direction by the sacrificial features. At step 664 the nitride features are removed.

A second charge storage layer is formed over the upper surfaces of the first charge storage regions and the exposed portions of the tunnel dielectric layer at step 666. A layer of polysilicon is deposited in one embodiment. A buffer layer is patterned and etched to form a plurality of buffer features at step 668. Prior to forming the buffer features, a pad layer and assist layer are formed in one embodiment. The buffer features include substantially vertical sidewalls that extend in the x-direction across the substrate. The sidewalls of each feature can be aligned over the upper surfaces of two adjacent first charge storage regions as earlier described. Spacers are formed along the two sidewalls of each buffer feature at step 678. The spacers are formed along the sidewalls of the buffer features, extending in the x-direction across the substrate. By offsetting the sidewalls of the buffer features from the middle of the first charge storage regions with respect to the y-direction, each spacer is substantially aligned in the y-direction with one of the first charge regions. At step 672, the buffer features are stripped, leaving the spacers in a repeating y-direction pattern across the substrate. Selective etching is used to etch the second charge storage layer at step 674. Second charge storage regions are formed that are substantially aligned in the y-direction with a corresponding first charge storage region. The spacers provide a pattern for etching, defining the length of the second charge storage regions in the y-direction. An intermediate dielectric layer is formed at step 676. At step 678, a control gate layer is formed over the intermediate dielectric layer and etched to form a plurality of control gates for the memory array.

The above processes depict the formation of a portion of a column of memory cells. In most commercial memory arrays, however, multiple columns of memory cells are formed in and across the substrate, with electrical isolation provided between adjacent active areas. The formation of multiple columns of memory cells is typically performed simultaneously.

Various options are available for forming isolation between adjacent active areas in NAND array architectures. In one embodiment, isolation trenches are formed in the substrate prior to any masking steps used for etching the charge storage structures of the storage elements. For example, isolation trenches can be formed after depositing the second charge storage layer as shown in FIG. 11D, FIG. 12A, or FIG. 15B, but prior to patterning and etching the second charge storage layer or patterning and etching the first charge storage layer. As part of forming the isolation trenches prior to any patterning or etching steps for the charge storage structures, the second charge storage layer will be etched into strips that extend in the bit line or y-direction. The first charge storage layer is also etched into strips that extend in the bit line direction or y-direction. The etching for charge storage structure formation depicted in FIGS. 11A, 11G, FIGS. 12A,12D, and FIGS. 15C, 15E will simultaneously form first and second charge storage regions for multiple columns of memory cells as is shown for one column.

Isolation trenches may also be formed after patterning and etching the first charge storage layer, but prior to patterning and etching the second charge storage layer. For example, isolation trenches can be formed after etching the first charge storage layer and depositing the second charge storage layer as shown in FIG. 14D, but before patterning and etching the second charge storage layer to form the second charge storage regions. Similarly, isolation trenches can be formed after forming the first charge storage layer between sacrificial features and depositing the second charge storage layer as shown in FIG. 17E, but prior to patterning and etching the second charge storage layer.

In embodiments as shown in FIGS. 14A-14H or FIGS. 17A-17I, the first charge storage layer is formed into strips or rows that extend across the substrate in the x-direction before forming the isolation trenches. The etching shown in FIG. 14C or deposition and polishing shown in FIG. 17C will form rows of the first charge storage layer. As part of forming the isolation trenches, the rows of the first charge storage layer are etched into the individual first charge storage regions to form columns of memory cells. Also as part of forming the isolation trenches, the second charge storage layer is etched into strips or columns that extend in the bit line or y-direction. These strips of the second charge storage layer are then etched to form the second charge storage regions as was described with respect to FIG. 14G or 17H. The etching will form the second charge storage regions for multiple columns of cells from the strips of the second charge storage layer.

Another active area isolation technique includes forming isolation trenches after patterning and etching the first and second charge storage layers as has been described. For example, trenches can be formed between the already patterned and etched active areas after the control gates have been formed. The first charge storage layer is etched or deposited to form continuous rows of the first charge storage layer with a dimension in the y-direction. The second charge storage layer is etched to form continuous rows of the second charge storage layer with a dimension in the y-direction. These steps correspond to the fabrication as has already been described to define the dimensions of the first and second charge storage regions in the y-direction. The rows of the first charge storage regions and the rows of the second charge storage regions are then etched to define their dimensions in the x-direction while forming isolation areas therebetween. This additional etching subdivides the rows to form columns of the completed charge storage structures.

One technique for forming isolation between adjacent active areas after forming rows of the first charge storage layer and rows of the second charge storage layer is described in FIGS. 19A-19H. Orthogonal cross-sectional views through a portion of a single row of memory cells are depicted. For example, the views correspond to the view taken along a line such as line E-E shown in FIG. 11H, FIG. 12E, FIG. 14H, FIG. 15F and FIG. 17I. At the point of fabrication depicted in FIG. 19A, the first and second charge storage layers have been patterned and etched to define the dimensions of the charge storage structures in the y-direction, including the first and second charge storage region dimensions in the y-direction. A tunnel dielectric layer 710 has been formed over the substrate 702, followed by an intermediate dielectric layer 734 and control gate layer 736. The processing of these layers may be accomplished as described through step 376 of FIG. 13, step 532 of FIG. 16, or step 678 of FIG. 18, for example.

FIG. 19B depicts the memory after forming a hardmask layer 750 (e.g., SiN). A sacrificial layer (e.g., SiO2) is then deposited, patterned and etched to form a repeating pattern in the x-direction of sacrificial features 752. A spacer layer (e.g., polysilicon) is deposited and etched to form a plurality of spacers 754. The spacers have surfaces in the x-direction and extend across the substrate in the y-direction along the sidewalls of the sacrificial features. The sacrificial features are then removed, leaving the spacers over the hardmask as shown in FIG. 19C. The hardmask 750, control gate layer 734, intermediate dielectric layer 732, and tunnel dielectric layer 710 are etched to form the active area stacks shown in FIG. 19D, each extending over the substrate in the y-direction. The substrate 702 is also etched to form a plurality of trenches 758 in the substrate at positions between active area stacks that are adjacent in the x-direction. The trenches are filled with an insulating layer 760, such as silicon dioxide for example, as shown in FIG. 19E. Any excess silicon dioxide is polished to about the top of control gate layer 736.

Because etching the isolation trenches subdivides the previously formed control gates so that they are no longer continuous in the x-direction, additional processing steps can be applied to connect the individual control gates in a row of memory cells to create continuous word lines for the memory array.

FIG. 19F again shows a cross-sectional view through a portion of a column of the memory cells, taken along line F-F of FIG. 19E after forming the isolation trenches. As illustrated, the isolation area formation has divided the rows of charge storage elements into multiple columns of cells such that the view in FIG. 19F is the same as that in FIG. 17I, etc. FIG. 19G depicts the memory from this view after forming a deep insulating layer 770 (e.g., SiO2). An optional assist layer 772 (e.g., polysilicon) is formed over the insulating layer, followed by a hardmask layer which is patterned using photoresist to form a plurality of buffer features 774 spaced apart in the y-direction. FIG. 19H depicts the memory after depositing and etching a spacer layer to form spacers 776 that extend in the x-direction along the sidewalls of the buffer features 774.

The buffer features 774 are removed and an insulating layer 780 (e.g., oxide) is formed in the spaces between adjacent spacers 776. The insulating layer is planarized by CMP as shown in FIG. 19I. Etching is performed using a process selective to polysilicon to etch the remaining spacer material 776 and assist layer 772. Another etch process is performed to etch the insulating layer until control gates 736 are reached.

FIG. 19J depicts the substrate after etching to the control gates. Trenches 782 are formed in the insulating layer to about the depth of the top of the control gate layer. The trenches run the length of a row of memory cells in the x-direction, typically the size of a block for the array. The trenches 782 are filled with a conductive material 784 to interconnect the control gates of the corresponding row of storage elements. FIG. 19K depicts the substrate after filling the trenches with the control gate connecting layer 784. The connections between control gates of the rows of memory cells form the word lines for the memory array.

Figure 20A:
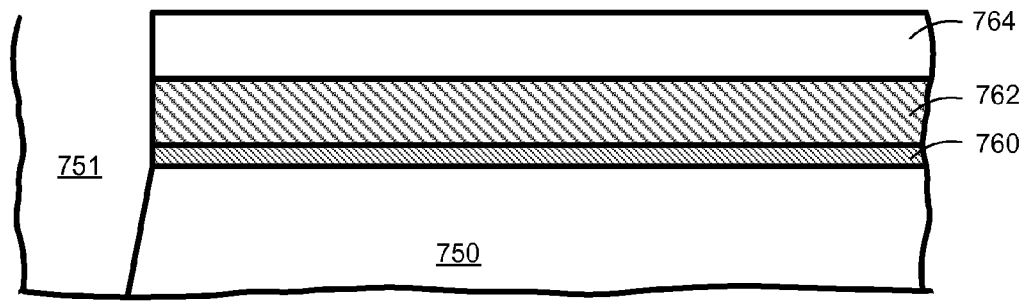
FIGS. 20A-20C are orthogonal cross-sectional views in the word line direction through a portion of a memory array depicting the creation of an unintentional short between adjacent charge storage structures.
Figure 20B:
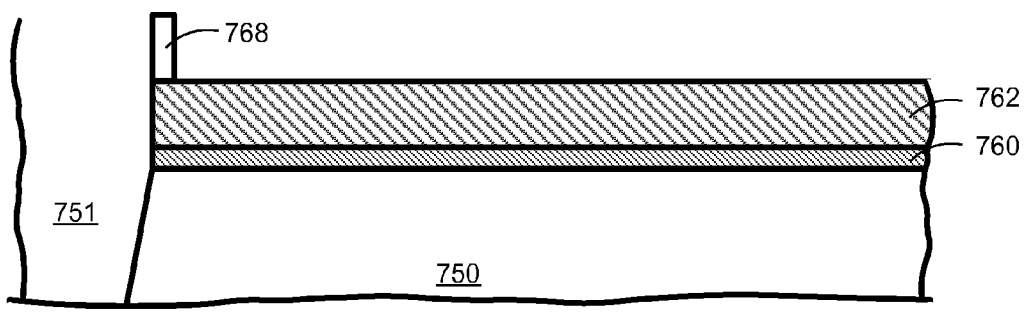
Figure 20C:
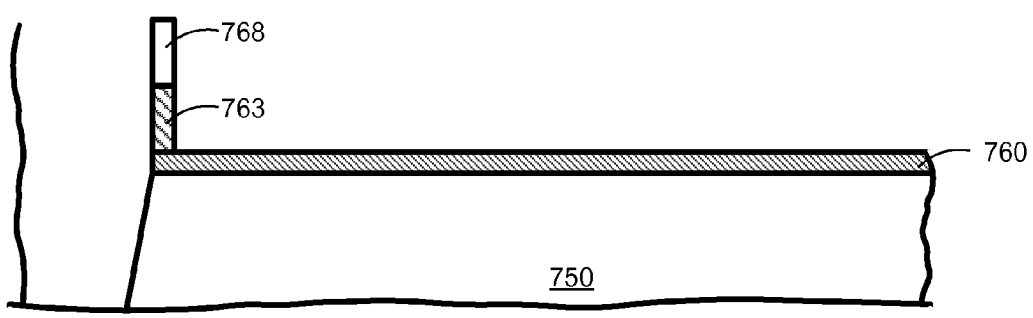

As earlier described, isolation between adjacent active areas can also be performed prior to completing the patterning and etching for all charge storage layers. Inadvertent shorts between adjacent charge storage structures of different storage elements are possible when isolation is provided prior to defining the dimensions of the charge storage structures in the column direction. FIGS. 20A-20C are orthogonal cross-sectional views taken along a line in the word line direction through a portion of a memory array. For instance, the view in FIG. 20A can correspond to the view taken along line D-D in FIG. 11F. An exemplary situation is described to show the unintentional creation of a short between adjacent charge storage structures. In this example, the isolation trenches are formed prior to etching the second charge storage layer to form second charge storage regions for the storage elements.

A tunnel dielectric layer 760, first charge storage layer 762, and spacer layer 764 have been formed over substrate 750. An isolation trench 751 has been formed adjacent to these layers for isolating adjacent active areas in the x-direction. As shown in FIG. 11F, the spacer layer is deposited and etched to form spacers along the second charge storage regions. When etching the spacer layer as shown in FIG. 11G, it is possible that a small portion of the spacer may not be removed. FIG. 20B illustrates a small portion 768 of spacer layer 764 remaining after etching. In one embodiment, the trenches can be filled with an oxide and a nitride used for spacer layer 764. A portion of this nitride may stick to the oxide and not be fully removed during spacer formation.

FIG. 20C depicts the memory array after etching the first charge storage layer using the spacers as a mask. The portion of the nitride left from the previous etching overlies a portion of the first charge storage layer 762. The nitride masks this portion of the first charge storage layer, preventing it from being etched. The small portion 763 (stringer) may connect one or more of the first charge storage regions that are adjacent in the bit line direction. For example, the stringer 763 may run the full length of a bit line or a single NAND string in the y-direction, causing a short between every storage element in the bit line direction or every storage element in the string.

In one embodiment, isolation is provided prior to completing patterning and etching of the charge storage layers (to define dimensions in the y-direction) in a manner that can reduce or eliminate the occurrence of unintentional shorts between charge storage structures. One aspect of the process includes forming isolation trenches after patterning and/or etching to define the dimension of the first charge storage regions for each charge storage structure, but prior to patterning and etching the second charge storage layer to define the dimension of the second charge storage regions in the y-direction. Another aspect of the process includes the use of sacrificial features between adjacent first charge storage regions.

FIGS. 21A through 21D are orthogonal cross-sectional views through a portion of a string of memory cells, taken along a line such as line A-A of FIG. 6, depicting the memory array in the bit line direction. FIG. 21A depicts the memory array after forming tunnel dielectric layer 810, first charge storage layer 812 and sacrificial layer 814 over substrate 802. FIG. 21B depicts the memory after providing a pattern including strips of photoresist 816 that are formed in a repeating pattern over the substrate in the bit line direction. The underlying sacrificial layer is etched using the photoresist as a pattern, forming strips or rows 828 of the first charge storage layer that extend in the x-direction.

FIG. 21C depicts the memory array after removing the pattern 816 and the remaining portions of sacrificial layer 814. A second sacrificial layer is deposited in between adjacent rows 828 of the first charge storage layer. Sacrificial layer 818 can vary, but is generally selected to provide insulation in the bit line direction between adjacent strips of the first charge storage layer. The sacrificial layer 818 is polished using CMP as shown in FIG. 21D. Polishing results in a planarized surface comprised of interleaving strips or rows of the first charge storage layer and sacrificial layer as shown in FIG. 21D.

FIG. 21E is an orthogonal cross-sectional view taken along line G-G of FIG. 21D, depicting a set of processing steps that are used to define the isolation trenches between adjacent active areas in the word line direction. Tunnel dielectric layer 810 and one strip 828 of the first charge storage layer 812 are shown over substrate 802.

A second charge storage layer 880 is formed over the first charge storage layer, followed by a pad layer 822 (e.g., oxide), sacrificial layer 824 (e.g., nitride), oxide layer 826, assist layer 830, and a plurality of buffer features 832 (e.g., oxide). The buffer features are formed into strips that are spaced apart in the x-direction. The oxide features have sidewalls that extend in the y-direction. Spacers 834 are formed along the sidewalls. After forming the spacers 834, the oxide features 832 are removed using a chemical wet etch or other suitable process as shown in FIG. 21F.

Figure 21G:
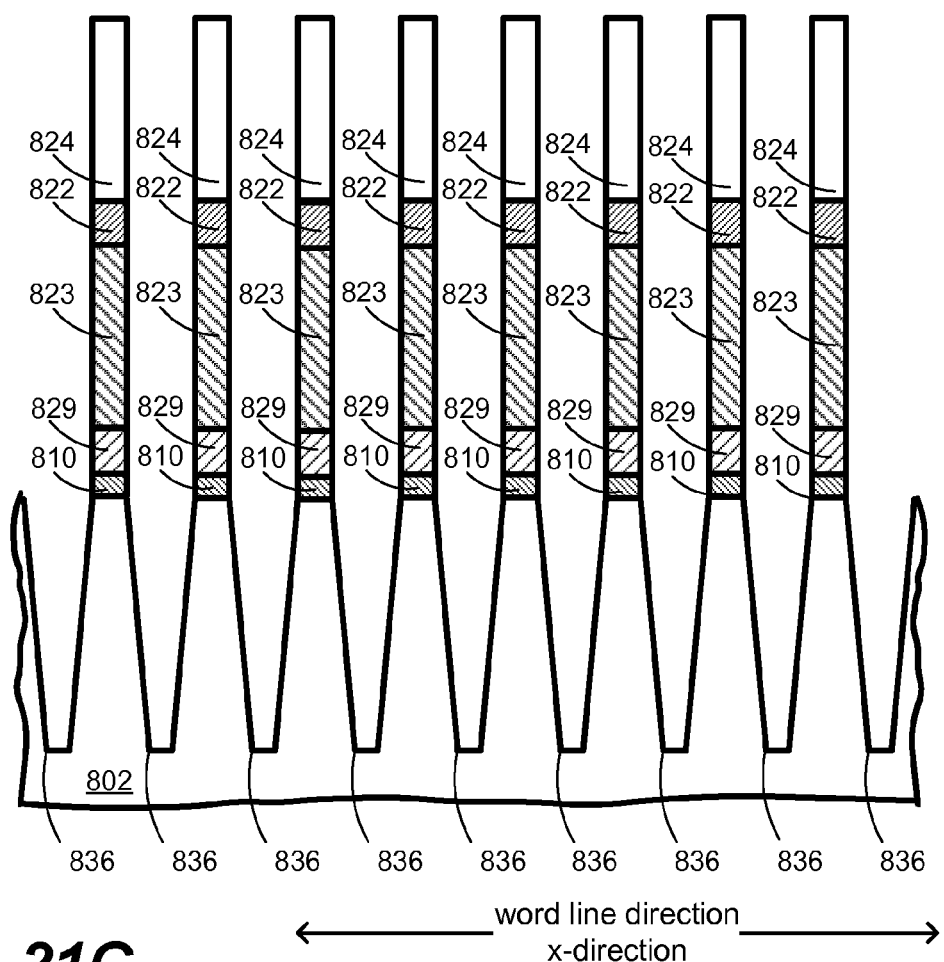

With reference to FIG. 21G, non-selective etching is used to etch through layers 830 and 826, also removing a portion of the spacers. A selective polysilicon etch is used to etch the first and second charge storage layers, followed by etching the tunnel dielectric layer and substrate. Etching forms a plurality of active area stacks that extend across substrate 802 in the bit line direction. Each stack includes a strip 823 of the second charge storage layer resulting from the etching. Etching also forms trenches 836 between stacks adjacent in the word line direction. In one embodiment the trenches are formed to a depth of about 2000 nm although various depths can be used.

Recall that the first charge storage layer 812 is etched to define the dimension of the first charge storage regions in the bit line direction, as depicted in FIGS. 21A-21D, prior to forming the isolation trenches. That etching results in the rows or strips 828 of the first charge storage layer that extend in the word line direction. Etching to define the isolation regions between adjacent active areas in the word line direction as depicted in FIGS. 21E-21G results in the strips 828 being subdivided into individual first charge storage regions 829, forming multiple columns of first charge storage regions.

Figure 21H:
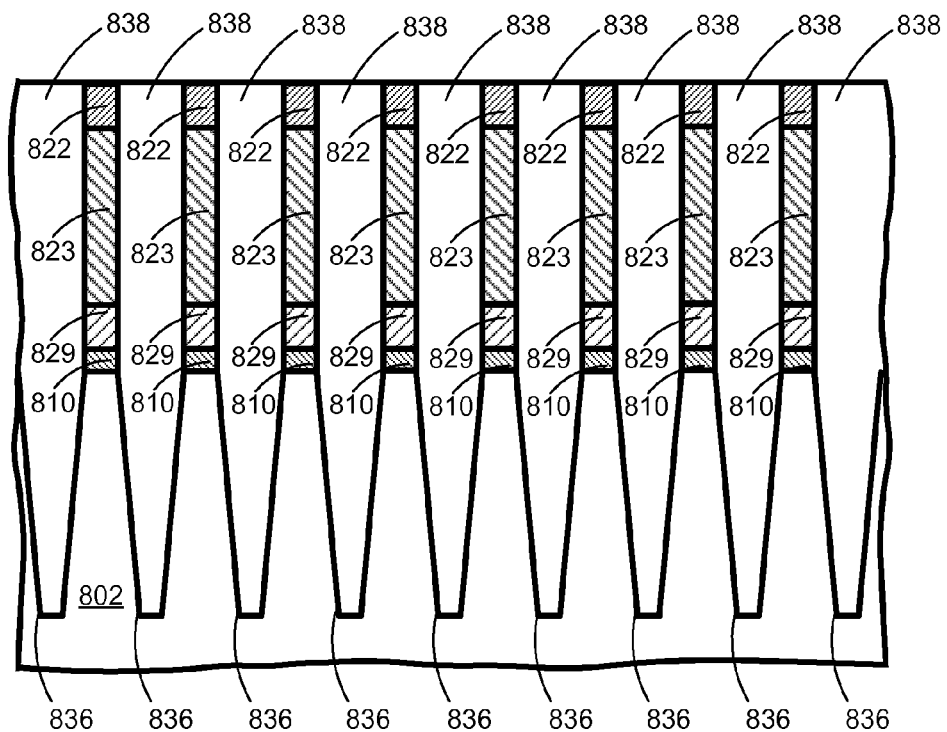

After forming isolation trenches, sacrificial layer 824 is removed and a suitable insulating material such as silicon dioxide is deposited to fill the trenches. FIG. 21H depicts the memory array after depositing oxide 838 to fill the isolation trenches. The oxide is polished to about the level of the upper surface of oxide layer 822. The memory array is then etched using selective oxide etching. This etching removes oxide layer 822 and recesses the trench oxide 838 below the upper surfaces of the strips 823 of the second charge storage layer, as depicted in FIG. 21I.

Figure 21I:
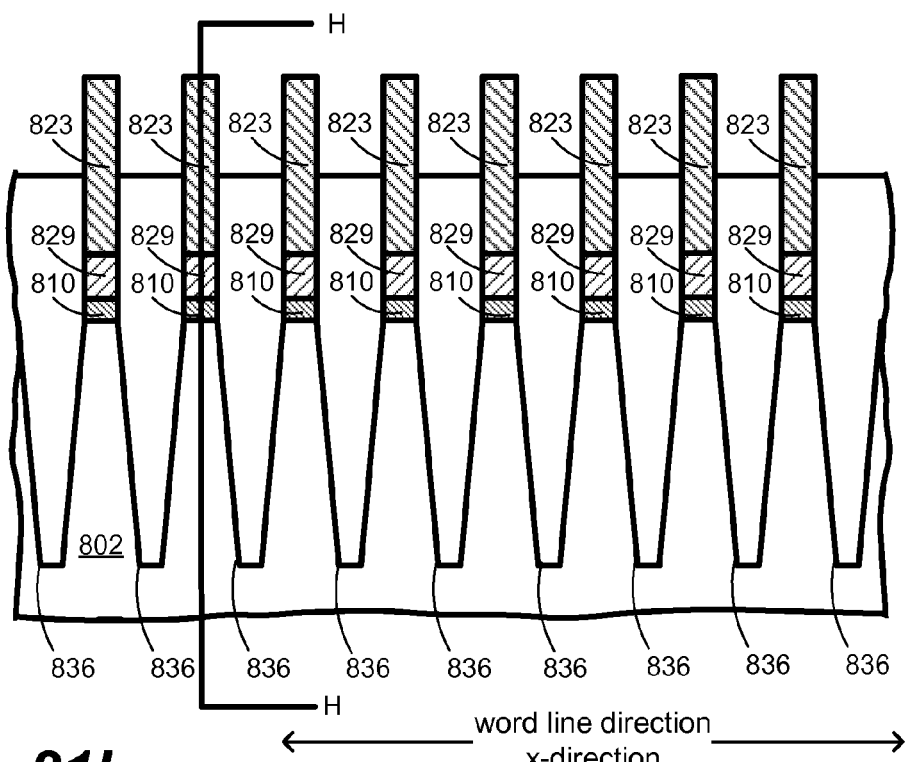

FIG. 21J is an orthogonal cross-sectional view showing the portion of the string of memory cells through line H-H of FIG. 21I, after recessing the trench oxide. First charge storage regions 829 are positioned over the tunnel dielectric layer 810 with sacrificial features 821 positioned therebetween. The first charge storage regions are referenced by 829 to distinguish from the rows 828 of the first charge storage layer and the sacrificial features are referenced by 821 to distinguish from the rows 820 of the sacrificial layer. A strip or column 823 of the second charge storage layer 880 is positioned over the column of first charge storage regions as a result of etching the second charge storage layer during trench formation.

FIG. 21J also shows the array after a series of steps used to pattern the array to form the second charge storage regions. A first pad layer 840 (e.g., oxide) and second pad layer 842 (e.g., nitride) are formed over the second charge layer, followed by an additional oxide layer 844 and optional assist layer 846. A buffer layer is formed over the assist layer, then patterned and etched to form buffer features 850. The buffer features 850 are spaced in the y-direction forming a repeating pattern across the substrate. Each feature includes two substantially vertically sidewalls extending in the x-direction.

FIG. 21J also depicts spacers 852 that are formed along the sidewalls of the oxide features. The spacers are formed in one embodiment by depositing and etching a layer of polysilicon, forming the spacers and exposing the assist layer between adjacent spacers. The spacers are substantially aligned in the y-direction with respect to a middle of the upper surface of each first charge storage region 829. As earlier described, the sidewalls of each oxide feature can be offset from the middle of a corresponding first charge storage region by half the width of the spacers 852.

FIG. 21K depicts the memory after stripping oxide features 850 using a chemical wet etch for example. The spacers are used as a mask to etch the second charge storage regions for each storage element. A non-selective etch can be used to etch layers 846, 844, 842 and 840, followed by selective etching of the polysilicon layer. FIG. 21L depicts the memory after etching the strip 823 of the second charge storage layer, forming the second charge storage regions 854 for the storage elements. Etching the second charge storage layer ends at the upper surfaces of the first charge storage regions. While time-based etching can be used, other embodiments can include etch stop layers or endpoint pattern detection techniques as previously described for etching the second charge storage layer.

FIG. 21M depicts the memory after removing the silicon nitride between adjacent first charge storage regions 829. An intermediate dielectric layer 860 is deposited over the memory array. In one embodiment the intermediate dielectric is ONO and is formed by sequential deposition and etch processes. Control gates are then formed by depositing a layer of polysilicon or other suitable conductor and etching to form control gates 862.

In one embodiment, the rows 821 of the sacrificial layer are formed prior to the rows of the first charge storage layer. For example, the rows of the sacrificial layer can be formed first as shown in FIGS. 17A-17C. The rows of the first charge storage layer can then be formed between adjacent rows of the sacrificial layer. Rather than remove the rows of the sacrificial layer as shown in FIG. 17D, these rows remain between the rows of the first charge storage layer as shown in FIGS. 21D-21L.

FIG. 22 is a flow chart describing a method of fabricating non-volatile memory including composite charge storage structures according to one embodiment. A tunnel dielectric layer is formed over a substrate at step 902. At step 904, a first charge storage layer is formed over the tunnel dielectric layer. The first charge storage layer is etched at step 906 according to a pattern extending in an x-direction with a spacing therebetween in the y-direction. A gate length in the bit line direction is defined for the first charge storage regions of the storage elements by etching at step 906. Step 906 creates strips or rows of the first layer that extend across the substrate in the x-direction, corresponding to the word line direction for a row of memory cells. The line size of the strips in the y-direction defines the dimension of the first charge storage regions in the y-direction.

A sacrificial layer such as nitride is deposited at step 908 to fill the spaces between the rows of the first charge storage layer. Chemical mechanical polishing can be used to polish the nitride after deposition to form a substantially planarized surface over the substrate. Polishing creates rows of the sacrificial layer between adjacent rows of the first charge storage layer. At step 910, a second charge storage layer is formed over the planarized upper surface of the rows of the first charge storage layer and the nitride formed therebetween. Etching is used at step 912 to define active areas that extend in the y-direction across the substrate. The active areas form individual columns of memory cells. Etching at step 912 divides the rows of the first charge storage layer into individual first charge storage regions aligned in rows. At step 914, the substrate is etched at positions between adjacent active areas to define isolation trenches that extend in the y-direction between the active areas. The trenches and active areas form a repeating pattern in the x-direction across the substrate. At step 916 the trenches are filled with a suitable isolation material such as silicon dioxide.

A pattern is formed at step 918 to etch the second charge storage layer. Sacrificial features are formed over one or more pad and assist layers. The features have first and second sidewalls that extend across the substrate in the x-direction. The first sidewall of each feature is aligned over the upper surface of one row of first charge storage regions and the second sidewall of each feature is aligned over an adjacent row of first charge storage regions. Spacers are formed along the sidewalls at step 920, extending in the x-direction. The sidewalls of the sacrificial features are offset from a middle of the upper surface of a corresponding first charge storage region (in the y-direction) by an amount equal to one half of the spacer length in the y-direction to align the spacers at the middle of a corresponding row of first charge storage region.

The sacrificial features are removed at step 922, leaving the spacers as a mask for etching the underlying layers. Any assist and pad layers are etched first, followed by etching the columns of the second charge storage layer at step 924 to define the individual second charge storage regions for each storage element. Etching through the second charge storage layer continues until reaching the upper surface of the first charge storage regions. Controlled etching using an etch stop layer is used in one embodiment. An endpoint region is patterned to provide a detectable material change at substantially the same time the first charge storage layer is reached at the array region in another embodiment. An intermediate dielectric layer is formed at step 926 followed by forming a control gate layer which is etched to form a plurality of individual control gates at step 928.

Figure 23:
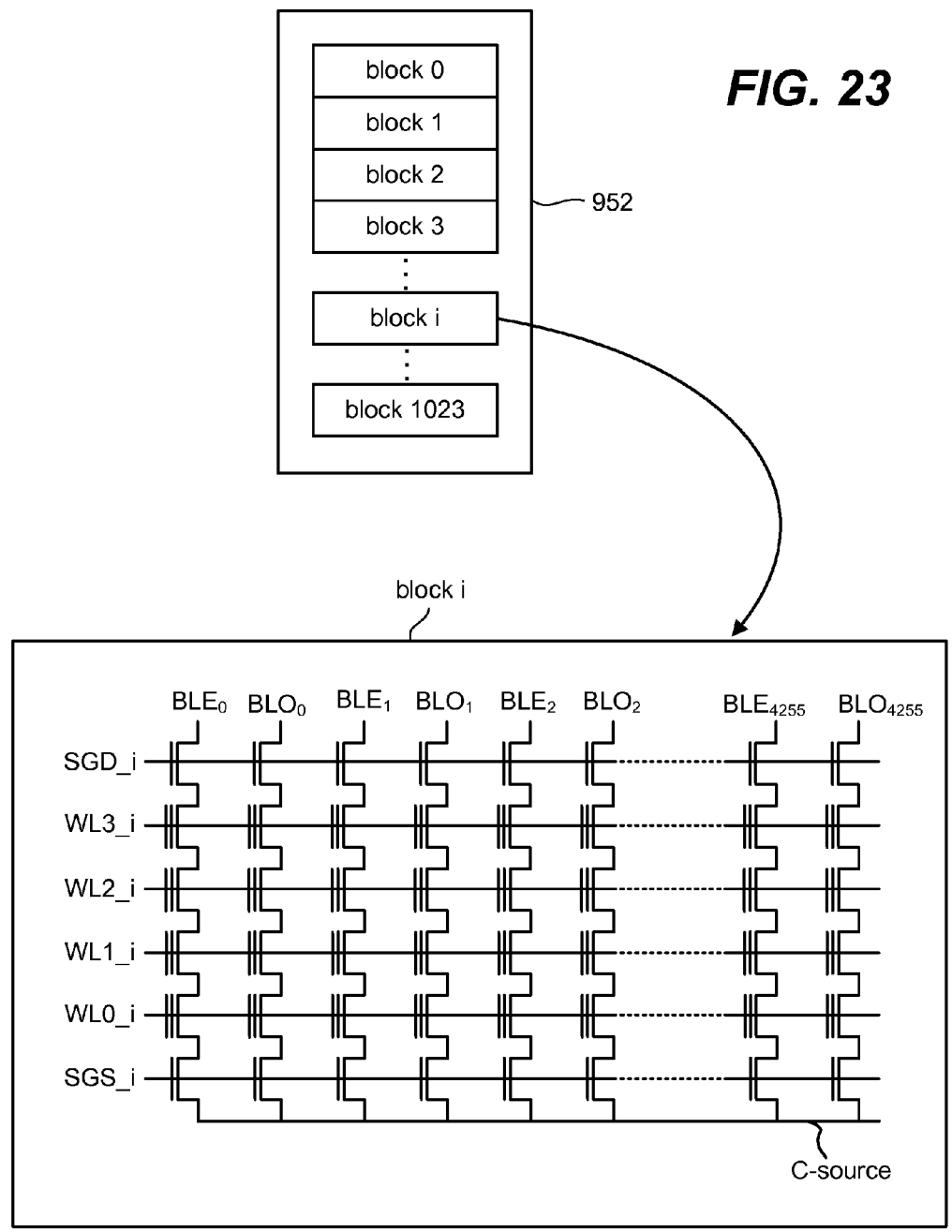
FIG. 23 depicts an exemplary organization of a memory array in accordance with one embodiment.

FIG. 23 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 23 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 24:
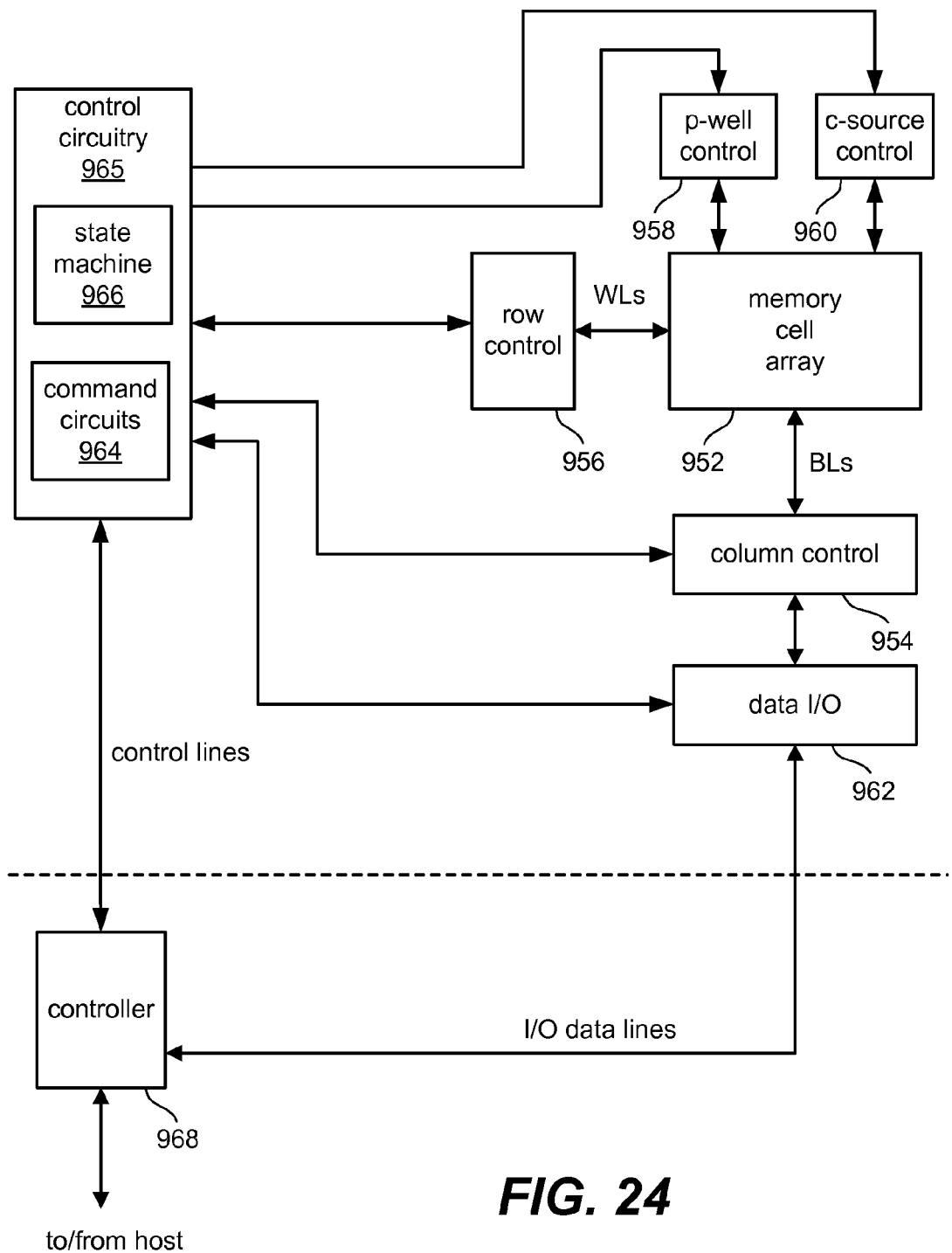
FIG. 24 is a block diagram of an exemplary memory system that can be used to implement embodiments of the disclosed technology.

FIG. 24 is a block diagram of one embodiment of a flash memory system that can be used to implement one or more embodiments of the present disclosure. Other systems and implementations can also be used. Memory cell array 952 is controlled by column control circuit 954, row control circuit 956, c-source control circuit 960 and p-well control circuit 958. Column control circuit 954 is connected to the bit lines of memory cell array 952 for reading data stored in the memory cells, for determining a state of the memory cells during a program operation, and for controlling potential levels of the bit lines to promote or inhibit programming and erasing. Row control circuit 956 is connected to the word lines to select one of the word lines, to apply read voltages, to apply program voltages combined with the bit line potential levels controlled by column control circuit 954, and to apply an erase voltage. C-source control circuit 960 controls a common source line connected to the memory cells. P-well control circuit 958 controls the p-well voltage.

The data stored in the memory cells are read out by the column control circuit 804 and are output to external I/O lines via data input/output buffer 962. Program data to be stored in the memory cells are input to the data input/output buffer 962 via the external I/O lines, and transferred to the column control circuit 954. The external I/O lines are connected to controller 968.

Command data for controlling the flash memory device is input to controller 968. The command data informs the flash memory of what operation is requested. The input command is transferred to state machine 966 which is part of control circuitry 965. State machine 966 controls column control circuit 954, row control circuit 956, c-source control 960, p-well control circuit 958 and data input/output buffer 962. State machine 966 can also output status data of the flash memory such as READY/BUSY or PASS/FAIL.

Controller 968 is connected to or connectable with a host system such as a personal computer, a digital camera, or personal digital assistant, etc. It communicates with the host that initiates commands, such as to store or read data to or from the memory array 952, and provides or receives such data. Controller 968 converts such commands into command signals that can be interpreted and executed by command circuits 964 which are part of control circuitry 965. Command circuits 964 are in communication with state machine 966. Controller 968 typically contains buffer memory for the user data being written to or read from the memory array.

One exemplary memory system comprises one integrated circuit that includes controller 968, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile memory with gate sizes defined by lithographic spacing, comprising:

forming a plurality of sacrificial features over a substrate at a pitch having a line size corresponding to a length of the sacrificial features in a column direction and a space size corresponding to a space between the sacrificial features in the column direction;

forming a plurality of first charge regions in the spaces between sacrificial features adjacent in the column direction; and forming at least one control gate for each of the first charge storage regions; and forming a plurality of non-volatile storage elements, the non-volatile storage elements each including one of the first charge storage regions and one second charge storage region, the second charge storage region of each storage element having a dimension in the column direction that is less than a dimension of the corresponding first charge storage region.

2. The method of claim 1, wherein:

forming the sacrificial features includes using a photolithographically-defined pattern defining the line size and space size in the column direction;

the features each include an upper surface and two substantially vertical sidewalls, the upper surface having a length between the two sidewalls corresponding to the line size of the pattern; and the first charge storage regions have a gate length corresponding to the space size of the pattern.

3. The method of claim 1, further comprising:

forming an intermediate dielectric layer; and forming at least one control gate for each of the non-volatile storage elements.

4. The method of claim 1, wherein:

the first charge storage regions are first polysilicon floating gate regions; and the second charge storage regions are second polysilicon floating gate regions.

5. The method of claim 1, further comprising:

forming a tunnel dielectric layer over the substrate prior to forming the sacrificial features;

wherein forming the plurality of sacrificial features includes:

depositing a sacrificial layer over the tunnel dielectric layer, providing a lithographically-defined pattern over the sacrificial layer, the pattern having the line size and the space size, and etching the sacrificial layer using the pattern to define the sacrificial features.

6. The method of claim 1, wherein forming the plurality of first charge regions includes:

depositing a first charge storage layer in the spaces between the sacrificial features adjacent in the column direction; and polishing the first charge storage layer to at least an upper surface of the sacrificial features.

7. The method of claim 1, wherein forming the plurality of first charge regions includes:

depositing a first charge storage layer in the spaces between the sacrificial features adjacent in the column direction; and etching the first charge storage layer until reaching an upper surface of the sacrificial features.

8. The method of claim 1, further comprising:

removing the sacrificial features after forming the plurality of first charge storage regions;

forming a second charge storage layer over the first charge storage regions;

providing a plurality of buffer features over the second charge storage layer, the buffer features each including an upper surface and two substantially vertical sidewalls, a first sidewall of each buffer feature is aligned with a first plane including directions perpendicular to the column direction and vertical to the substrate and a second sidewall of each feature is aligned with a second plane including directions perpendicular to the column direction and vertical to the substrate, the first plane intersects an upper surface of one of the first charge storage regions and the second plane intersects an upper surface of another first charge storage region which is adjacent to the one first charge storage region;

forming spacers along the first and second sidewalls of each buffer feature;

removing the buffer features; and etching the second charge storage layer using the spacers as a pattern to define a second charge storage region corresponding to each first charge storage region, wherein the second charge storage regions have a dimension in the column direction defined by the spacers.

9. The method of claim 2, wherein:

the line size of the pitch is larger than the space size of the pitch.

10. The method of claim 9, wherein:

the gate length of the first charge storage regions is less than a minimally resolvable feature size associated with the photolithographically-defined pattern.

11. The method of claim 8, wherein:

the first charge storage regions include an upper surface having a middle with respect to the column direction;

the first plane corresponding to the first sidewall of each feature intersects the upper surface of the corresponding first charge storage region at an offset from the middle of the first charge storage region, the offset is substantially equal to a dimension of the spacers in the column direction; and the second plane corresponding to the second sidewall of each feature intersects the upper surface of the corresponding second charge storage region as an offset from the middle of the second charge storage region, the offset from the middle of the second charge storage region is substantially equal to the dimension of the spacers in the column direction.

12. The method of claim 11, wherein:

forming the spacers includes using a conformal deposition process causing a depth of a deposited spacer layer to be substantially equal to the dimension of the spacers in the column direction.

13. A method of fabricating non-volatile memory using lithograph spacing, the method comprising:

etching a sacrificial layer using a lithographically-defined mask to define a plurality of sacrificial features having an upper surface and two substantially vertically sidewalls, the upper surface of each feature including a dimension in a first direction corresponding to a line size of the mask, the sacrificial features separated from adjacent sacrificial features in the first direction by a space corresponding to the space size of the mask;

providing a plurality of first charge storage regions in the spaces between adjacent sacrificial features;

etching a second charge storage layer to form a plurality of second charge storage regions over the plurality of first charge storage regions, each second charge storage region contacting one of the first charge storage regions to form a single charge storage structure; and providing at least one control gate in communication with each charge storage structure.

14. The method of claim 13, wherein providing at least one control gate in communication with each charge storage structure includes:
provides providing a control gate between charge storage structures adjacent in the first direction;
wherein charge storage structures adjacent in the first direction share the control gate located therebetween.

15. The method of claim 13, further comprising:
removing the sacrificial features prior to forming the at least one control gate for each of the charge storage structures.

16. A method of fabricating non-volatile storage using lithographically-defined spacing, the method comprising:
providing over a substrate a plurality of sacrificial features at a lithographically-defined pitch, the pitch including a line size corresponding to a dimension of each sacrificial feature in a first direction and a space size corresponding to a space between each sacrificial feature in the first direction;
providing over the substrate a first charge storage layer in the spaces between each of the sacrificial features, the first charge storage layer forming a plurality of first charge storage regions having a gate dimension in the first direction corresponding to the space between each of the sacrificial features;
providing a second charge storage layer over the plurality of first charge storage regions;
etching the second charge storage layer and forming a plurality of second charge storage regions having a stem dimension in the first direction that is less than the gate dimension of the first charge storage regions;
providing a dielectric over the second charge storage layer;
providing a control gate layer over the dielectric; and
etching the control gate layer to form at least control gate for a plurality of non-volatile storage elements, each non-volatile storage element including one of the first charge storage regions and one of the second charge storage regions.

17. The method of claim 16, wherein the first and second charge storage region of each non-volatile storage element form a single floating gate.

18. The method of claim 16, wherein the first and second charge storage region of each non-volatile storage element form a single dielectric charge storage portion.

19. The method of claim 16, wherein:
etching the control gate layer includes forming a control gate between non-volatile storage elements adjacent in the first dimension;
each non-volatile storage element includes a first and a second control gate and shares at least one of the first and the second control gate with a non-volatile storage element to which it is adjacent in the first direction.

20. The method of claim 16, wherein the control gates form word lines for the non-volatile storage.

21. The method of claim 16, further comprising:
providing at least one additional layer over the control gate layer to form word lines for the non-volatile storage, wherein each word line is electrically connected to one of the control gates.

* * * * *